(12) United States Patent
Kanaya

(10) Patent No.: US 8,547,527 B2
(45) Date of Patent: Oct. 1, 2013

(54) MOVABLE BODY DRIVE METHOD AND MOVABLE BODY DRIVE SYSTEM, PATTERN FORMATION METHOD AND PATTERN FORMATION APPARATUS, AND DEVICE MANUFACTURING METHOD

(75) Inventor: Yuho Kanaya, Kumagaya (JP)

(73) Assignee: Nikon Corporation, Tokyo (JP)

( * ) Notice: Subject to any disclaimer, the term of this patent is extended or adjusted under 35 U.S.C. 154(b) by 1187 days.

(21) Appl. No.: 12/175,783

(22) Filed: Jul. 18, 2008

(65) Prior Publication Data

US 2009/0033900 A1 Feb. 5, 2009

Related U.S. Application Data

(60) Provisional application No. 60/935,063, filed on Jul. 24, 2007.

(51) Int. Cl.
*G03B 27/58* (2006.01)
*G03B 27/42* (2006.01)

(52) U.S. Cl.
USPC ............................................. 355/72; 355/53

(58) Field of Classification Search
USPC ................................ 355/53, 72, 75; 356/401
See application file for complete search history.

(56) References Cited

U.S. PATENT DOCUMENTS

| | | | |
|---|---|---|---|
| 4,465,368 A | 8/1984 | Matsuura et al. | |
| 5,448,332 A | 9/1995 | Sakakibara et al. | |
| 5,610,715 A | 3/1997 | Yoshii et al. | |
| 5,708,505 A | 1/1998 | Sogard et al. | |
| 5,969,441 A | 10/1999 | Loopstra | |
| 6,208,407 B1 | 3/2001 | Loopstra | |
| 6,590,634 B1 | 7/2003 | Nishi et al. | |
| 6,611,316 B2 | 8/2003 | Sewell | |
| 6,778,257 B2 | 8/2004 | Bleeker et al. | |
| 6,952,253 B2 | 10/2005 | Lof et al. | |
| 7,023,610 B2 | 4/2006 | Ohtsuki et al. | |
| 2002/0041377 A1 | 4/2002 | Hagiwara et al. | |
| 2002/0041380 A1 | 4/2002 | Kwan | |
| 2002/0061469 A1 | 5/2002 | Tanaka | |
| 2003/0025890 A1 | 2/2003 | Nishinaga | |
| 2005/0236558 A1 | 10/2005 | Nabeshima | |
| 2005/0248856 A1 | 11/2005 | Omura et al. | |
| 2005/0280791 A1 | 12/2005 | Nagasaka et al. | |
| 2006/0227309 A1 | 10/2006 | Loopstra et al. | |
| 2006/0231206 A1 | 10/2006 | Nagasaka et al. | |
| 2006/0238731 A1 | 10/2006 | Beems et al. | |

(Continued)

FOREIGN PATENT DOCUMENTS

| | | |
|---|---|---|
| EP | 1079223 A1 | 5/1999 |
| EP | 1420298 A2 | 5/2004 |

(Continued)

*Primary Examiner* — Peter B Kim
(74) *Attorney, Agent, or Firm* — Miles & Stockbridge, P.C.

(57) ABSTRACT

First positional information of a stage is measured using an interferometer system, for example, an X interferometer and a Y interferometer. At the same time, second positional information of the stage is measured using an encoder system, for example, one X head and one Y head. A coordinate offset is set by performing a moving average of the difference between the first positional information and the second positional information for over a predetermined measurement time, and the reliability of output signals of the encoder system is verified using the coordinate offset. In the case the output signals are determined to be normal, the stage is servocontrolled using the sum of the first positional information and the coordinate offset. Such servocontrol by a hybrid method makes it possible to perform drive control of the stage having stability of the interferometer and accuracy of the encoder together.

24 Claims, 23 Drawing Sheets

(56) References Cited

U.S. PATENT DOCUMENTS

| | | |
|---|---|---|
| 2007/0127135 A1 | 6/2007 | Nagasaka |
| 2007/0263191 A1 | 11/2007 | Shibazaki |
| 2007/0288121 A1 | 12/2007 | Shibazaki |
| 2008/0043212 A1 | 2/2008 | Shibazaki |
| 2008/0088843 A1 | 4/2008 | Shibazaki |

FOREIGN PATENT DOCUMENTS

| | | |
|---|---|---|
| EP | 1 630 585 A1 | 3/2006 |
| EP | 1760529 A1 | 8/2006 |
| JP | 57-117238 A | 7/1982 |
| JP | 06-283403 A | 10/1994 |
| JP | 10-163099 A | 6/1998 |
| JP | 10-214783 A | 8/1998 |
| JP | 11-016816 A | 1/1999 |
| JP | 2004-519850 A | 5/2000 |
| JP | 2001-313250 A | 11/2001 |
| JP | 2002-014005 A | 1/2002 |
| JP | 2002-151405 A | 5/2002 |
| JP | 2003-249443 A | 9/2003 |
| JP | 2000-505958 A | 7/2004 |
| JP | 2004-289126 A | 10/2004 |
| JP | 2005-308592 A | 11/2005 |
| WO | WO 99/46835 A1 | 9/1999 |
| WO | WO 99/49504 A1 | 9/1999 |
| WO | WO 99/60361 A1 | 11/1999 |
| WO | WO 01/35168 A1 | 5/2001 |
| WO | WO 03/065428 A1 | 8/2003 |
| WO | WO 2004/019128 A2 | 3/2004 |
| WO | WO 2004/053955 A1 | 6/2004 |
| WO | WO 2004/055803 A1 | 7/2004 |
| WO | WO 2004/057590 A1 | 7/2004 |
| WO | WO 2004/086468 A1 | 10/2004 |
| WO | WO 2004/107011 A1 | 12/2004 |
| WO | WO 2005/029559 A1 | 3/2005 |
| WO | WO 2005/059617 A2 | 6/2005 |
| WO | WO 2005/059618 A2 | 6/2005 |
| WO | WO 2006/038952 A2 | 4/2006 |

MOVABLE BODY DRIVE METHOD AND MOVABLE BODY DRIVE SYSTEM, PATTERN FORMATION METHOD AND PATTERN FORMATION APPARATUS, AND DEVICE MANUFACTURING METHOD

CROSS-REFERENCE TO RELATED APPLICATIONS

This non-provisional application claims the benefit of Provisional Application No. 60/935,063 filed Jul. 24, 2007, the disclosure of which is hereby incorporated herein by reference in its entirety.

BACKGROUND OF THE INVENTION

1. Field of the Invention

The present invention relates to movable body drive methods and movable body drive systems, pattern formation methods and pattern formation apparatuses, and device manufacturing methods, and more particularly, to a movable body drive method and a movable body drive system that drive a movable body along a predetermined plane, a pattern formation method using the movable body drive method and a pattern formation apparatus equipped with the movable body drive system, and a device manufacturing method using the pattern formation method.

2. Description of the Background Art

Conventionally, in a lithography process for manufacturing microdevices (electron devices and the like) such as semiconductor devices and liquid crystal display devices, exposure apparatuses such as a projection exposure apparatus by a step-and-repeat method (a so-called stepper) and a projection exposure apparatus by a step-and-scan method (a so-called scanning stepper (which is also called a scanner)) are relatively frequently used.

In this kind of exposure apparatus, in order to transfer a pattern of a reticle (or a mask) to a plurality of shot areas on a substrate such as a wafer or a glass plate (hereinafter, generally referred to as a wafer), a wafer stage that holds the wafer is driven in two-dimensional directions by, for example, a linear motor and the like. Position measurement of the wafer stage or the like is generally performed using a laser interferometer whose stability of measurement values is good for over a long period and which has a high resolution.

However, requirements for a higher-precision position control performance of the stage are increasing due to finer patterns that accompany higher integration of semiconductor devices, and now, short-term variation of measurement values caused by air fluctuation generated due to temperature change or temperature gradient of the atmosphere on the beam path of the laser interferometer has come to occupy a large percentage in the overlay budget.

Meanwhile, as a measurement device other than the laser interferometer used for position measurement of the stage, an encoder can be used, however, the encoder uses a scale, which lacks in mechanical long-term stability (drift of grating pitch, fixed position drift, thermal expansion and the like), and therefore the encoder has a drawback of lacking measurement value linearity and being inferior in long-term stability when compared with the laser interferometer.

In view of the drawbacks of the laser interferometer and the encoder described above, various proposals are being made of a device that measures the position of a stage using both a laser interferometer and an encoder (a position detection sensor which uses a diffraction grating) together (e.g. refer to U.S. Patent Application Publication No. 2002/0041380).

Further, the measurement resolution of the conventional encoder was inferior when compared with an interferometer. However, recently, an encoder which has a nearly equal or a better measurement resolution to/than a laser interferometer has appeared (for example, refer to U.S. Patent Application Publication No. 2005/236558), and the technology to combine the laser interferometer and the encoder described above is beginning to gather attention.

For example, in the exposure apparatus, in the case of performing position measurement of a wafer stage on which a scale (a grating) is arranged using an encoder, in order to cover a broad movement range of the wafer stage, it is conceivable that a plurality of heads are placed at a predetermined interval within a two-dimensional plane. However, in the case of using the plurality of heads having such a placement, because the scale is placed on the upper surface of the wafer stage, for example, foreign materials such as particles can easily adhere to the surface of the scale, and in the case such foreign materials adhere to the scale, position measurement accuracy of the wafer stage by the encoder reduces, or the position measurement becomes difficult.

SUMMARY OF THE INVENTION

According to a first aspect of the present invention, there is provided a movable body drive method of driving a movable body along a predetermined plane, the method comprising: a drive process in which positional information of the movable body is measured using an interferometer system and an encoder system, and the movable body is driven based on measurement information of the interferometer system and also the movable body is driven using measurement information of the encoder system so that a measurement error of the interferometer system is compensated.

With this method, the movable body is driven based on measurement information of the interferometer system whose measurement is superior in long-term stability compared with the encoder system, and the movable body is drive so that measurement error of the interferometer system is compensated, using measurement information of the encoder system that can perform higher-precision measurement compared with the interferometer system. As a consequence, it becomes possible to drive the movable body with high precision for over a long period.

According to a second aspect of the present invention, there is provided a first pattern formation method of forming a pattern on an object, the method comprising: driving at least one movable body of a plurality of movable bodies that include a movable body on which the object is mounted, using the movable body drive method of the present invention, for pattern formation to the object.

According to a third aspect of the present invention, there is provided a second pattern formation method of forming a predetermined pattern on an object held by a movable body, the method comprising: a drive process in which when the movable body is driven along a predetermined plane while measuring positional information of the movable body using an interferometer system and an encoder system, measurement information of the interferometer system is used as the positional information of the movable body; and a calibration process in which predetermined calibration processing to improve alignment accuracy of the pattern and the object is performed using measurement information of the encoder system.

With this method, the movable body is driven based on measurement information of the interferometer system whose measurement is superior in long-term stability compared with the encoder system, and predetermined calibration processing to improve alignment accuracy of the pattern and the object is performed using measurement information of the encoder system which can perform higher-precision measurement compared with the interferometer system. As a consequence, it becomes possible to form a pattern on an object held by the movable body with high precision for over a long period.

According to a fourth aspect of the present invention, there is provided a third pattern formation method of transferring a pattern formed on a mask held by a first movable body onto an object held by a second movable body, the method comprising: measuring positional information of one of the first movable body and the second movable body using an interferometer system and an encoder system, and driving the one of the movable bodies using measurement information of the interferometer system and also driving the other of the movable bodies using measurement information of a position measurement device that measures positional information of the other of the movable bodies and measurement information of the encoder system.

With this method, one of the movable bodies can be driven stably for over a long period based on positional information computed from measurement information of the interferometer system. Further, the other of the movable bodies can be driven with high accuracy because the other of the movable bodies is driven using measurement information of the position measurement device that measures positional information of the other of the movable bodies, and measurement information of the encoder system of higher precision (whose measurement is superior in short-term stability) compared with the interferometer system.

According to a fifth aspect of the present invention, there is provided a device manufacturing method including a pattern formation process wherein in the pattern formation process, a pattern is formed on a substrate using any one of the first to third pattern formation methods of the present invention.

According to a sixth aspect of the present invention, there is provided a movable body drive system that drives a movable body along a predetermined plane, the system comprising: an interferometer system that measures positional information of the movable body; an encoder system that measures positional information of the movable body; and a drive device that drives the movable body based on measurement information of the interferometer system, and also drives the movable body using measurement information of the encoder system so as to compensate a measurement error of the interferometer system.

With this system, the drive device drives the movable body based on measurement information of the interferometer system whose measurement is superior in long-term stability compared with the encoder system, and also drives the movable body using measurement information of the encoder system that can perform higher-precision measurement compared with the interferometer system so that measurement error of the interferometer system is compensated. As a consequence, it becomes possible to drive the movable body with high precision for over a long period.

According to a seventh aspect of the present invention, there is provided a first pattern formation apparatus that forms a pattern on an object wherein for pattern formation to the object, at least one movable body of a plurality of movable bodies that include a movable body on which the object is mounted is driven, using the movable body drive system of the present invention. With this apparatus, it becomes possible to form a pattern on an object with high accuracy.

According to an eight aspect of the present invention, there is provided a second pattern formation apparatus that forms a predetermined pattern on an object held by a movable body; the apparatus comprising: an interferometer system that measures positional information of the movable body; an encoder system that measures positional information of the movable body; and a processing device that, when the movable body is driven along a predetermined plane while measuring positional information of the movable body using the interferometer system and the encoder system, uses measurement information of the interferometer system as the positional information of the movable body, and also performs predetermined calibration processing to improve alignment accuracy of the pattern and the object using measurement information of the encoder system.

With this apparatus, the processing device drives the movable body based on measurement information of the interferometer system whose measurement is superior in long-term stability compared with the encoder system, and performs predetermined calibration processing to improve alignment accuracy of a pattern and an object using measurement information of the encoder system that can perform higher precision measurement compared with the interferometer system. As a consequence, it becomes possible to form a pattern on an object held by the movable body with high precision for a long period.

According to a ninth aspect of the present invention, there is provided a third pattern formation apparatus that transfers a pattern formed on a mask onto an object, the apparatus comprising: a first movable body that holds the mask; a second movable body that holds the object; an interferometer system and an encoder system that measure positional information of one of the first movable body and the second movable body; a position measurement device that measures positional information of the other of the first movable body and the second movable body; and a drive device that drives the one of the movable bodies using measurement information of the interferometer system and also drives the other of the movable bodies using measurement information of the position measurement device and the encoder system.

With this apparatus, one of the movable bodies can stably be driven for over a long period based on positional information computed from the measurement information of the interferometer system. Further, because the other of the movable bodies is driven using the position measurement device that measures positional information of the other of the movable bodies and measurement information of the encoder system of higher precision (whose measurement is superior in short-term stability) compared with the interferometer system, it becomes possible to drive the other of the movable bodies with high accuracy.

BRIEF DESCRIPTION OF THE DRAWINGS

In the accompanying drawings.

DESCRIPTION OF THE EMBODIMENTS

An embodiment of the present invention will be described below, with reference to FIGS. 1 to 24.

Figure 1:
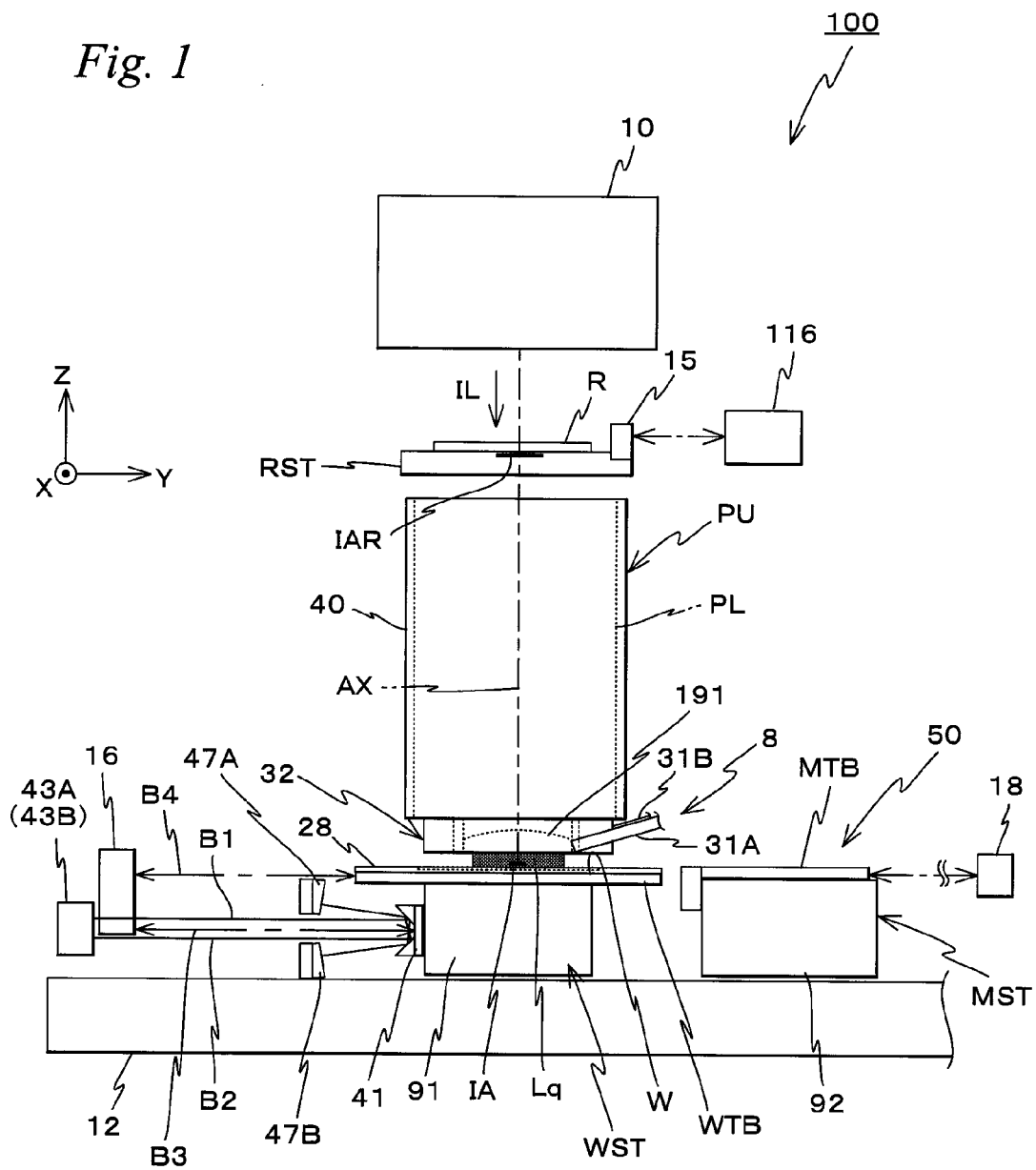
FIG. 1 is a view schematically showing a configuration of an exposure apparatus related to an embodiment.

FIG. 1 schematically shows a configuration of an exposure apparatus 100 related to the embodiment. Exposure apparatus 100 is a projection exposure apparatus by a step-and-scan method, that is, a scanner. As will be described later, in the embodiment, a projection optical system PL is arranged, and the following description will be made assuming that a direction parallel to an optical axis AX of projection optical system PL is a Z-axis direction, a direction in which a reticle and a wafer are relatively scanned within a plane orthogonal to the Z-axis direction is a Y-axis direction and a direction that is orthogonal to a Z-axis and a Y-axis is an X-axis direction, and rotation (tilt) directions around the X-axis, the Y-axis and the Z-axis are θx, θy and θz directions respectively.

Exposure apparatus 100 is equipped with an illumination system 10, a reticle stage RST that holds a reticle R that is illuminated by an illumination light for exposure (hereinafter, referred to as an "illumination light" or an "exposure light") IL from illumination system 10, a projection unit PU that includes projection optical system PL that projects illumination light IL emitted from reticle R on a wafer W, a stage device 50 that has a wafer stage WST and a measurement stage MST, their control system, and the like. On wafer stage WST, wafer W is mounted.

Illumination system 10 includes a light source and an illumination optical system that has an illuminance uniformity optical system containing an optical integrator and the like, and a reticle blind and the like (none of which are shown), as is disclosed in, for example, U.S. Patent Application Publication No. 2003/0025890 and the like. Illumination system 10 illuminates a slit-shaped illumination area IAR that is defined by the reticle blind (the masking system) on reticle R by illumination light (exposure light) IL with substantially uniform illuminance. In this case, as illumination light IL, an ArF excimer laser light (wavelength: 193 nm) is used as an example. Further, as the optical integrator, for example, a fly-eye lens, a rod integrator (an internal reflection type integrator), a diffraction optical element or the like can be used.

On reticle stage RST, reticle R having a pattern surface (the lower surface in FIG. 1) on which a circuit pattern and the like are formed is fixed by, for example, vacuum suction. Reticle stage RST is finely drivable within an XY plane and also drivable at designated scanning speed in a scanning direction (which is the Y-axis direction being a lateral direction of the page surface of FIG. 1), by a reticle stage drive system 11 (not shown in FIG. 1, refer to FIG. 6) including, for example, a linear motor or the like.

Positional information within the XY plane (the movement plane) (including positional (rotational) information in the θz direction) of reticle stage RST is constantly detected at a resolution of, for example, around 0.25 nm with a reticle laser interferometer (hereinafter, referred to as a "reticle interferometer") 116 via a movable mirror 15 (in actuality, a Y movable mirror (or a retroreflector) having a reflection surface orthogonal to the Y-axis and an X movable mirror having a reflection surface orthogonal to the X-axis are arranged). The measurement values of reticle interferometer 116 are sent to a main controller 20 (not shown in FIG. 1, refer to FIG. 6). Main controller 20 controls the position (and the velocity) of reticle stage RST by computing the position of reticle stage RST in the X-axis direction, the Y-axis direction and the θz direction based on the measurement values of reticle interferometer 116, and controlling reticle stage drive system 11 based on the computation results. Incidentally, instead of movable mirror 15, the end surface of reticle stage RST may be mirror polished in order to form a reflection surface (corresponding to the reflection surface of movable mirror 15). Further, reticle interferometer 116 may be capable of also measuring positional information of reticle stage RST in at least one of the Z-axis, θx and θy directions.

Projection unit PU is placed below reticle stage RST in FIG. 1. Projection unit PU includes a barrel 40 and projection optical system PL having a plurality of optical elements that are held in a predetermined positional relation within barrel 40. As projection optical system PL, for example, a dioptric system that is composed of a plurality of lenses (lens elements) that are disposed along optical axis AX parallel to the Z-axis direction is used. Projection optical system PL is, for example, both-side telecentric and has a predetermined projection magnification (e.g. one-quarter, one-fifth, one-eighth times, or the like). Therefore, when illumination area IAR is illuminated by illumination light IL from illumination system 10, illumination light IL having passed through reticle R whose pattern surface is placed substantially coincidentally with a first surface (an object plane) of projection optical system PL forms a reduced image of a circuit pattern (a reduced image of a part of a circuit pattern) of reticle R within illumination area IAR on an area (hereinafter, also referred to as an "exposure area") IA that is conjugate with illumination area IAR on wafer W, which is placed on the second surface (the image plane) side of projection optical system PL and whose surface is coated with a resist (a photosensitive agent), via projection optical system PL (projection unit PU). Then, by moving the reticle in the scanning direction (the Y-axis direction) relative to illumination area IAR (illumination light IL) and also moving wafer W in the scanning direction (the Y-axis direction) relative to exposure area IA (illumination light IL) by synchronous drive of reticle stage RST and wafer stage WST, scanning exposure of one shot area (divided area) on wafer W is performed, and a pattern of reticle R is transferred to the shot area. That is, in the embodiment, a pattern is generated on wafer W by illumination system 10, reticle R and projection optical system PL, and the pattern is formed on wafer W due to exposure of a sensitive layer (a resist layer) on wafer W by illumination light IL.

Incidentally, although not shown in the drawing, projection unit PU is mounted on a barrel platform that is supported by three supporting columns via a vibration isolation mechanism. However, the present invention is not limited thereto, and as is disclosed in, for example, the pamphlet of International Publication No. 2006/038952, projection unit PU may be supported by suspension with respect to a main frame member (not shown) that is placed above projection unit PU, or a base member on which reticle stage RST is placed, or the like.

Incidentally, in exposure apparatus 100 of the embodiment, because exposure applying the liquid immersion method is performed, an aperture on the reticle side becomes larger with substantial increase of the numerical aperture N.A. of projection optical system PL. Accordingly, in order to satisfy the Petzval condition and also avoid the increase in size of the projection optical system, a catadioptric system configured including mirrors and lenses may be employed as the projection optical system. Further, not only a sensitive layer (a resist layer) but also, for example, a protective film (a topcoat film) or the like that protects the wafer or the sensitive layer may be formed on wafer W.

Figure 3:
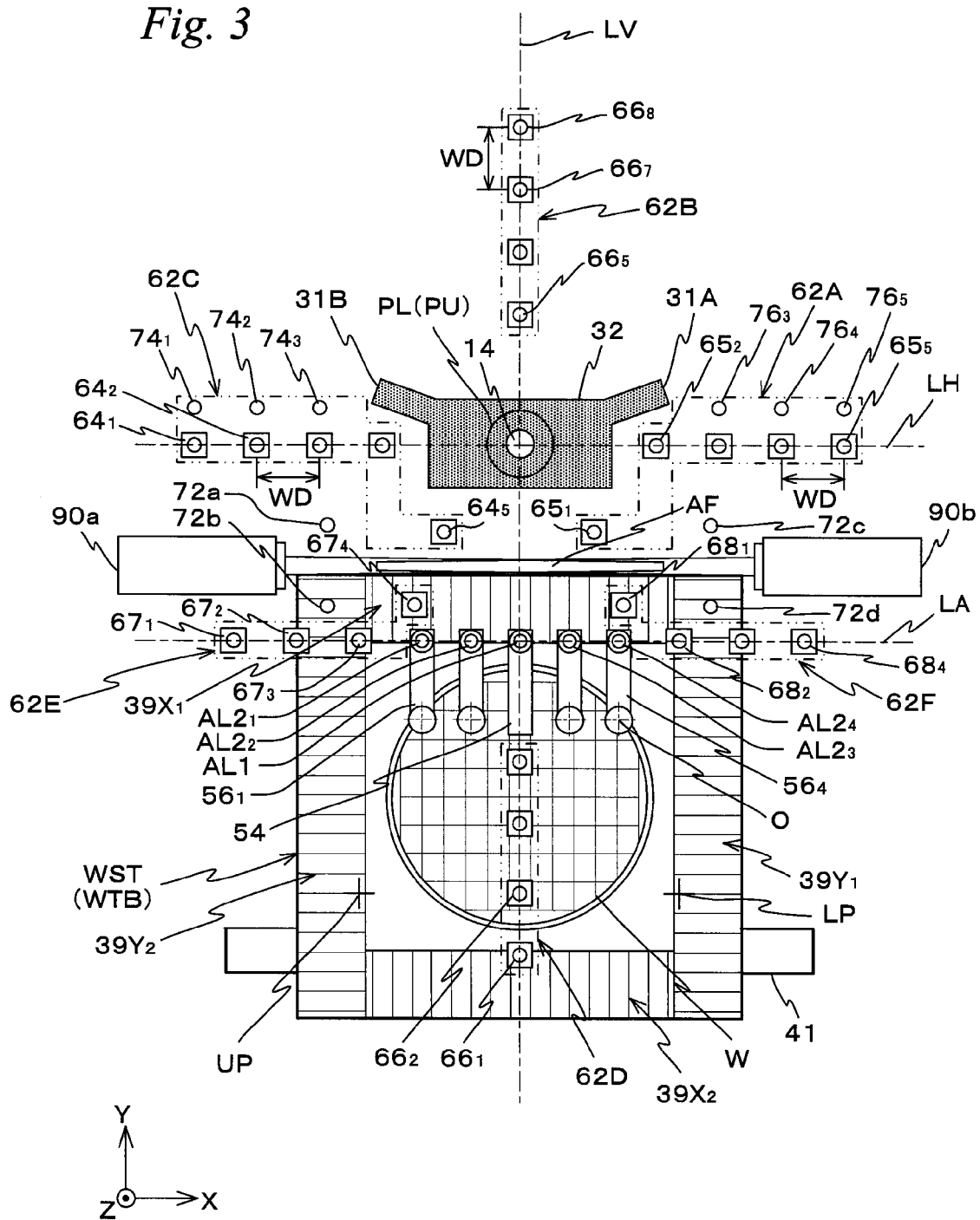
FIG. 3 is a plan view showing the placement of various measurement devices (such as encoders, alignment systems, and a multipoint AF system, Z heads) that are equipped in the exposure apparatus in FIG. 1.

Further, in exposure apparatus 100 of the embodiment, in order to perform exposure applying the liquid immersion method, a nozzle unit 32 that constitutes a part of a local liquid immersion device 8 is arranged so as to enclose the periphery of the lower end portion of barrel 40 that holds an optical element that is closest to the image plane side (the wafer W side) constituting projection optical system PL, which is a lens (hereinafter, also referred to a "tip lens") 191 in this case. In the embodiment, as shown in FIG. 1, the lower end surface of nozzle unit 32 is set substantially flush with the lower end surface of tip lens 191. Further, nozzle unit 32 is equipped with a supply opening and a recovery opening of a liquid Lq, a lower surface to which wafer W is placed opposing and at which the recovery opening is arranged, and a supply flow channel and a recovery flow channel that are connected to a liquid supply pipe 31A and a liquid recovery pipe 31B respectively. As shown in FIG. 3, liquid supply pipe 31A and liquid recovery pipe 31B are inclined at an angle of around 45 degrees with respect to the X-axis direction and the Y-axis direction in a planar view (when viewed from above) and are symmetrically placed with respect to a straight line (a reference axis) LV that passes through the center of projection unit PU (which coincides with optical axis AX of projection optical system PL, and in the embodiment, also with the center of exposure area IA described above) and that is parallel to the Y-axis.

Figure 6:
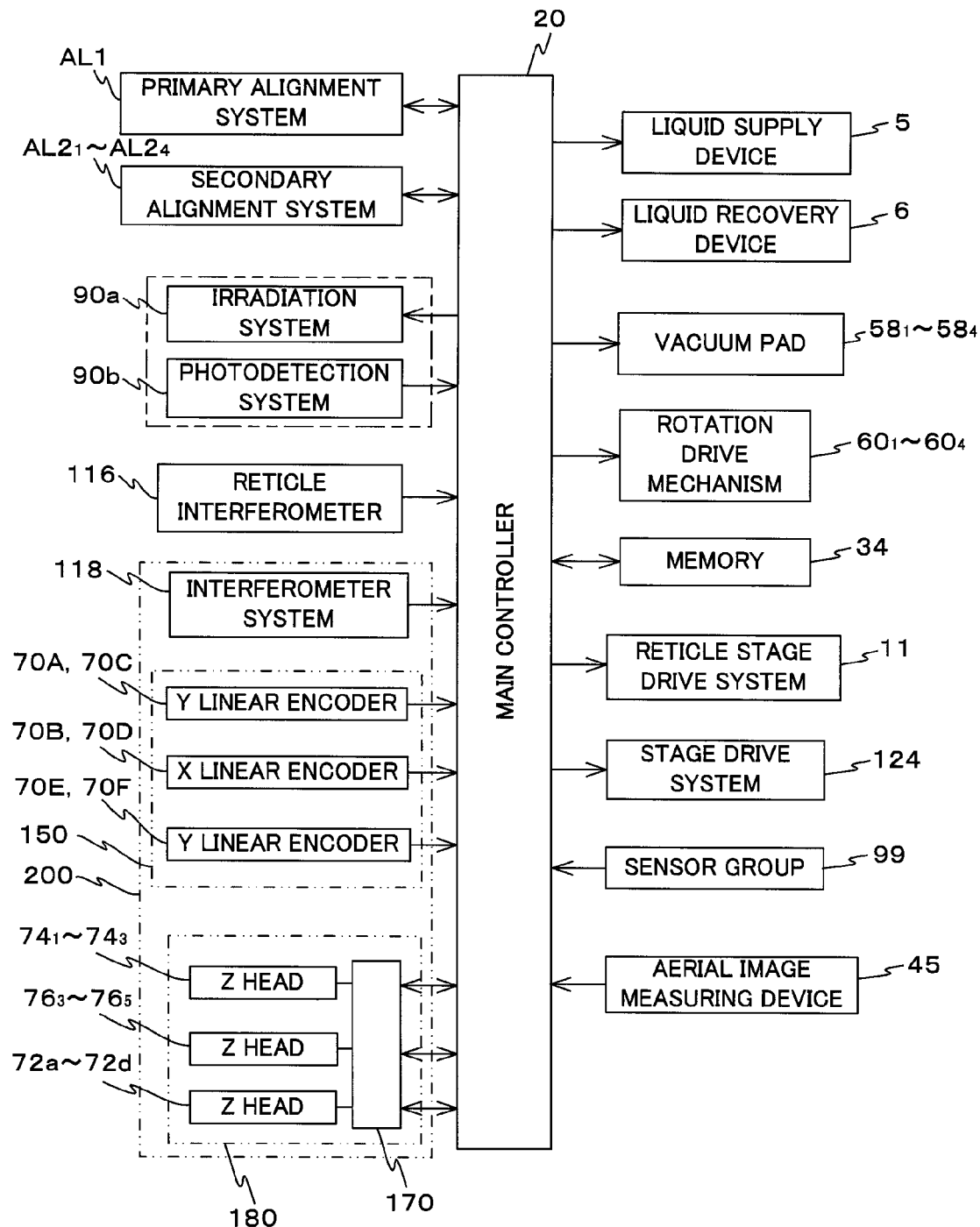
FIG. 6 is a block diagram schematically showing a configuration of a control system of the exposure apparatus related to the embodiment.

One end of a supply pipe (not shown) is connected to liquid supply pipe 31A whereas the other end of the supply pipe is connected to a liquid supply device 5 (not shown in FIG. 1, refer to FIG. 6), and one end of a recovery pipe (not shown) is connected to liquid recovery pipe 31B whereas the other end of the recovery pipe is connected to a liquid recovery device 6 (not shown in FIG. 1, refer to FIG. 6).

Liquid supply device 5 includes a tank for supplying a liquid, a compression pump, a temperature controller, a valve for controlling supply/stop of the liquid to liquid supply pipe 31A, and the like. As the valve, for example, a flow rate control valve is preferably used so that not only the supply/stop of the liquid but also the adjustment of flow rate can be performed. The temperature controller adjusts the temperature of the liquid within the tank, for example, to nearly the same temperature as the temperature within the chamber (not shown) where the exposure apparatus is housed. Incidentally, the tank, the compression pump, the temperature controller, the valve, and the like do not all have to be equipped in exposure apparatus 100, and at least a part of them can also be substituted by the equipment or the like available in the plant where exposure apparatus 100 is installed.

Liquid recovery device 6 includes a tank and a suction pump for recovering the liquid, a valve for controlling recovery/stop of the liquid via liquid recovery pipe 31B, and the like. As the valve, a flow rate control valve is preferably used similarly the valve of liquid supply device 5. Incidentally, the tank, the suction pump, the valve, and the like do not all have to be equipped in exposure apparatus 100, and at least a part of them can also be substituted by the equipment available in the plant where exposure apparatus 100 is installed.

In the embodiment, as liquid Lq described above, pure water (hereinafter, it will simply be referred to as "water" besides the case when specifying is necessary) that transmits the ArF excimer laser light (light with a wavelength of 193 nm) is to be used. Pure water can be obtained in large quantities at a semiconductor manufacturing plant or the like without difficulty, and it also has an advantage of having no adverse effect on the photoresist on the wafer, to the optical lenses or the like.

Refractive index n of the water with respect to the ArF excimer laser light is around 1.44. In the water, the wavelength of illumination light IL is 193 nm×1/n, shorted to around 134 nm.

Liquid supply device 5 and liquid recovery device 6 each have a controller, and the respective controllers are controlled by main controller 20 (refer to FIG. 6). According to instructions from main controller 20, the controller of liquid supply device 5 opens the valve connected to liquid supply pipe 31A to a predetermined degree to supply liquid (water) to the space between tip lens 191 and wafer W via liquid supply pipe 31A, the supply flow channel and the supply opening. Further, when the water is supplied, according to instructions from main controller 20, the controller of liquid recovery device 6 opens the valve connected to liquid recovery pipe 31B to a predetermined degree to recover liquid (water) from the space between tip lens 191 and wafer W into liquid recovery device 6 (the liquid tank) via the recovery opening, the recovery flow channel and liquid recovery pipe 31B. During the supply and recovery operations, main controller 20 gives commands to the controllers of liquid supply device 5 and liquid recovery device 6 so that the quantity of water supplied to the space between tip lens 191 and wafer W constantly equals the quantity of water recovered from the space. Accordingly, a constant quantity of liquid (water) Lq (refer to FIG. 1) is held in the space between tip lens 191 and wafer W. In this case, liquid (water) Lq held in the space between tip lens 191 and wafer W is constantly replaced.

As is obvious from the above description, in the embodiment, local liquid immersion device 8 is configured including nozzle unit 32, liquid supply device 5, liquid recovery device 6, liquid supply pipe 31A and liquid recovery pipe 31B, and the like. Incidentally, a part of local liquid immersion device 8, for example, at least nozzle unit 32 may also be supported by suspension by a main frame (including the barrel platform described above) that holds projection unit PU, or may also be arranged at another frame member that is separate from the main frame. Or, in the case projection unit PU is supported in a suspended state as is described earlier, nozzle unit 32 may also be supported by suspension integrally with projection unit PU, but in the embodiment, nozzle unit 32 is arranged on a measurement frame that is supported by suspension independently from projection unit PU. In this case, projection unit PU does not have to be supported by suspension.

Incidentally, also in the case measurement stage MST is located below projection unit PU, the space between a measurement table (to be described later) and tip lens 191 can be filled with water in the similar manner to the above-described manner.

Incidentally, in the above description, one liquid supply pipe (nozzle) and one liquid recovery pipe (nozzle) are to be arranged as an example. However, the present invention is not limited thereto, and a configuration having multiple nozzles as is disclosed in, for example, the pamphlet of International Publication No. WO 99/49504, may also be employed, in the case such placement is possible taking into consideration a relation with peripheral members. The point is that any configuration may be employed as far as the liquid can be supplied to the space between an optical member in the lowest end (tip lens) 191 constituting projection optical system PL and wafer W. For example, the liquid immersion mechanism disclosed in the pamphlet of International Publication No. WO 2004/053955, or the liquid immersion mechanism disclosed in the European Patent Application Publication No. 1 420 298 can also be applied to the exposure apparatus of the embodiment.

Referring back to FIG. 1, stage device 50 is equipped with wafer stage WST and measurement stage MST that are placed above a base board 12, a measurement system 200 (refer to FIG. 6) that measures positional information of stages WST and MST, a stage drive system 124 (refer to FIG. 6) that drives stages WST and MST, and the like. As shown in FIG. 6), measurement system 200 includes an interferometer system 118, an encoder system 150, a surface position measurement system 180 and the like. Incidentally, the configurations of interferometer system 118 and encoder system 150 and the like will be described later in detail.

Referring back to FIG. 1, on the bottom surface of each of wafer stage WST and measurement stage MST, a noncontact bearing (not shown), for example, a vacuum preload type hydrostatic air bearing (hereinafter, referred to as an "air pad") is arranged at a plurality of positions, and wafer stage WST and measurement stage MST are supported in a noncontact manner via a clearance of around several μm above base board 12, by static pressure of pressurized air that is blown out from the air pad toward the upper surface of base board 12. Further, both stages WST and MST are drivable independently from each other within the XY plane by stage drive system 124 (refer to FIG. 6) including a linear motor or the like.

Wafer stage WST includes a stage main section 91 and a water table WTB mounted on stage main section 91. Wafer table WTB and stage main section 91 are configured drivable in directions of six degrees of freedom (X, Y, Z, θx, θy and θz) with respect to base board 12, by a drive system that includes a linear motor and a Z-leveling mechanism (e.g. including a voice coil motor or the like).

On wafer table WTB, a wafer holder (not shown) that holds wafer W by vacuum suction or the like is arranged. The wafer holder may also be formed integrally with wafer table WTB, but in the embodiment, the wafer holder and water table WTB are separately configured, and the wafer holder is fixed inside a recessed portion of wafer table WTB, for example, by vacuum suction or the like. Further, on the upper surface of wafer table WTE, a plate (liquid repellent plate) 28 is arranged, which has the surface (the liquid repellent surface) substantially flush with the surface of wafer W mounted on the wafer holder to which liquid repellent treatment with respect to liquid Lq is applied, has a rectangular outer shape (contour), and has a circular opening that is formed in the center portion and is slightly larger than the wafer holder (a mounting area of the wafer). Plate 28 is made of materials with a low coefficient of thermal expansion, for example, glasses or ceramics (e.g. Zerodur (the brand name) of Schott AG, $Al_2O_3$, or TiC, or the like), and on the surface of plate 28, a liquid repellent film is formed by, for example, fluorine resin materials, fluorine series resin materials such as polytetrafluoroethylene (Teflon (registered trademark)), acrylic series resin materials, silicon series resin materials, or the like. Further, as shown in a plan view of wafer table WTB (wafer stage WST) in FIG. 4A, plate 28 has a first liquid repellent area 28a whose outer shape (contour) is rectangular enclosing the circular opening, and a second liquid repellent area 28b that has a rectangular frame (loop) shape placed on the periphery of first liquid repellent area 28a. On first liquid repellent area 28a, for example, when an exposure operation is performed, at least a part of a liquid immersion area 14 (refer to FIG. 8) protruding from the surface of the wafer is formed, and on second liquid repellent area 28b, scales for the encoder system (to be described later) are formed. Incidentally, at least a part of the surface of plate 28 does not have to be flush with the surface of the wafer, that is, may be different in height from the surface of the wafer. Further, plate 28 may be a single plate, but in the embodiment, plate 28 is configured by combining a plurality of plates, for example, first and second liquid repellent plates that correspond to first liquid repellent area 28a and second liquid repellent area 28b respectively. In the embodiment, water is used as liquid Lq as is described above, and therefore hereinafter first liquid repellent area 28a and second liquid repellent area 28b are also referred to as first water repellent plate 28a and second water repellent plate 28b respectively.

In this case, exposure light IL is irradiated to first water repellent plate 28a on the inner side, whereas exposure light IL is hardly irradiated to second water repellent plate 28b on the outer side. Taking this fact into consideration, in the embodiment, a first water repellent area to which water repellent coat having sufficient resistance to exposure light IL (a light in a vacuum ultraviolet region, in this case) is applied is formed on the surface of first water repellent plate 28a, and a second water repellent area to which water repellent coat having resistance to exposure light IL inferior to the first water repellent area is applied is formed on the surface of second water repellent plate 28b. Since it is difficult in general to apply water repellent coat having sufficient resistance to exposure light IL (a light in a vacuum ultraviolet region, in this case) to a glass plate, it is effective to separate the water repellent plate into two sections in this manner, i.e. first water repellent plate 28a and second water repellent plate 28b on the periphery thereof. Incidentally, the present invention is not limited thereto, and two kinds of water repellent coat that have different resistance to exposure light IL may also be applied on the upper surface of the same plate in order to form the first liquid repellent area and the second liquid repellent area. Further, the same kind of water repellent coat may be applied to the first and second liquid repellent areas. For example, only one water repellent area may be formed on the same plate.

Figure 4A:
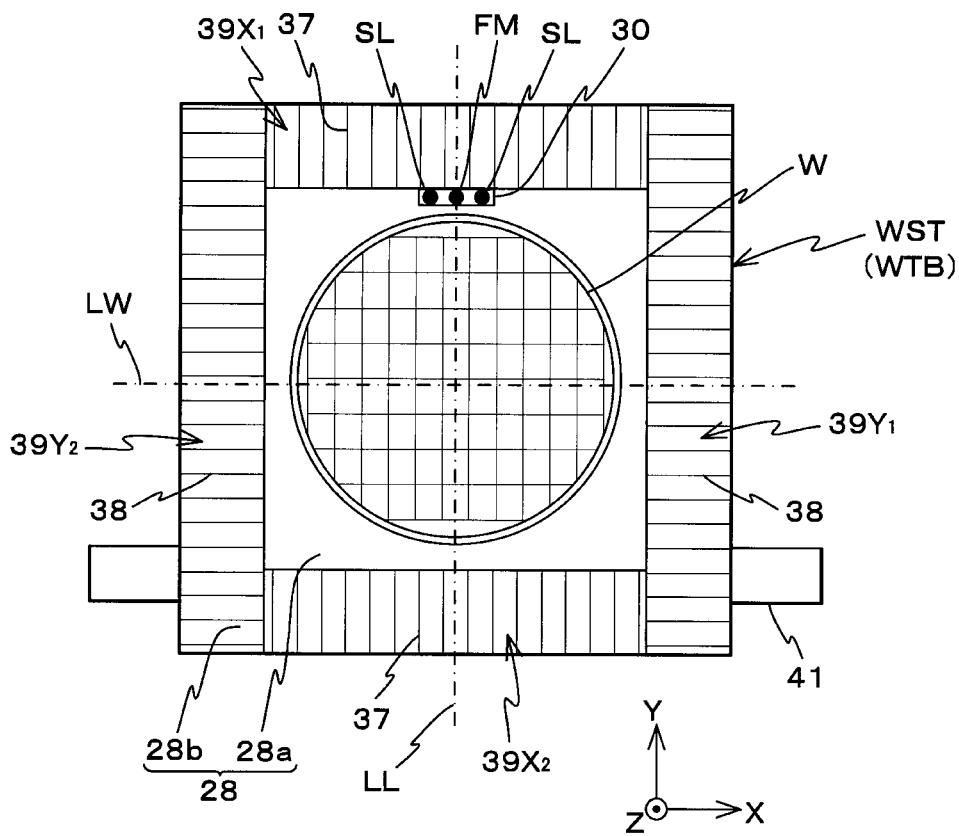
FIG. 4A is a plan view showing a wafer stage WST.

Further, as is obvious from FIG. 4A, at the end portion on the +Y side of first water repellent plate 28a a rectangular cutout is formed in the center portion in the X-axis direction, and a measurement plate 30 is embedded inside the rectangular space (inside the cutout) that is enclosed by the cutout and second water repellent plate 28b. A fiducial mark FM is formed in the center in the longitudinal direction of measurement plate 30 (on a centerline LL of wafer table WTB), and a pair of aerial image measurement slit patterns (slit-shaped measurement patterns) SL are formed in the symmetrical placement with respect to the center of fiducial mark FM on one side and the other side in the X-axis direction of fiducial mark FM. As each of aerial image measurement slit patterns SL, an L-shaped slit pattern having sides along the Y-axis direction and X-axis direction, or two linear slit patterns extending in the X-axis direction and the Y-axis direction respectively can be used, as an example.

Figure 4B:
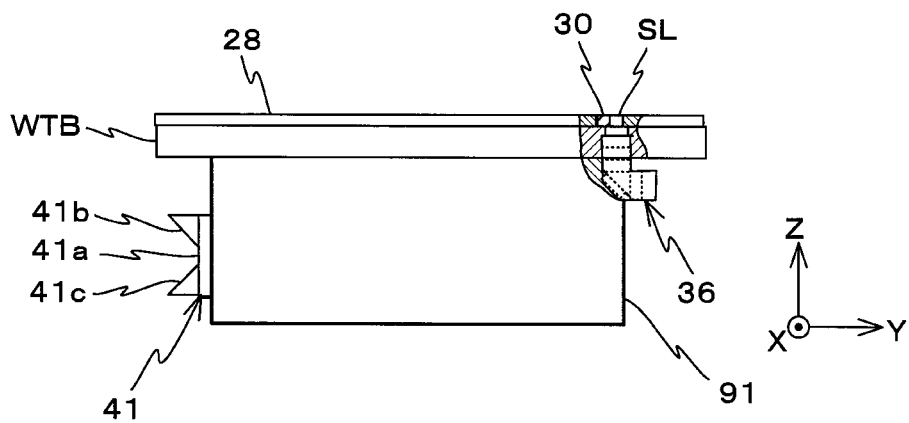
FIG. 4B is a schematic side view showing a partial cross section of wafer stage WST.

Further, as shown in FIG. 4B, inside wafer stage WST below each of aerial image measurement slit patterns SL, an L-shaped housing 36 in which an optical system containing an objective lens, a mirror, a relay lens and the like is housed is attached in a partially embedded state penetrating through a part of the inside of wafer table WTB and stage main section 91. Housing 36 is arranged in pairs corresponding to the pair of aerial image measurement slit patterns SL, although omitted in the drawing.

The optical system inside housing 36 guides illumination light IL that has been transmitted through aerial image measurement slit pattern SL along an L-shaped route and emits the light toward a −Y direction. Incidentally, in the following description, the optical system inside housing 36 is described as a light-transmitting system 36 by using the same reference code as housing 36 for the sake of convenience.

Moreover, on the upper surface of second water repellent plate 28b, multiple grid lines are directly formed in a predetermine pitch along each of four sides. More specifically, in areas on one side and the other side in the X-axis direction of second water repellent plate 28b (both sides in the lateral direction in FIG. 4A), Y scales $39Y_1$ and $39Y_2$ are formed respectively. Y scales $39Y_1$ and $39Y_2$ are each configured of a reflective grating (e.g. diffraction grating) for example, having a periodic direction in the Y-axis direction in which grid lines 38 having the longitudinal direction in the X-axis direction are formed in a predetermined pitch along a direction parallel to the Y-axis (Y-axis direction).

Similarly, in areas on one side and the other side in the Y-axis direction of second water repellent plate 28b (both sides in the vertical direction in FIG. 4A), X scales $39X_1$ and $39X_2$ are formed respectively in a state of being sandwiched between Y scales $39Y_1$ and $39Y_2$. X scales $39X_1$ and $39X_2$ are each configured of a reflective grating (e.g. diffraction grating), for example, having a periodic direction in the X-axis direction in which grid lines 37 having the longitudinal direction in the Y-axis direction are formed in a predetermined pitch along a direction parallel to the X-axis (X-axis direction). As each of the scales, the scale made up of a reflective grating RG (refer to FIG. 7A) that is created by, for example, hologram or the like on the surface of second water repellent plate 28b is used. In this case, each scale has gratings made up of narrow slits, grooves or the like that are marked at a predetermined distance (pitch) as graduations. The type of diffraction grating used for each scale is not limited, and not only the diffraction grating made up of grooves or the like that are mechanically formed, but also, for example, the diffraction grating that is created by exposing interference fringe on a photosensitive resin may be used. However, each scale is created by marking the graduations of the diffraction grating described above, for example, in a pitch between 138 nm to 4 μm, for example, a pitch of 1 μm on a thin plate-shaped glass. These scales are covered with the liquid repellent film (water repellent film) described above. Incidentally, the pitch of the grating is shown much wider in FIG. 4A than the actual pitch, for the sake of convenience. The same is true also in other drawings.

In this manner, in the embodiment, since second water repellent plate 28b itself constitutes the scales, a glass plate with a low coefficient of thermal expansion is to be used as second water repellent plate 28b. However, the present invention is not limited thereto, and a scale member made up of a glass plate or the like with a low coefficient of thermal expansion on which a grating is formed may also be fixed on the upper surface of wafer table WTB, for example, by a plate spring (or vacuum suction) or the like so as to prevent local shrinkage/expansion. In this case, a water repellent plate to which the same water repellent coat is applied on the entire surface may be used instead of plate 28. Or, wafer table WTB may also be formed by materials with a low coefficient of thermal expansion, and in such a case, a pair of Y scales and a pair of X scales may be directly formed on the upper surface of wafer table WTB.

Incidentally, in order to protect the diffraction grating, it is also effective to cover the diffraction grating with a glass plate with a low coefficient of thermal expansion having water repellency (liquid repellency) In this case, as the glass plate, a glass plate having a thickness similar to the thickens of the wafer, for example, a thickness of 1 mm can be used, and the glass plate is installed on the upper surface of wafer table WTB so that the surface of the glass plate is set at the same height as (flush with) the wafer surface.

Incidentally, a layout pattern is arranged for deciding the relative position between an encoder head (to be described later) and the scale near the edge of each scale respectively. The layout pattern is configured, for example, from grid lines that have different reflectivity, and when the encoder head scans the layout pattern, the intensity of the output signal of the encoder changes. Therefore, a threshold value is determined beforehand, and the position where the intensity of the output signal exceeds the threshold value is detected. Then, the relative position between the encoder head and the scale is set, with the detected position as a reference.

Figure 2:
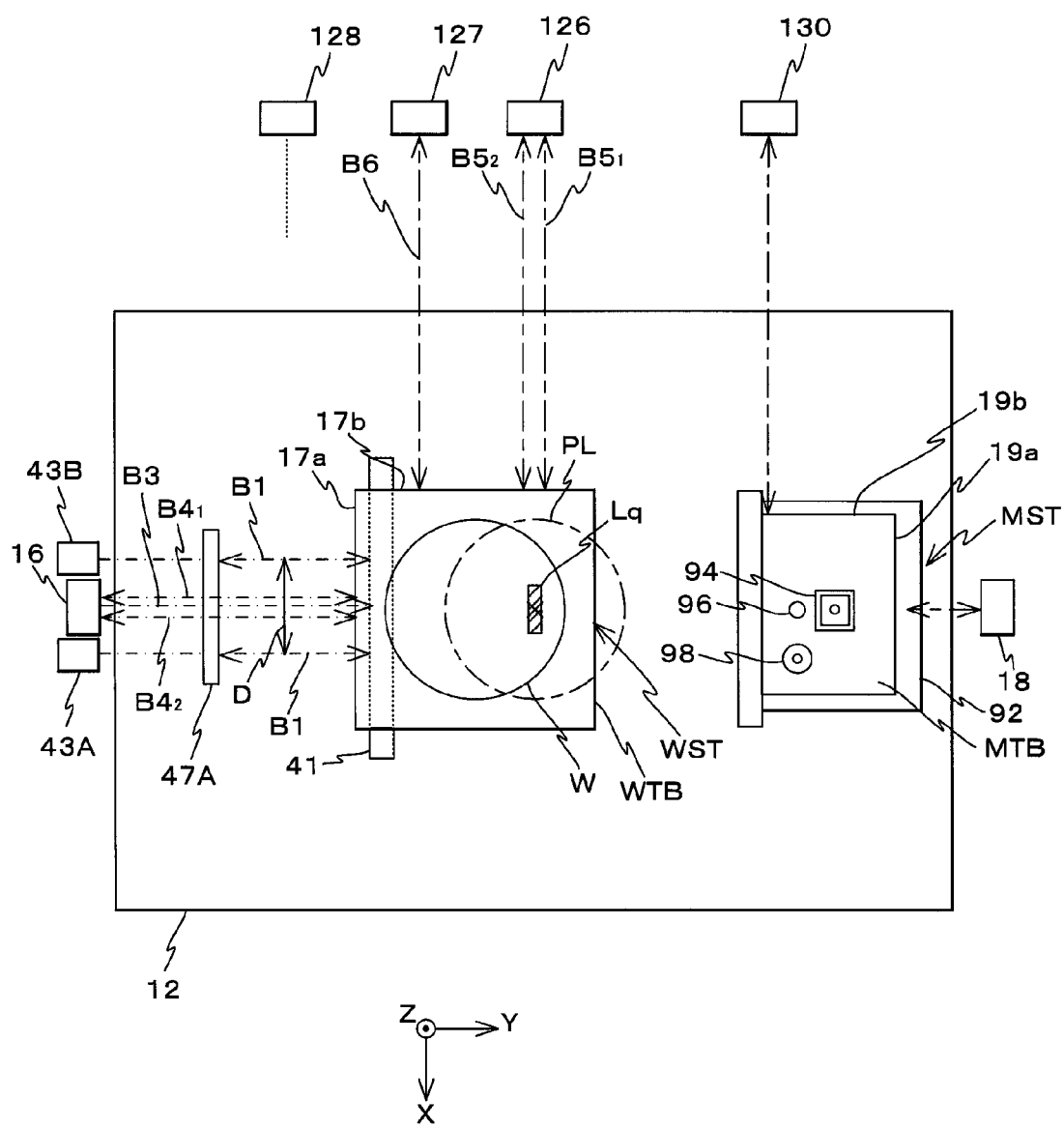
FIG. 2 is a plan view showing a stage device in FIG. 1.

Further, mirror finish is severally applied to the −Y end surface and the −X end surface of wafer table WTB, and a reflection surface 17a and a reflection surface 17b for interferometer system 118 (to be described later) are formed as shown in FIG. 2.

As shown in FIG. 1, measurement stage MST includes a stage main section 92 and a measurement table MTB mounted on stage main section 92. Measurement stage MST is configured drivable with respect to base board 12 in at least directions of three degrees of freedom (X, Y, and θz) by a drive system (not shown). However, the present invention is not limited thereto, and for example, measurement stage MST having a so-called coarse/fine motion structure in which measurement table MTE is configured finely movable with respect to stage main section 92 in the X-axis direction, the Y-axis direction and the θz direction may also be employed, or a configuration may also be employed in which measurement table MTB is drivable in directions of three degrees of freedom which are the Z, θx and θy directions, on stage main section 92.

Incidentally, in FIG. 6, stage drive system 124 is shown including the drive system of wafer stage WST and the drive system of measurement stage MST.

Figure 5A:
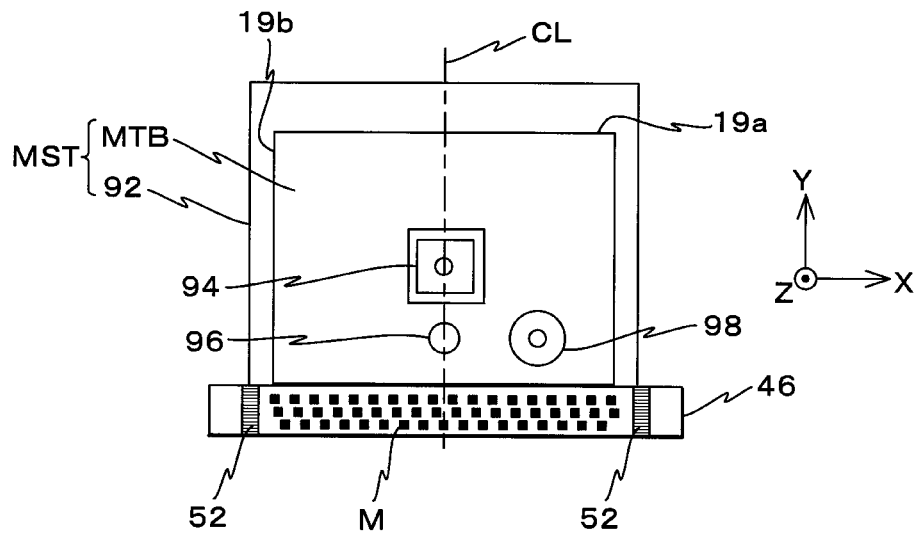
FIG. 5A is a plan view showing a measurement stage MST.

Various types of measurement members are arranged at measurement table MIB (and stage main section 92). As the measurement members, for example, as shown in FIGS. 2 and 5A, an uneven illuminance measuring sensor 94 that has a pinhole-shaped light-receiving section that receives illumination light IL on an image plane of projection optical system PL, an aerial image measuring instrument 96 that measures an aerial image (projected image) of a pattern that is projected by projection optical system FL, and a wavefront aberration measuring instrument 98 by the Shack-Hartman method that is disclosed in, for example, the pamphlet of International Publication No. WO 03/065428 and the like are employed. As wavefront aberration measuring instrument 98, the one disclosed in, for example, the pamphlet of International Publication No. WO 99/60361 (the corresponding European Patent Application Publication No. 1 079 223) can also be used.

As uneven illuminance measuring sensor 94, a configuration similar to the one that is disclosed in, for example, U.S. Pat. No. 4,465,368 and the like can be used. Further, as aerial image measuring instrument 96, a configuration similar to the one that is disclosed in, for example, U.S. Patent Application Publication No. 2002/0041377 and the like can be used. Incidentally, three measurement members (94, 96 and 98) are to be arranged at measurement stage MST in the embodiment, but the types and/or the number of measurement members are/is not limited to them. As the measurement members, for example, measurement members such as a transmittance measuring instrument that measures a transmittance of projection optical system PL, and/or a measuring instrument that observes local liquid immersion device 8, for example, nozzle unit 32 (or tip lens 191) or the like may also be used. Furthermore, members different from the measurement members such as a cleaning member that cleans nozzle unit 32, tip lens 191 or the like may also be mounted on measurement stage MST.

In the embodiment, as can be seen from FIG. 5A, the sensors that are frequently used such as uneven illuminance measuring sensor 94 and aerial image measuring instrument 96 are placed on a centerline CL (Y-axis passing through the center) of measurement stage MST. Therefore, in the embodiment, measurement using theses sensors can be performed by moving measurement stage MST only in the Y-axis direction without moving the measurement stage in the X-axis direction.

In addition to each of the sensors described above, an illuminance monitor that has a light-receiving section having a predetermined area size that receives illumination light IL on the image plane of projection optical system PL may also be employed, which is disclosed in, for example, U.S. Patent Application Publication No. 2002/0061469 and the like, and this illuminance monitor is also preferably placed on the centerline.

Incidentally, in the embodiment, liquid immersion exposure is performed in which wafer W is exposed with exposure light (illumination light) IL via projection optical system PL and liquid (water) Lq, and accordingly uneven illuminance measuring sensor 94 (and the illuminance monitor), aerial image measuring instrument 96 and wavefront aberration measuring instrument 98 that are used in measurement using illumination light IL receive illumination light IL via projection optical system PL and the water. Further, only a part of each sensor, for example, the optical system or the like may be mounted on measurement table MTB (and stage main section 92), or the entire sensor may be placed on measurement table MTB (and stage main section 92).

Further, on the +Y end surface and the −X end surface of measurement table MTB, reflection surfaces 19a and 19b which are similar to the reflection surfaces of wafer table WTB described above are formed (refer to FIGS. 2 and 5A).

Figure 5B:
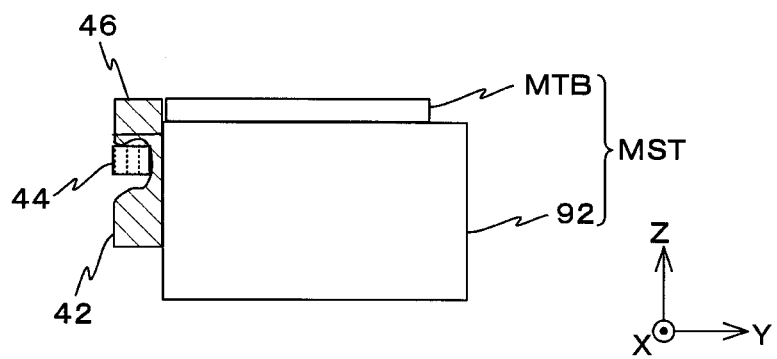
FIG. 5B is a schematic side view showing a partial cross section of measurement stage MST.

As shown in FIG. 5B, a frame-shaped attachment member 42 is fixed to the end surface on the −Y side of stage main section 92 of measurement stage MST. Further, to the end surface on the −Y side of stage main section 92, a pair of photodetection systems 44 are fixed in the vicinity of the center position in the X-axis direction inside an opening of attachment member 42, in the placement capable of facing a pair of light-transmitting systems 36 described previously. Each of photodetection systems 44 is composed of an optical system such as a relay lens, a light-receiving element, for example, a photomultiplier tube or the like, and a housing that houses them. As is obvious from FIGS. 43 and 5B and the description so far, in the embodiment, in a state where wafer stage WST and measurement stage MST are closer together within a predetermined distance in the Y-axis direction (including a contact state), illumination light IL that has been transmitted through each aerial image measurement slit pattern SL of measurement plate 30 is guided by each light-transmitting system 36 and received by the light-receiving element inside each photodetection system 44. That is, measurement plate 30, light-transmitting systems 36 and photodetection systems 44 constitute an aerial image measuring device 45 (refer to FIG. 6), which is similar to the one disclosed in U.S. Patent Application Publication No. 2002/0041377 referred to previously, and the like.

On attachment member 42, a fiducial bar (hereinafter, shortly referred to as a "FD bar") 46 composed of a bar-shaped member having a rectangular sectional shape is arranged extending in the X-axis direction. FD bar 46 is kinematically supported on measurement stage MST by full-kinematic mount structure.

Since FD bar 46 serves as a prototype standard (a measurement standard), optical glass ceramics with a low coefficient of thermal expansion, such as Zerodur (the brand name) of Schott AG are employed as the materials. The flatness degree of the upper surface (the surface) of CD bar 46 is set high to be around the same level as a so-called datum plane plate. Further, as shown in FIG. 5A, a reference grating (e.g. a diffraction grating) 52 having a periodic direction in the Y-axis direction is respectively formed in the vicinity of the end portions on one side and the other side in the longitudinal direction of FD bar 46. The pair of reference gratings 52 are formed apart from each other at a predetermined distance in the symmetrical placement with respect to the center in the X-axis direction of FD bar 46, that is, a centerline CL.

Further, on the upper surface of FD bar 46, a plurality of reference marks M are formed as shown in FIG. 5A. The plurality of reference marks M are formed in three-row arrays in the Y-axis direction in the same pitch, and the array of each row is formed being shifted from each other by a predetermined distance in the X-axis direction. As each of reference marks M, a two-dimensional mark having a size that can be detected by the primary alignment system and secondary alignment systems (to be described later) is used. Reference mark M may also be different in shape (constitution) from fiducial mark FM described earlier, but in the embodiment, reference mark M and fiducial mark FM have the same constitution and also they have the same constitution with that of the alignment mark on wafer W. Incidentally, in the embodiment, the surface of FD bar 46 and the surface of measurement table MTB (which may include the measurement members described above) are also covered with a liquid repellent film (a water repellent film) respectively.

Although omitted in FIG. 1 from the viewpoint of avoiding intricacy of the drawing, in exposure apparatus 100 of the embodiment, in actuality, as shown in FIG. 3, primary alignment system AL1 having a detection center at a position that is a predetermined distance away on the −Y side from optical axis AX of projection optical system FL is placed on reference axis LV described above. Primary alignment system AL is fixed to the lower surface of the main frame (not shown) via a support member 54. On one side and the other side in the X-axis direction with primary alignment system AL1 in between, secondary alignment systems AL$2_1$ and AL$2_2$, and AL$2_3$ and AL$2_4$ whose detection centers are substantially symmetrically placed with respect to straight line LV are respectively arranged. That is, five alignment systems ALL and AL$2_1$ to AL$2_4$ have the detection centers that are placed in different positions in the X-axis direction, that is, the five alignment systems are placed along the X-axis direction.

As representatively shown by secondary alignment system AL$2_4$, each secondary alignment system AL$2_n$ (n=1 to 4) is fixed to a tip (turning end) of an arm $56_n$ (n=1 to 4) that can turn around a rotation center O as the center in a predetermined angle range in clockwise and anticlockwise directions in FIG. 3. In the embodiment, a partial section of each secondary alignment system AL$2_n$ (e.g. including at least an optical system that irradiates an alignment light to a detection area and also leads the light that is generated from a subject mark within the detection area to a light-receiving element) is fixed to arm $56_n$ and the remaining section is arranged at the main frame that holds projection unit PU. The X-positions of secondary alignment systems AL$2_1$, AL$2_2$, AL$2_3$ and AL$2_4$ are severally adjusted by turning around rotation center O as the center. That is, the detection areas (or the detection centers) of secondary alignment systems AL$2_1$, AL$2_2$, AL$2_3$ and AL$2_4$ are independently movable in the X-axis direction. Accordingly, the relative positions of the detection areas of primary alignment system AL$_1$ and secondary alignment systems AL$2_1$, AL$2_2$, AL$2_3$ and AL$2_4$ are adjustable in the X-axis direction. Incidentally, in the embodiment, the X-positions of secondary alignment systems AL$2_1$, AL$2_2$, AL$2_3$ and AL$2_4$ are to be adjusted by the turning of the arms. However, the present invention is not limited thereto, and a drive mechanism that drives secondary alignment systems AL$2_1$, AL$2_2$, AL$2_3$ and AL$2_4$ back and forth in the X-axis direction may also be arranged. Further, at least one of secondary alignment systems AL$2_1$, AL$2_2$, AL$2_3$ and AL$2_4$ may be movable not only in the X-axis direction but also in the Y-axis direction. Incidentally, since a part of each secondary alignment system AL$2_n$ is moved by arm $56_n$, positional information of the part that is fixed to arm $56_n$ is measurable by a sensor (not shown) such as an interferometer, or an encoder. The sensor may only measure positional information in the X-axis direction of secondary alignment system AL$2_n$, or may be capable of measuring positional information in another direction, for example, the Y-axis direction and/or the rotation direction (including at least one of the θx and θy directions).

On the upper surface of each arm $56_n$, a vacuum pad $58_n$ (n=1 to 4, not shown in FIG. 3, refer to FIG. 6) that is composed of a differential evacuation type air bearing is arranged. Further, arm $56_n$ can be turned by a rotation drive mechanism $60_n$ (n=1 to 4, not shown in FIG. 3, refer to FIG. 6) that includes, for example, a motor or the like, in response to instructions of main controller 20. Main controller 20 activates each vacuum pad $58_n$ to fix each arm $56_n$ to a main frame (not shown) by suction after rotation adjustment of arm $56_n$. Thus, the state of each arm $56_n$ after rotation angle adjustment, that is, a desired positional relation between primary alignment system AL1 and four secondary alignment systems AL$2_1$ to AL$2_4$ is maintained.

Incidentally, in the case a portion of the main frame facing arm $56_n$ is a magnetic body, an electromagnet may also be employed instead of vacuum pad 58.

In the embodiment, as each of primary alignment system AL1 and four secondary alignment systems AL$2_1$ to AL$2_4$, for example, an FIA (Field Image Alignment) system by an image processing method is used that irradiates a broadband detection beam that does not expose the resist on a wafer to a subject mark, and picks up an image of the subject mark formed on a light-receiving plane by the reflected light from the subject mark and an image of an index (not shown, an index pattern on an index plate arranged within each alignment system), using an imaging device (such as CCD), and then outputs their imaging signals. The imaging signal from each of primary alignment system AL1 and four secondary alignment systems AL$2_1$ to AL$2_4$ is supplied to main controller 20 in FIG. 6 via an alignment signal processing system (not shown).

Incidentally, each of the alignment systems described above is not limited to the FIA system, but an alignment sensor, which irradiates a coherent detection light to a subject mark and detects a scattered light or a diffracted light generated from the subject mark or makes two diffracted lights (e.g. diffracted lights of the same order or diffracted lights being diffracted in the same direction) generated from the subject mark interfere and detects an interference light, can naturally be used by itself or in combination as needed. Further, in the embodiment, five alignment systems AL1 and AL$2_1$ to AL$2_4$ are to be fixed to the lower surface of the main frame that holds projection unit PU, via support member 54 or arm $56_n$, but the present invention is not limited thereto, and for example, the five alignment systems may be arranged on the measurement frame described earlier.

Next, a configuration and the like of interferometer system 118 (refer to FIG. 6) that measures positional information of wafer stage WST and measurement stage MST will be described.

As shown in FIG. 2, interferometer system 118 includes a Y interferometer 16, X interferometers 126, 127 and 128, and z interferometers 43A and 43 for position measurement of wafer stage WST; and a Y interferometer 18, an X interferometer 130 and the like for position measurement of measurement stage MST. By severally irradiating a measurement beam to reflection surfaces 17a and 17b of wafer table WTB and receiving a reflected light of each beam, Y interferometer 16 and X interferometers 126, 127 and 128 (X interferometers 126 to 128 are not shown in FIG. 1, refer to FIG. 2) measure displacement of each reflection surface from a reference position (e.g. a fixed mirror is placed on the side surface of projection unit PU, and the surface is used as a reference surface), that is, positional information of wafer stage WST within the XY plane, and supply the measured positional information to main controller 20. In the embodiment, as each of the interferometers, a multiaxial interferometer having a plurality of measurement axes is used with partial exceptions, as will be described later.

Meanwhile, as shown in FIGS. 4A and 4B, a movable mirror 41 having a longitudinal direction in the X-axis direction is attached to the side surface of stage main section 91 on the −Y side via a kinematic support mechanism (not shown). Movable mirror 41 is made up of a member which seems to be formed by uniting a rectangular parallelepiped member and a pair of triangle-pole-shaped members that are firmly fixed to a surface (a surface on the −Y side) of the rectangular parallelepiped. As can be seen from FIG. 2, movable mirror 41 is designed so that its length in the X-axis direction is longer than reflection surface 17a of wafer table WTB by at least a distance between the two Z interferometers (to be described later).

Mirror finish is applied to the surface of movable mirror 41 on the −Y side, and three reflection surfaces 41b, 41a and 41c are formed, as shown in FIG. 4B. Reflection surface 41a constitutes a part of an end surface on the −Y side of movable mirror 41 and extends parallel to the XZ plane and in the X-axis direction. Reflection surface 41b constitutes an adjacent surface on the +Z side of reflection surface 41a, and is inclined obtusely with respect to reflection surface 41a and extends in the X-axis direction. Reflection surface 41c constitutes an adjacent surface on the −Z side of reflection surface 41a and is arranged symmetrically with reflection surface 41b, with reflection surface 41a in between.

A pair of Z interferometers 43A and 43B, which irradiate measurement beams to movable mirror 41, are arranged facing movable mirror 41 (refer to FIGS. 1 and 2).

As is obvious when viewing FIGS. 1 and 2 together, Z interferometers 43A and 433 are respectively placed on one side and the other side of Y interferometer 16 in the X-axis direction at the substantially same distance from Y interferometer 16, and at positions that are slightly lower than Y interferometer 16.

As shown in FIG. 1, from each of Z interferometers 43A and 43B, a measurement beam 31 along the Y-axis direction is irradiated toward reflection surface 41b, and also a measurement beam B2 along the Y-axis direction is irradiated toward reflection surface 41c (refer to FIG. 4B). In the embodiment, a fixed mirror 47B having a reflection surface orthogonal to measurement beam B1 that is sequentially reflected off reflection surface 41b and reflection surface 41c, a fixed mirror 47A having a reflection surface orthogonal to measurement beam B2 that is sequentially reflected off reflection surface 41c and reflection surface 41b are arranged extending in the X-axis direction respectively, at positions that are a predetermined distance away from movable mirror 41 in the −Y direction, in a state of not interfering with measurement beams B1 and B2.

Fixed mirrors 47A and 47B are supported, for example, by the same support body (not shown) arranged on a frame (not shown) that supports projection unit PU.

Figure 8:
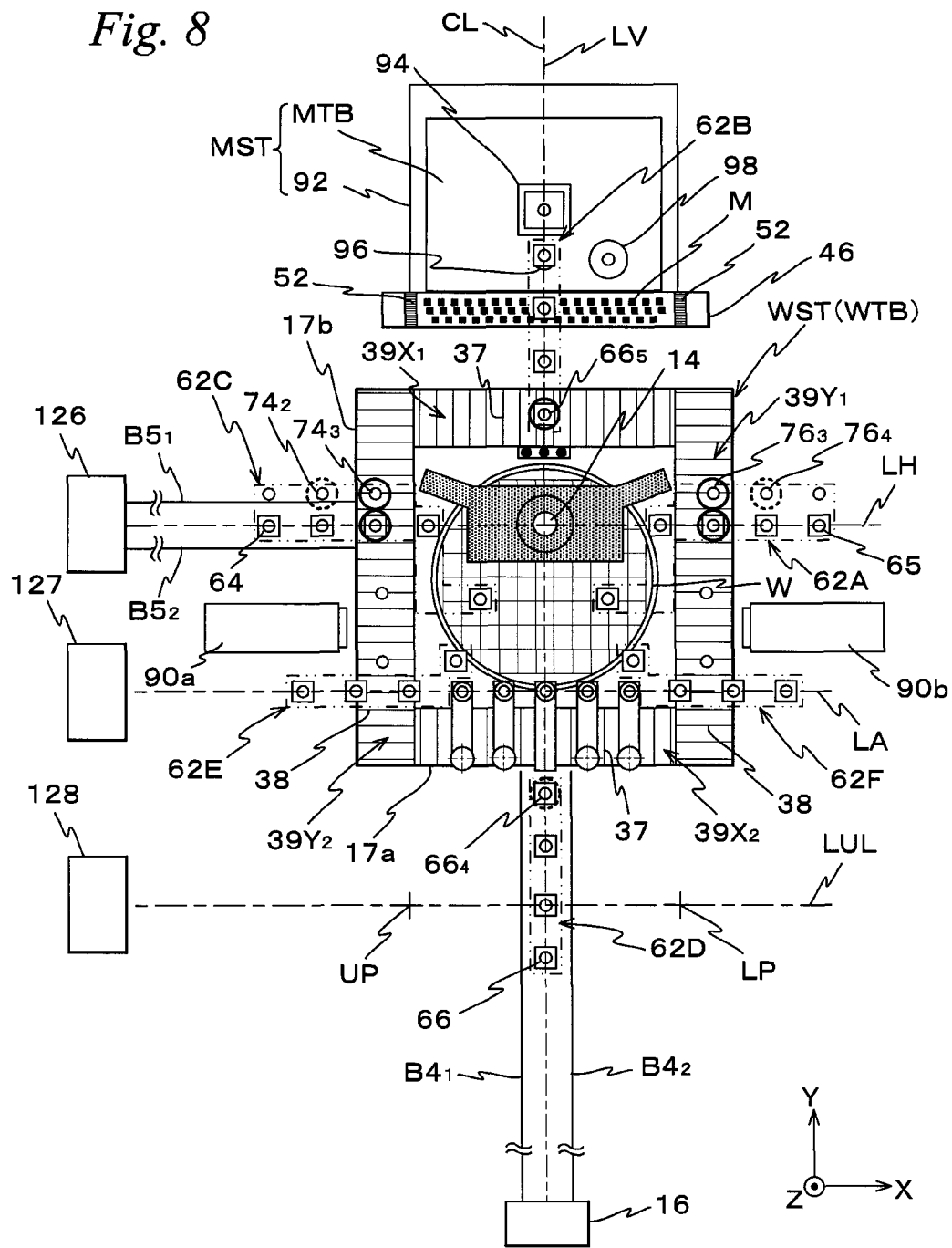
FIG. 8 is a view used to explain the placement of interferometers and position measurement of wafer stage WST by the interferometers when exposure is performed.

As shown in FIG. 8 (and FIG. 2), Y interferometer 16 irradiates measurement beams $B4_1$ and $B4_2$ to a reflection surface 17a of wafer table WTB along the measurement axes in the Y-axis direction that are the same distance away on the −X side and the +X side from reference axis LV described above, and receives a reflected light of each measurement beam, thereby detecting the position in the Y-axis direction (Y-position) of wafer table WTB at irradiation points of measurement beams $B4_1$ and $B4_2$. Incidentally, in FIG. 1, measurement beams $B4_1$ and $B4_2$ are representatively shown by a measurement beam B4.

Further, Y interferometer 16 irradiates measurement beam B3 toward reflection surface 41a along a measurement axis in the Y-axis direction spaced a predetermined distance apart in the Z-axis direction from measurement beams $B4_1$ and $B4_2$ between measurement beams $B4_1$ and $B4_2$, and receives measurement beam B3 reflected off reflection surface 41a, thereby detecting the Y-position of reflection surface 41a of movable mirror 41 (i.e. wafer stage WST).

Main controller 20 computes the Y-position (to be more precise, displacement $\Delta Y$ in the Y-axis direction) of reflection surface 17a, that is, of wafer table WTB (wafer stage WST), based on the average value of measurement values of measurement axes corresponding to measurement beams $B4_1$ and $B4_2$ of Y interferometer 16. In addition, main controller 20 computes displacement (yawing amount) $\Delta \theta z^{(Y)}$ in the rotational direction around the Z-axis ($\theta z$ direction) of wafer table WTB from the difference between the measurement values of the measurement axes corresponding to measurement beams $B4_1$ and $B4_2$. Further, main controller 20 computes displacement (pitching amount) $\Delta \theta x$ in the $\theta x$ direction of wafer stage WST based on the Y-positions (the displacement $\Delta Y$ in the Y-axis direction) of reflection surface 17a and reflection surface 41a.

Further, as shown in FIGS. 8 and 2, X interferometer 126 irradiates measurement beams $B5_1$ and $B5_2$ to wafer table WTB along the two measurement axes that are the same distance away from a straight line (reference axis) LH in the X-axis direction passing through the optical axis of projection optical system PL. Main controller 20 computes the position in the X-axis direction (X-position, to be more precise, displacement $\Delta X$ in the X-axis direction) of wafer table WTB, based on the measurement values of the measurement axes corresponding to measurement beams $B5_1$ and $B5_2$. Further, main controller 20 computes displacement (yawing amount) $\Delta \theta z^{(X)}$ in the $\theta z$ direction of wafer table WTB from the difference between the measurement values of the measurement axes corresponding to measurement beams $B5_1$ and $B5_2$. Incidentally, $\Delta \theta z^{(X)}$ obtained from X interferometer 126 and $\theta z^{(Y)}$ obtained from Y interferometer 16 are equal to each other, and they represent displacement (yawing) $\Delta \theta z$ in the $\theta z$ direction of wafer table WTB.

Figure 9:
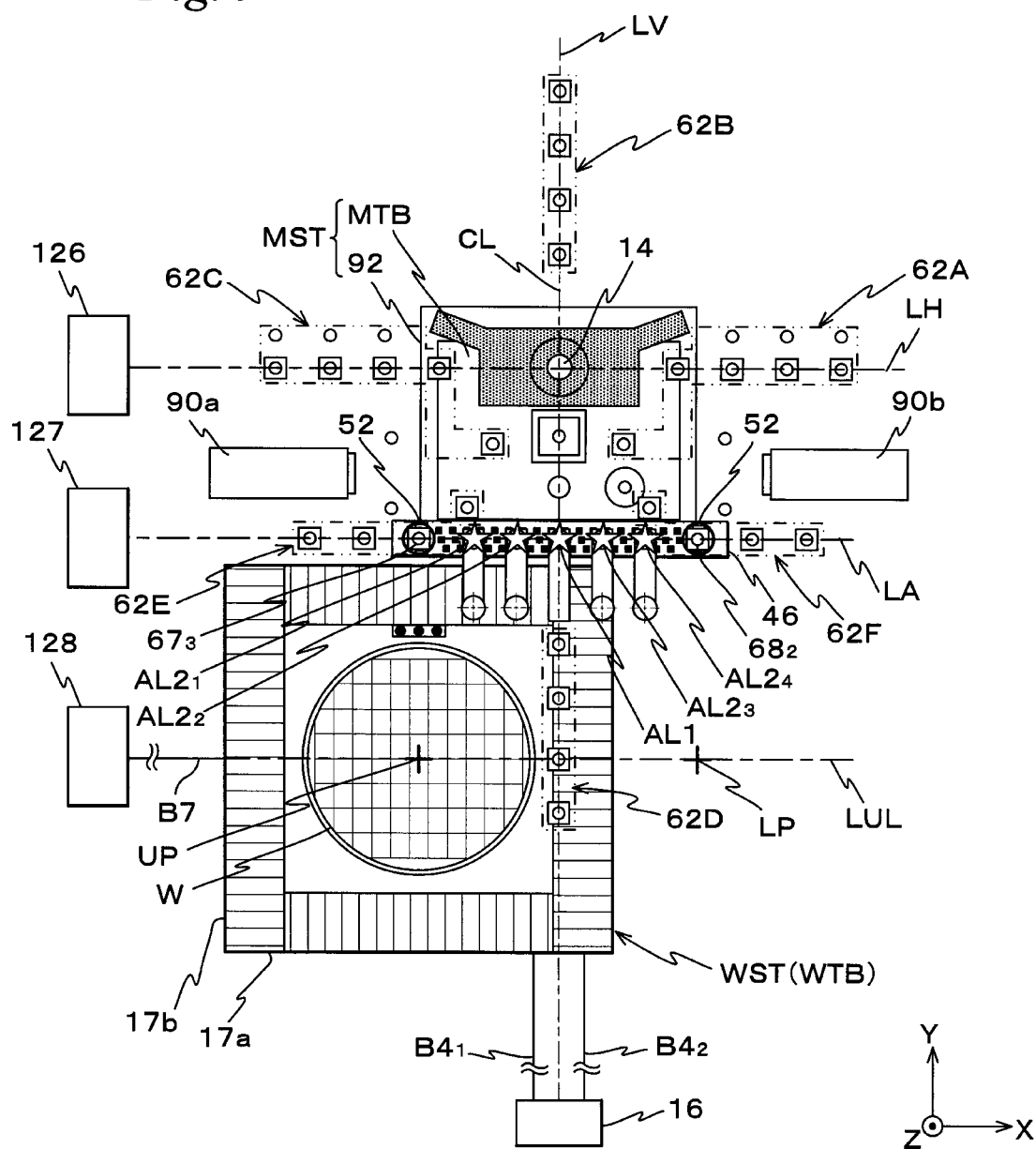
FIG. 9 is a view used to explain position measurement of wafer stage WST by the interferometers when a wafer is unloaded.
Figure 10:
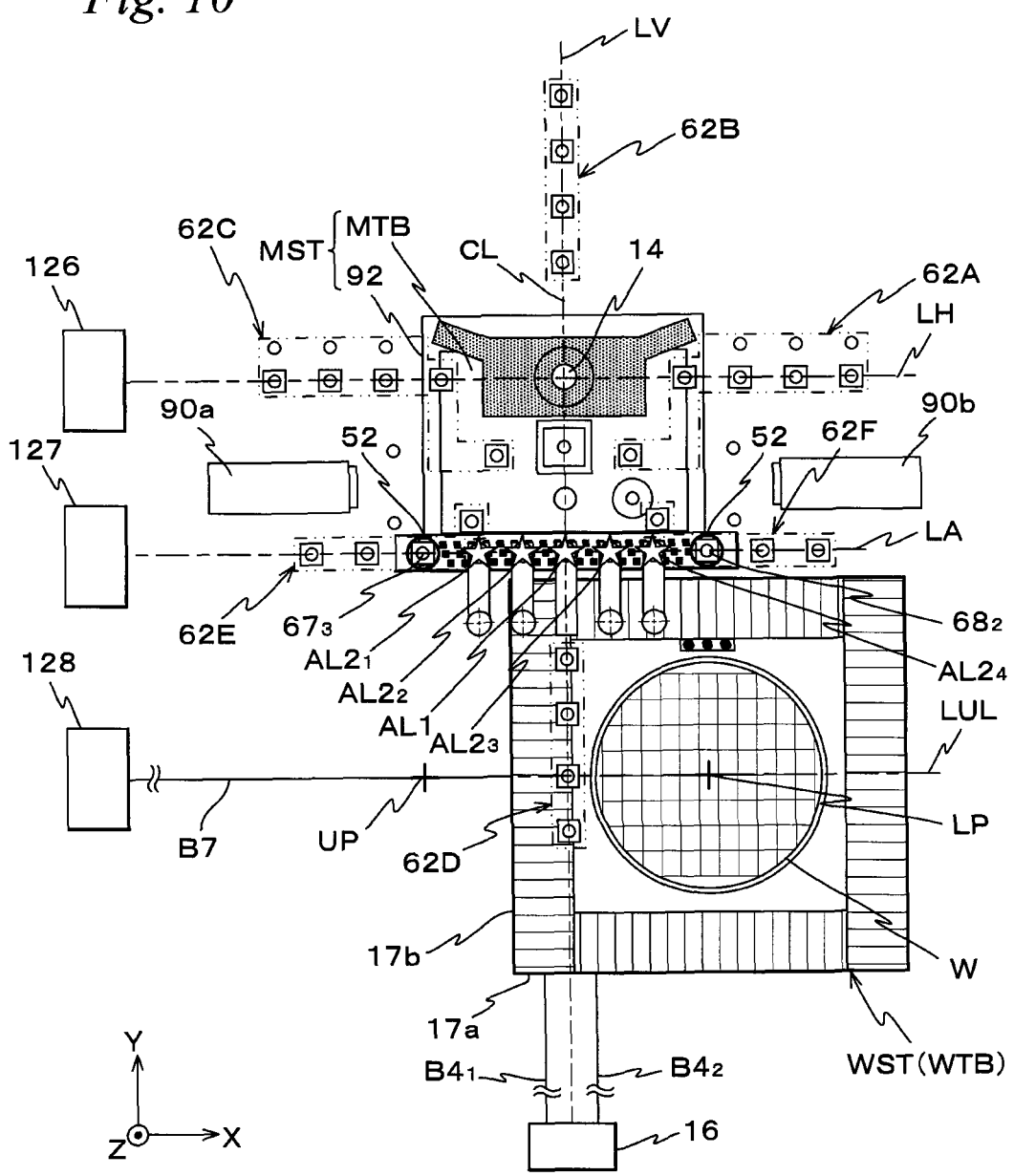
FIG. 10 is a view used to explain position measurement of wafer stage WST by the interferometers when a wafer is loaded.

Further, as shown in the drawings such as FIGS. 9 and 10, a measurement beam B7 emitted from X interferometer 128 is irradiated to reflection surface 17b of wafer table WTB along a straight line LUL parallel to the X-axis that connects an unloading position UP where a wafer on wafer table WTB is unloaded and a loading position LP where a wafer is loaded onto wafer table WTB. Further, as shown in the drawings such as FIGS. 11 and 12, a measurement beam B6 emitted from X interferometer 127 is irradiated to reflection surface 17b of wafer table WTB along a straight line (reference axis) LA parallel to the X-axis that passes through the detection center of primary alignment system AL1.

Figure 12:
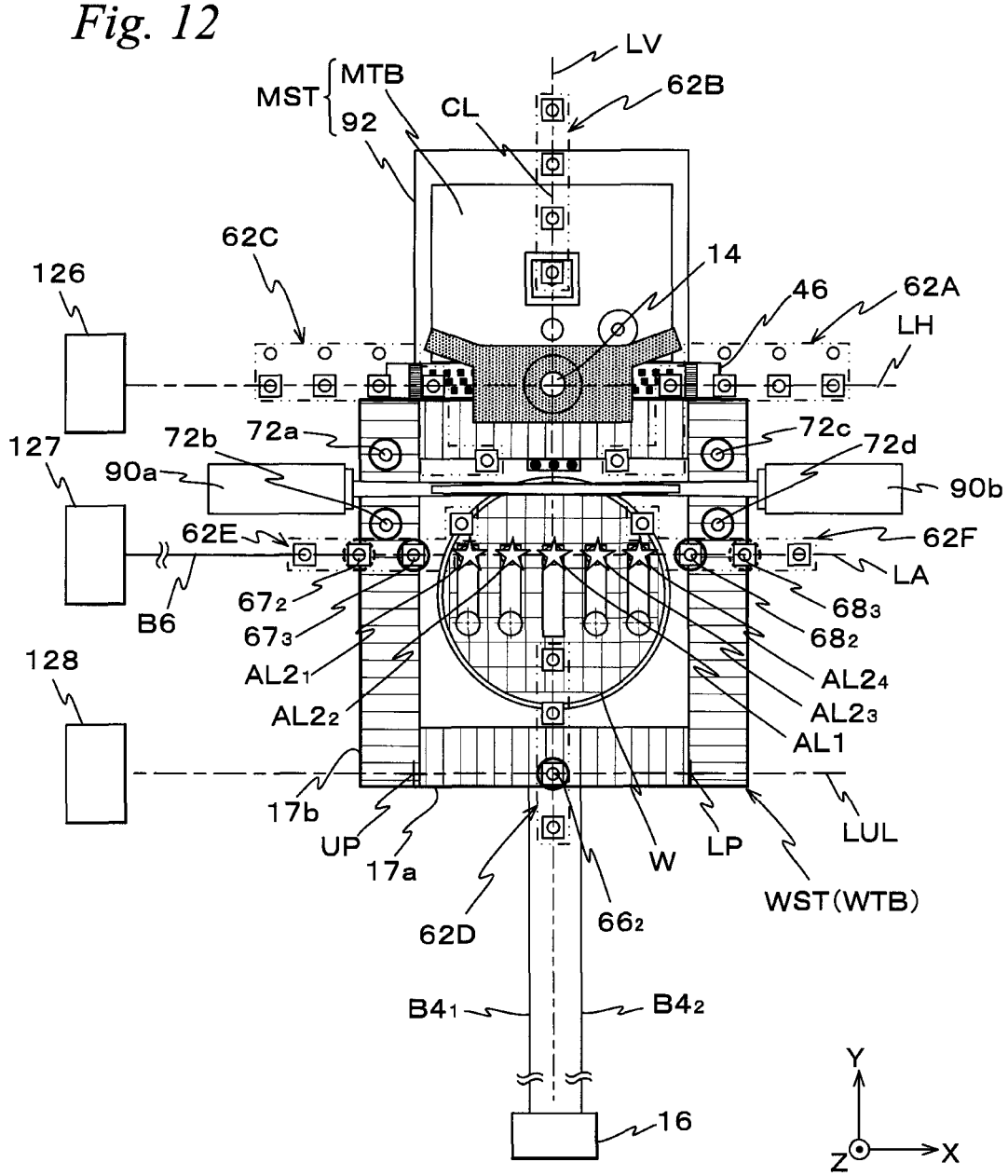
FIG. 12 is a view used to explain position measurement of water stage WST by the interferometers when wafer alignment is performed.

Main controller 20 can obtain the displacement ΔX in the X-axis direction of wafer table WTB also from the measurement value of X interferometer 127 and the measurement value of X interferometer 128. However, the placements of three X interferometers 126, 127 and 128 are different in the Y-axis direction, and therefore, X interferometer 126 is used when exposure is performed as shown in FIG. 8, X interferometer 127 is used when wafer alignment is performed as shown in FIG. 12, and X interferometer 128 is used when a wafer is unloaded as shown in FIG. 9 and when a wafer is loaded as shown in FIG. 10.

As shown in FIG. 1, measurement beams B1 and B2 along the Y-axis are irradiated from each of Z interferometers 43A and 43B toward movable mirror 41. Measurement beams B1 and B2 are incident on reflection surfaces 41b and 41c of movable mirror 41 at a predetermined incident angle (to be θ/2), respectively. Then, measurement beam B1 is sequentially reflected off reflection surfaces 41b and 41c and is vertically incident on the reflection surface of fixed mirror 47B, and measurement beam B2 is sequentially reflected off reflection surfaces 41c and 41b and is vertically incident on the reflection surface of fixed mirror 47A. Then, measurement beams B2 and B1 reflected off the reflections surfaces of fixed mirrors 47A and 47B are sequentially reflected off reflection surfaces 41b and 41c again or sequentially reflected off reflection surfaces 41c and 41b again (i.e. return in the optical paths, through which the incident beams passed through, in the reversed directions), and are received by Z interferometers 43A and 43B.

Herein, assuming that displacement of movable mirror 41 (i.e. water stage WST) in the Z-axis direction is ΔZo and displacement in the Y-axis direction is ΔYo, an optical path length change ΔL1 of measurement beam B1 and an optical path length change ΔL2 of measurement beam B2 are expressed in the following formulas (1) and (2), respectively.

$$\Delta L1 = \Delta Yo \times (1+\cos\theta) + \Delta Zo \times \sin\theta \quad (1)$$

$$\Delta L2 = \Delta Yo \times (1+\cos\theta) - \Delta Zo \times \sin\theta \quad (2)$$

Accordingly, from formulas (1) and (2), the displacements ΔZo and ΔYo are obtained by the following formulas (3) and (4).

$$\Delta Zo = (\Delta L1 - \Delta L2)/2\sin\theta \quad (3)$$

$$\Delta Yo = (\Delta L1 + \Delta L2)/\{2(1+\cos\theta)\} \quad (4)$$

The displacements ΔZo and ΔYo are obtained by each of Z interferometers 43A and 43B. Therefore, the displacements obtained by Z interferometer 43A are assumed to be ΔZoR and ΔYoR, and the displacements obtained by Z interferometer 43B are assumed to be ΔZoL and ΔYoL. Then, a distance between measurement beams B1 and B2 of each of Z interferometers 43A and 43B that are away from each other in the X-axis direction is assumed to be D (refer to FIG. 2). On such assumption, the displacement (yawing amount) Δθz in the θz direction of movable mirror 41 (i.e. wafer stage WST) and the displacement (rolling amount) Δθy in the θy direction of movable mirror 41 (i.e. wafer stage WST) are obtained by the following formulas (5) and (6).

$$\Delta\theta z = \tan^{-1}\{(\Delta YoR - \Delta YoL)/D\} \quad (5)$$

$$\Delta\theta y = \tan^{-1}\{(\Delta ZoL - \Delta ZoR)/D\} \quad (6)$$

Accordingly, main controller 20 can compute the displacements of four degrees of freedom, i.e. ΔZo, ΔYo, Δθz and Δθy of wafer stage WST based on the measurement results of Z interferometers 43A and 43B, by using above formulas (3) to (6).

In this manner, main controller 20 can obtain the displacements of wafer stage WST in directions of six degrees of freedom (Z, X, Y, θz, θx and θy directions) from the measurement results of interferometer system 118.

Incidentally, in the embodiment, the case has been described where water stage WST is configured by a single stage that is movable in directions of six degrees of freedom and includes stage main section 91 and wafer table WTB mounted on stage main section 91, but the present invention is not limited thereto, and wafer stage WST may also be configured including a stage main section freely movable within the XY plane and a wafer table that is finely drivable relative to the stage main section in at least the Z-axis direction, the θx direction and the θy direction. Further, instead of reflection surfaces 17a and 17b, a movable mirror made up of a planar mirror may be arranged at wafer table WTB. Moreover, although positional information of wafer stage WST is to be measured with the reflection surface of the fixed mirror arranged on projection unit PU as a reference surface, the location where the reference surface is placed is not limited to projection unit PU, and positional information of wafer stage WST does not necessarily have to be measured using the fixed mirror.

In the embodiment, however, positional information within the XY plane (including rotational information in the θz direction) for position control of wafer stage WST (wafer table WTB) is mainly measured by the encoder system (to be described later), and the measurement values of interferometers 16, 126 and 127 are secondarily used in the cases such as when long-term fluctuation of the measurement values of the encoder system (e.g. because of deformation of the scales due to time passage, or the like) is corrected (calibrated).

Incidentally, at least a part of interferometer system 118 (e.g. an optical system or the like) may be arranged at the main frame that holds projection unit PU, or may be arranged integrally with projection unit PU that is supported by suspension as is described above, but in the embodiment, interferometer system 118 is to be arranged at the measurement frame described above.

Further, in the embodiment, positional information of wafer stage WST measured by interferometer system 118 is not used in the exposure operation or the alignment operation (to be described later) but is to be used mainly in the calibration operation (i.e. calibration of the measurement values) of the encoder system, however, measurement information of interferometer system 118 (i.e. at least one of positional information in directions of six degrees of freedom) may also be used in, for example, the operations such as the exposure operation and/or the alignment operation. Further, it can also be considered that interferometer system 118 is used as the backup of the encoder system, which will be described later in detail. In the embodiment, the encoder system measures positional information of wafer stage WST in directions of three degrees of freedom, that is, positional information in the X-axis, Y-axis and θz directions. Therefore, in the operations such as the exposure operation, among measurement information of interferometer system 118, only positional information related to a direction different from the measurement directions (the X-axis, Y-axis and θz directions) of positional information of wafer stage WST by the encoder system, for example, only positional information related to at least one direction of the Z-axis direction, the θx direction and the θy direction may be used, or in addition to the positional information in the different direction, positional information related to the same direction as the measurement directions of the encoder system (i.e. at least one of the X-axis, Y-axis and θz directions) may also be used. Further, positional information of wafer stage WST in the Z-axis direction measured by interferometer system 118 may also be used in the operations such as the exposure operation.

Besides, interferometer system 118 (refer to FIG. 6) also includes Y interferometer 18 and X interferometer 130 used to measure a two-dimensional position coordinate of measurement table MTB. By irradiating measurement beams, as shown in FIG. 2, to reflection surfaces 19a and 19b and receiving a reflected light of each measurement beam, Y interferometer 18 and X interferometer 130 (X interferometer is not shown in FIG. 1, refer to FIG. 2) measure displacement of each reflection surface from a reference position. Main controller 20 receives the measurement values of Y interferometer 18 and X interferometer 130 and computes positional information of measurement stage MST (e.g. including at least positional information in the X-axis and Y-axis directions and rotational information in the ez direction).

Incidentally, as the Y interferometer for measurement table MTB, a multiaxial interferometer similar to Y interferometer 16 for wafer table WTB may be used. Further, as the X interferometer for measurement table MTB, a biaxial interferometer similar to X interferometer 126 for wafer table WTB may be used. Further, in order to measure the Z displacement, the Y displacement, the yawing amount, and the rolling amount of measurement stage MST, interferometers similar to Z interferometers 43A and 43B for wafer table WTB can also be introduced.

Next, a configuration and the like of encoder system 150 (refer to FIG. 6) that measures positional information (including rotational information in the θz direction) of water table WTB within the XY plane will be described.

As shown in FIG. 3, in exposure apparatus 100 of the embodiment, four head units 62A to 62D of encoder system 150 are placed in a state of surrounding the periphery of nozzle unit 32 described above. Although omitted in the drawings such as FIG. 3 from the viewpoint of avoiding intricacy of the drawings, in actuality, head units 62A to 62D are fixed to the main frame, which holds projection unit PU described above, in a suspended state via a support member.

As shown in FIG. 3, head units 62A and 62C are placed on the +X side and the −X side of projection unit PU respectively having the longitudinal direction in the X-axis direction. Head units 62A and 62C are respectively equipped with a plurality (five in this case) of Y heads $65_1$ to $65_5$ and $64_1$ to $64_5$ that are placed at a distance WD in the X-axis direction. To be more specific, each of head unit 62A and head unit 62C is equipped with a plurality (four in this case) of Y heads ($65_2$ to $65_5$ or $64_1$ to $64_4$) that are placed at distance WD on reference axis LH described above except for the periphery of projection unit PU and one Y head ($65_1$ or $64_5$) placed at a position that is a predetermined distance away from reference axis LH to the −Y direction on the periphery of projection unit PU, that is, a position on the −Y side of nozzle unit 32. Head units 62A and 62C axe also equipped with three Z heads (to be described later) respectively. In the following description, Y heads $65_1$ to $65_5$ or $64_1$ to $64_5$ are also described as Y heads 65 or 64 respectively as needed.

Head unit 62A constitutes a multiple-lens (five-lens in this case) Y linear encoder (hereinafter, shortly referred to as a "Y encoder" or an "encoder" as needed) 70A (refer to FIG. 6) that measures the position in the Y-axis direction (the Y-position) of wafer stage WST (wafer table WTB) using Y scale $39Y_1$ described above. Similarly, head unit 62C constitutes a multiple-lens (five-lens in this case) Y linear encoder 70C (refer to FIG. 6) that measures the Y-position of wafer stage WST (wafer table WTB) using Y scale $39Y_2$ described above. In this case, distance WD in the X-axis direction between the five Y heads (64 or 65) (i.e. the measurement beams) that are equipped in head units 62A and 62C is set slightly shorter than a width of Y scales $39Y_1$ and $39Y_2$ described above in the X-axis direction (to be more precise, the length of grid line 38).

As shown in FIG. 3, head unit 62B is placed on the +Y side of nozzle unit 32 (projection unit PU) and is equipped with a plurality (four in this case) of X heads $66_5$ to $66_8$ that are placed at distance WD along the Y-axis direction on reference axis LV described above. Further, head unit 62D is placed on the −Y side of primary alignment system $AL_1$ that is the opposite side to head unit 62B with nozzle unit 32 (projection unit PU) in between, and is equipped with a plurality (four in this case) of X heads $66_1$ to $66_4$ that are placed at distance WD on reference axis LV described above.

In the following description, X heads $66_1$ to $66_8$ are also described as X heads 66 as needed.

Head unit 62B constitutes a multiple-lens (four-lens in this case) X linear encoder (hereinafter, shortly referred to as an "X encoder" or an "encoder" as needed) 70B (refer to FIG. 6) that measures the position in the X-axis direction (the X-position) of wafer stage WST (water table WTB) using X scale $39X_1$ described above. Further, head unit 62D constitutes a multiple-lens (four-lens in this case) Y linear encoder 70D (refer to FIG. 6) that measures the X-position of wafer stage WST (wafer table WTB) using X scale $39X_2$ described above.

In this case, the distance between adjacent X heads 66 (i.e. the measurement beams) that are equipped in each of head units 62B and 62D is set slightly shorter than a width of X scales $39X_1$ and $39X_2$ described above in the Y-axis direction (to be more precise, the length of grid line 37). In addition, a distance between X head 66 of head unit 62B located on the most −Y side and X head 66 of head unit 62D located on the most +Y side is set slightly shorter than a width of wafer table WTB in the Y-axis direction so that switching (which is linkage to be described later) can be performed between these two X heads according to movement of wafer stage WST in the Y-axis direction.

In the embodiment, furthermore, head units 62F and 62F are respectively arranged a predetermined distance away on the −Y side of head units 62A and 62C. Although omitted in the drawings such as FIG. 3 from the viewpoint of avoiding intricacy of the drawings, in actuality, head units 62E and 62F are fixed to the foregoing main frame, which holds projection unit PU, in a suspended state via a support member. Incidentally, for example, in the case projection unit PU is supported by suspension, head units 62E and 62F, and head units 62A to 62D previously described may be supported by suspension integrally with projection unit PU, or may be arranged at the measurement frame described above.

Head unit 62E is equipped with four Y heads $67_1$ to $67_4$ whose positions in the X-axis direction are different. More particularly, head unit 62E is equipped with three Y heads $67_1$ to $67_3$ placed on the −X side of secondary alignment system $AL2_1$ on reference axis LA described above at the substantially same distance as distance WD described previously, and one Y head $67_4$ placed at a position which is a predetermined distance (a distance slightly shorter than WD) away on the +X side from the innermost (the +X side) Y head $67_3$ and is also on the +Y side of secondary alignment system $AL2_1$ a predetermined distance away from reference axis LA to the +Y side.

Head unit 62F is symmetrical to head unit 62E with respect to reference axis LV, and is equipped with four Y heads $68_1$ to $68_4$ which are placed symmetrically to four Y heads $67_1$ to $67_4$ with respect to reference axis LV. In the following description, Y heads $67_i$ to $67_4$ or $68_1$ to $68_4$ are also described as Y heads 67 or 68 respectively, as needed. When performing the alignment operation and the like (to be described later), at least one each of Y heads 67 and 68 faces Y scale $39Y_2$ and $39Y_1$ respectively, and by such Y heads 67 and 68 (i.e. Y encoders 70E and 70F (refer to FIG. 6) which are configured by these Y heads 67 and 68), the Y position (and the θz rotation) of wafer stage WST is measured.

Further, in the embodiment, at the time of baseline measurement (Sec-BCHK (interval)) and the like of the secondary alignment systems (to be described later), Y head $67_3$ and $68_2$ which are adjacent to the secondary alignment systems $AL2_1$ and $AL2_4$ in the X-axis direction face a pair of reference gratings 52 of FD bar 46 respectively, and by Y heads $67_3$ and $68_2$ that face the pair of reference gratings 52, the Y-position of FD bar 46 is measured at the position of each reference grating 52. In the description below, the encoders configured by Y heads $67_3$ and $68_2$ which face a pair of reference gratings 52 respectively are referred to as Y linear encoders (also shortly referred to as "Y encoders" or "encoders" as needed) $70E_2$ and $70F_2$. Further, in order to distinguish, the Y encoders 70E and 70F that are constituted by Y heads 67 and 68 that face Y scales $39Y_2$ and $39Y_1$ respectively are referred to as Y encoders $70E_1$ and $70F_1$.

Encoders 70A to 70F described above measure the position coordinate of wafer stage WST at a resolution of, for example, around 0.1 nm, and the measurement values are supplied to main controller 20. Main controller 20 controls the position within the XY plane of wafer table WTB based on the measurement values of three of linear encoders 70A to 70D or the measurement values of three of encoders 70B, 70D, $70E_1$ and $70F_1$, and also controls the rotation in the θz direction of FD bar 46 based on the measurement values of encoders $70E_2$ and $70F_2$. Incidentally, the configuration and the like of the linear encoder will be further described later.

In exposure apparatus 100 of the embodiment, as shown in FIG. 3, a multipoint focal position detection system (hereinafter, shortly referred to as a "multipoint AF system") by an oblique incident method is arranged, which is composed of an irradiation system 90a and a photodetection system 90b, having a configuration similar to the one disclosed in, for example, U.S. Pat. No. 5,448,332 and the like. In the embodiment, as an example, irradiation system 90a is placed on the +Y side of the −X end portion of head unit 62E previously described, and photodetection system 90b is placed on the +Y side of the +X end portion of head unit 62F previously described in a state of opposing irradiation system 90a.

A plurality of detection points of the multipoint AF system (90a, 90b) are placed at a predetermined distance along the X-axis direction on the surface to be detected. In the embodiment, the plurality of detection points are placed, for example, in the arrangement of a matrix having one row and M columns (M is a total number of detection points) or having two rows and N columns (N is a half of a total number of detection points). In FIG. 3, the plurality of detection points to which a detection beam is severally irradiated are not individually shown, but are shown as an elongate detection area (beam area) AS that extends in the X-axis direction between irradiation system 90a and photodetection system 90b. Since the length of detection area AF in the X-axis direction is set to around the same as the diameter of wafer W, position information (surface position information) in the Z-axis direction across the entire surface of wafer W can be measured by only scanning wafer W in the Y-axis direction once. Further, since detection area AF is placed between liquid immersion area 14 (exposure area IA) and the detection areas of the alignment systems (ALT, $AL2_1$ to $AL2_4$) in the Y-axis direction, the detection operations of the multipoint AF system and the alignment systems can be performed in parallel. The multipoint AF system may also be arranged on the main frame that holds projection unit PU or the like, but is to be arranged on the measurement frame described earlier in the embodiment.

Incidentally, the plurality of detection points are to be placed in one row and M columns, or two rows and N columns, but the number(s) of rows and/or columns is/are not limited to them. However, in the case the number of rows is two or more, the positions in the X-axis direction of the detection points are preferably made to be different between the different rows. Moreover, the plurality of detection points are to be placed along the X-axis direction, but the present invention is not limited thereto, and all of or some of the plurality of detection points may also be placed at different positions in the Y-axis direction. For example, the plurality of detection points may also be placed along a direction that intersects both of the X-axis and the Y-axis. That is, the positions of the plurality of detection points only have to be different at least in the X-axis direction. Further, a detection beam is to be irradiated to the plurality of detection points in the embodiment, but a detection beam may also be irradiated to, for example, the entire area of detection area AF. Furthermore, the length of detection area AF in the X-axis direction does not have to be nearly the same as the diameter of wafer W.

In the vicinity of detection points located at both ends out of a plurality of detection points of the multipoint AF system (90a, 90b), that is, in the vicinity of both end portions of detection area AF, heads 72a and 72b, and 72c and 72d of surface position sensors for Z position measurement (hereinafter, shortly referred to as "Z heads") are arranged each in a pair, in symmetrical placement with respect to reference axis LV. Z heads 72a to 72d are fixed to the lower surface of a main frame (not shown). Incidentally, Z heads 72a to 72d may also be arranged on the measurement frame described above or the like.

As Z heads 72a to 72d, a sensor head that irradiates a light to wafer table WTB from above, receives the reflected light and measures position information of the wafer table WTB surface in the Z-axis direction orthogonal to the XY plane at the irradiation point of the light, as an example, an optical displacement sensor head (a sensor head by an optical pickup method), which has a configuration like an optical pickup used in a CD drive device, is used.

In the embodiment, as each Z head, a configuration is employed where the diffraction grating surfaces of Y scales $39Y_1$, $39Y_2$ and the like are observed from above (the +Z direction) as in the encoder. Accordingly, by measuring the surface position information of the upper surface of wafer table WTB at different positions with the plurality of Z heads, the position in the Z-axis direction and at least the θy rotation (rolling) of wafer table WTB can be measured.

Furthermore, head units 62A and 62C previously described are equipped with three Z heads $76_j$ (j=3 to 5) and three Z heads $74_i$ (i=1 to 3) respectively at the same X positions as Y heads $65_j$ (j=3 to 5) and $64i$ (j=1 to 3) that head units 62A and 62C are respectively equipped with, with the Y position shifted. In this case, Z heads $76_j$ and $74_i$, which are three heads each, belonging to head units 62A and 62C respectively, are placed parallel to reference axis LH a predetermined distance away in the +Y direction from reference axis LH and also symmetric to each other with respect to reference axis LV.

Incidentally, as each of the Z heads $76_j$ and 74%, an optical displacement sensor head similar to Z heads 72a to 72d described above is employed.

In this case, Z head $74_3$ is on a straight line parallel to the Y-axis, the same as is with Z heads 72a and 72b previously described. Similarly, Z head $76_3$ is on a straight line parallel to the Y-axis, the same as is with Z heads 72c and 72d previously described.

Z heads 72a to 72d, Z heads $74_1$ to $74_3$, and z heads $76_3$ to $76_5$ are connected to main controller 20 via a signal processing/selection device 170 as shown in FIG. 6, and main controller 20 selects an arbitrary Z head from Z heads 72a to 72d, Z heads $74_1$ to $74_3$, and Z heads $76_3$ to $76_5$ via signal processing/selection device 170 and makes the head move into an operating state, and then receives the surface position information detected by the Z head which is in an operating state via signal processing/selection device 170. In the embodiment, a surface position measurement system 180 (a part of measurement system 200) that measures positional information of wafer table WTB in the Z-axis direction and the direction of inclination with respect to the XY plane is configured including Z heads 72a to 72d, z heads $74_1$ to $74_3$, and Z heads $76_3$ to $76_5$, and signal processing/selection device 170.

Incidentally, in FIG. 3, measurement stage MST is omitted and a liquid immersion area that is formed by water Lq held in the space between measurement stage MST and tip lens 191 is shown by a reference code 14. Further, as shown in FIG. 3, in the embodiment, unloading position UP and a loading position LP are set symmetrically with respect to reference axis LV. However, the present invention is not limited thereto, and unloading position UP and loading position LP may be the same position.

FIG. 6 shows the main configuration of the control system of exposure apparatus 100. The control system is mainly configured of main controller 20 composed of a microcomputer (or workstation) that performs overall control of the entire apparatus. In a memory 34 which is an external storage device connected to main controller 20, correction information is stored of measuring instrument systems such as interferometer system 118, encoder system 150 (encoders 70A to 70F), Z heads 72a to 72d, $74_1$ to $74_3$, $76_3$ to $76_5$ and the like. Incidentally, in FIG. 6, various sensors such as uneven illuminance measuring sensor 94, aerial image measuring instrument 96 and wavefront aberration measuring instrument 98 that are arranged at measurement stage MST are collectively shown as a sensor group 99.

Figure 7A:
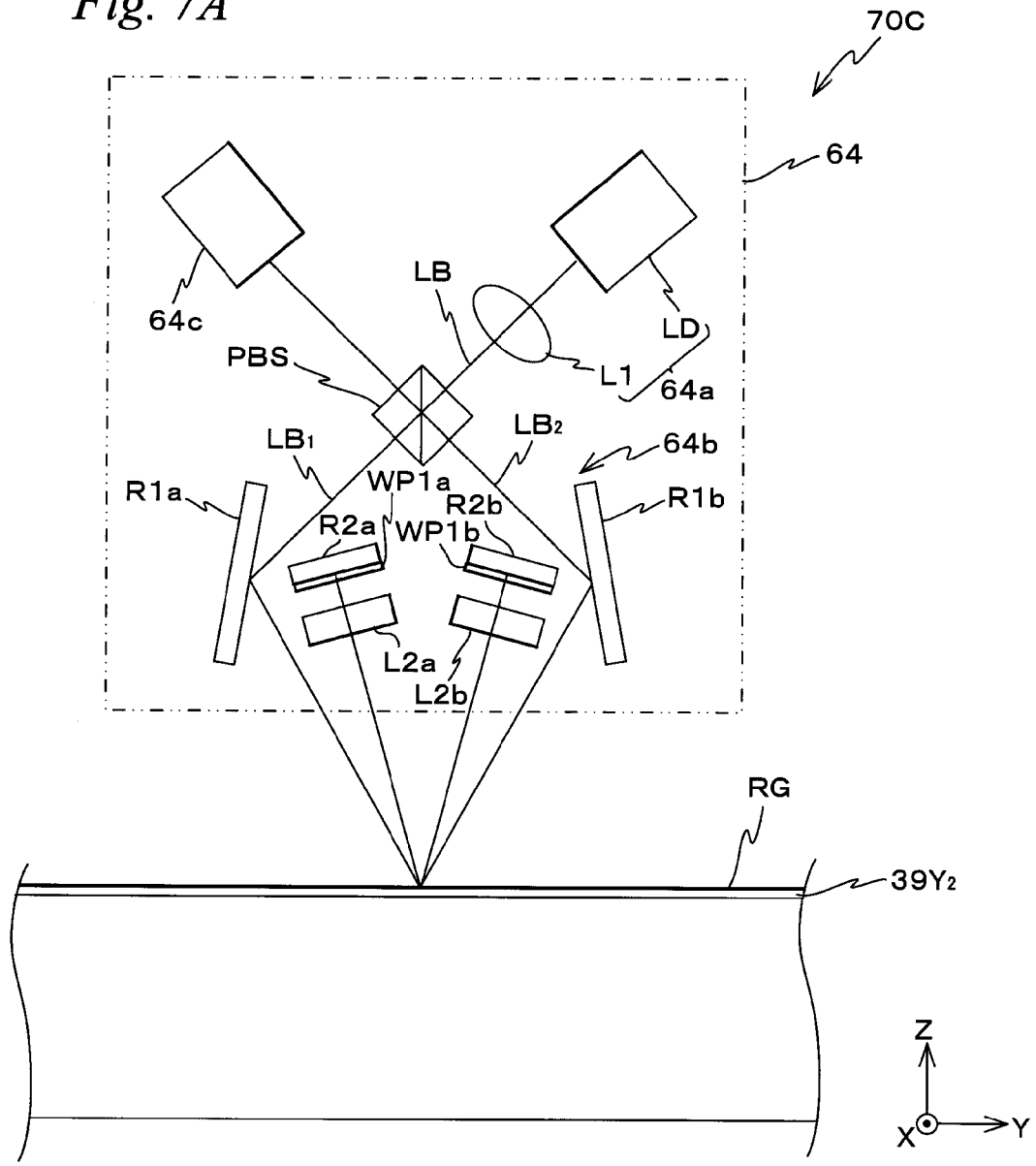
FIG. 7A is a view showing an example of a configuration of an encoder.

Next, the configuration and the like of encoders 70A to 70F will be described, focusing on Y encoder 70C that is enlargedly shown in FIG. 7A as a representative. FIG. 7A shows one Y head 64 of head unit 62C that irradiates a detection light (measurement beam) to Y scale $39Y_2$-Y head 64 is mainly composed of three sections, which are an irradiation system 64a, an optical system 64b and a photodetection system 64c.

Irradiation system 64a includes a light source that emits a laser beam LB in a direction angled at 45 degrees with respect to the Y-axis and Z-axis, for example, a semiconductor laser LD, and a lens $L_1$ that is placed on the optical path of laser beam LB emitted from semiconductor laser LD.

Optical system 64b is equipped with a polarization beam splitter PBS whose separation plane is parallel to an XZ plane, a pair of reflection mirrors R1a and R1b, lenses L2a and L 2b, quarter wavelength plates (hereinafter, referred to as a λ/4 plate) WP1a and WP1b, refection mirrors R2a and R2b, and the like. In this case, reflection mirror R1b is placed at position symmetric to reflection mirror R1a, with a separation plane of polarization beam splitter PBS as a reference. Similarly, converging lens L2a and L2b, λ/4 plates WP1a and WP1b, and reflection mirrors R2a and R2b are also placed at positions symmetric to each other, with the separation plane of polarization beam splitter PBS as a reference.

Photodetection system 64c includes a polarizer (an analyzer), a photodetector, and the like. Photodetection system 64c is placed on a return optical path of the reflection diffraction light of laser beam LB via the separation plane of polarization beam splitter PBS.

In Y encoder 70C, laser beam LB emitted from semiconductor laser LD is incident on polarization beam splitter PBS via lens $L_1$, and is split by polarization into two beams $LB_1$ and $LB_2$. In this case, a P-polarization component of laser beam LB is transmitted through polarization beam splitter PBS and forms beam $LB_1$, and an S-polarization component is reflected off the separation plane of polarization beam splitter PBS and forms beam $LB_2$. Beams $LB_1$ and $LB_2$ are reflected by reflection mirrors R1a and R1b, respectively, and are incident on reflective grating RG.

Diffraction lights are generated by beams $LB_1$ and $LB_2$ being irradiated on reflective grating RG. Of diffraction lights equal to or less than the $-1^{st}$ order generated by irradiation of beam $L_1$, for example, a diffraction light of the $-1^{st}$ order is transmitted through converging lens L2a and λ/4 plate WP1a, and reaches reflection mirror R2a. However, the sign of the order of the diffraction light is defined so that the diffraction light diffracting in the +Y direction (−Y direction) is positive (negative), with a zero-order diffraction light reflected by the same angle as the incoming light serving as a reference, as it will be described later on. Then, the diffraction light is reflected by reflection mirror R2a, and by tracing the same optical path as the outward path in the opposite direction, the light reaches reflective grating RG. In this case, by being transmitted through λ/4 plate WP1a twice in the outward path and the return path, the polarization direction of the diffraction light rotates by 90 degrees, and the diffraction light is converted into S-polarization. Meanwhile, of the diffraction light equal to or more than the $+1^{st}$ order generated by the irradiation of beam $LB_2$, for example, a diffraction light of the $+1^{st}$ order is transmitted through converging lens L2b and λ/4 plate WP1b, and reaches reflection mirror R2b. Then, the diffraction light is reflected by reflection mirror R2b, and by tracing the same optical path as the outward path in the opposite direction, the light reaches reflective grating RG. In this case, by being transmitted through λ/4 plate WP1b twice in the outward path and the return path, the polarization direction of the diffraction light rotates by 90 degrees, and the diffraction light is converted into P-polarization.

By irradiation of the return diffraction light from reflection mirrors R2a and R2b on reflective grating RG, a diffraction light is generated again. Of the diffraction lights deriving from the return light from reflection mirror R2a, a diffraction light of the same order as the return light is reflected by reflection mirror R1a and then reaches polarization beam splitter PBS. Meanwhile, of the diffraction lights deriving from the return light from reflection mirror R2b, a diffraction light of the same order as the return light is reflected by reflection mirror R1b and then reaches polarization beam splitter PBS.

Return beams $LB_1$ and $LB_2$ that reach polarization beam splitter PBS are converted into S-polarization and P-polarization, respectively. Therefore, return beam $LB_1$ is reflected off the separation plane of polarization beam splitter PBS, and return beam $LB_2$ is transmitted through polarization beam splitter PBS. Accordingly, return beams $LB_1$ and $LB_2$ are synthesized coaxially, and are incident on photodetection system 64c.

Inside photodetection system 64c, an analyzer arranges the polarization directions of return beams $LB_1$ and $LB_2$ and the beams interfere with each other and form an interference light. This interference light is detected by the photodetector. In this case, when Y scale $39Y_2$ (i.e. wafer stage WST) moves in the measurement direction (in this case, the Y-axis direction), phase difference between two beams $LB_1$ and $LB_2$ changes as will be described later on, which causes the intensity of the interference light to change. From this intensity change of the interference light, the positional relation between Y head 64 and Y scale $39Y_2$, that is, the Y-coordinate of wafer stage WST is computed and is output as a measurement value of Y encoder 70A.

Incidentally, other Y heads 64 of head unit 62C, and each of the Y heads 65 belonging to head unit 62A are configured similarly to the above-described configuration, and the heads face Y scale $39Y_2$ or $39Y_1$ and constitute Y encoder 70C or 70A.

Further each of the X heads 66 belonging to head units 62B and 62D, respectively, are configured similarly to Y head 64 described above, and the heads face X scale $39X_1$ or $39X_2$ and constitute X encoder 70B or 70D.

Further, each of the Y heads 67 and 68 belonging to head units 62E and 62F, respectively, are configured similarly to Y head 64 described above, and the heads face Y scale $39Y_2$ or $39Y_1$ and constitute Y encoder $70E_1$ or $70F_1$. Further, Y heads $67_3$ and $68_3$ face the pair of reference gratings 52 on measurement stage MST respectively, and constitute Y encoders $70E_2$ and $70F_2$.

Figure 7B:
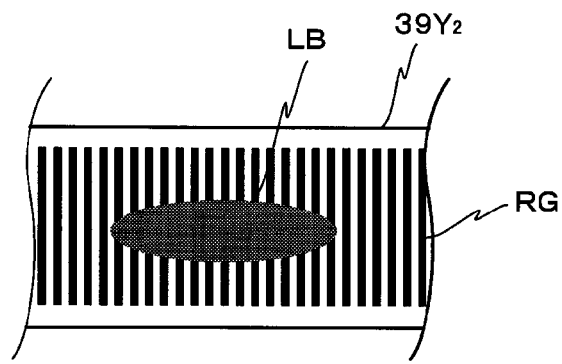
FIG. 7B is a view showing the case where a laser beam LB having a sectional shape that is elongated in a periodic direction of a grating RG is used as a detection light.

As each of the encoders, an encoder having a resolution of, for example, around 0.1 nm is used. Incidentally, in the encoders of the embodiment, as shown in FIG. 7B, laser beam LB having a sectional shape that is elongated in the periodic direction of diffraction grating RG may also be used, as a detection light. In FIG. 7B, beam LB is overdrawn largely compared to grating RG.

Incidentally, as another form of the encoder head, there is a type in which only optical system 64b is included in the encoder head and irradiation system 64a and photodetection system 64c are physically separate from optical system 64b. In the case of such a type, the laser beam is guided between these three sections via, for example, an optical fiber.

Next, a parallel processing operation that uses water stage WST and measurement stage MST in exposure apparatus 100 of the embodiment will be described, based on FIGS. 8 to 12. Incidentally, during the operation below, main controller 20 performs the open/close control of each valve of liquid supply device 5 and liquid recovery device 6 of local liquid immersion device 8 in the manner described previously, and water is constantly filled on the outgoing surface side of tip lens 191 of projection optical system PL. However, in the description below, in order to make the explanation easily understandable, the explanation related to the control of liquid supply device S and liquid recovery device 6 will be omitted. Further, many drawings are used in the operation description hereinafter, however, reference codes may or may not be given to the same member for each drawing. That is, the reference codes written are different for each drawing, however, such members have the same configuration, regardless of the indication of the reference codes. The same can be said for each drawing used in the description so far.

FIG. 8 shows a state in which exposure by a step-and-scan method of wafer W mounted on wafer stage WST is being performed. This exposure is performed, by alternately repeating a movement between shots in which wafer stage WST is moved to a scanning starting position (acceleration starting position) to expose each shot area on wafer W and scanning exposure by the scanning exposure method in which the pattern formed on reticle R is transferred onto each shot area, based on results of wafer alignment (e.g. EGA: Enhanced Global Alignment) and the like which has been performed prior to the beginning of exposure. Further, exposure is performed in the following order, from the shot area located on the −Y side on wafer W to the shot area located on the +Y side. Incidentally, exposure is performed in a state where liquid immersion area 14 is formed between projection unit PU and wafer W.

During the exposure described above, the position (including rotation in the θz direction) of wafer stage WST (wafer table WTB) in the XY plane is controlled by main controller 20, based on measurement results of a total of three encoders which are two Y encoders 70A and 70C, and one of two X encoders 702 and 70D. In this case, two X encoders 70B and 70D are made up of two X heads 66 that face X scale $39X_1$ and $39X_2$ respectively, and two Y encoders 70A and 70C are made up of Y heads 65 and 64 that face Y scales $39Y_1$ and $39Y_2$ respectively. Further, the Z position and rotation (rolling) in the θy direction of wafer stage WST are controlled, based on measurement results of a pair of Z heads $74_i$ and $76_j$ that respectively face the end portions on one side and the other side of the surface of wafer table WTB in the X-axis direction. The θx rotation (pitching) of wafer stage WST is controlled based on measurement results of Y interferometer 16. Incidentally, the control of the position in the Z-axis direction, the rotation in the θy direction, and the rotation in the θx direction of wafer table WTB (i.e. the focus leveling control of wafer W) is performed, based on results of a focus mapping performed beforehand.

At the position of wafer stage WST shown in FIG. 8, while X head $66_5$ (indicated circled in FIG. 8) faces X scale $39X_1$, there are no X heads 66 that face X scale $39X_2$. Therefore, main controller 20 executes position (X, Y, θz) control of water stage WST (hereinafter, shortly referred to as stage control as needed) using one X encoder 70B and two Y encoders 70A and 70C. In this case, when wafer stage WST moves from the position shown in FIG. 8 to the −Y direction, X head $66_5$ moves off of (no longer faces) X scale $39X_1$, and X head $66_4$ (indicated circled in a broken line in FIG. 8) faces X scale $39X_2$ instead. Therefore, main controller 20 switches the stage control to a control that uses one X encoder 70D and two Y encoders 70A and 70C.

As is described, main controller 20 executes stage control by consistently switching the encoder to use depending on the position coordinate of wafer stage WST.

Incidentally, independent from the position measurement of wafer stage WST described above using the encoders, position (X, Y, Z, θx, θy, θz) measurement of wafer stage WST using interferometer system 118 is constantly performed. In this case, the X position and θz rotation (yawing), or the X position of wafer stage WST are/is measured using X interferometers 126, 127, or 128, the Y position, the θx rotation, and the θz rotation are measured using Y interferometer 16, and the Y position, the Z position, the θy rotation, and the θz rotation are measured using Z interferometers 43A and 43B (not shown in FIG. 8, refer to FIG. 1 or 2), the interferometers constituting interferometer system 118. Either one of X interferometers 126, 127, and 128 is used according to the Y position of wafer stage WST. As shown in FIG. 8, X interferometer 126 is used during exposure. The measurement results of interferometer system 118 related to directions of three degrees of freedom, which are the X, Y and θz directions, are secondarily used for position control of wafer stage WST.

When exposure of wafer W ends, main controller 20 drives wafer stage WST toward unloading position UP. On this drive, wafer stage WST and measurement stage MST which were apart from each other during exposure come into contact or come close to each other with a clearance of around 300 μm in between, and shift to a scrum state, In this case, the −Y side surface of FD bar 46 on measurement table MTB and the +Y side surface of wafer table WTB come into contact or come close together. And by both stages WST and MST moving in the −Y direction while maintaining the scrum state, liquid immersion area 14 formed under projection unit PU moves onto measurement stage MST. For example, FIGS. 9 and 10 show the state after the movement.

When wafer stage WST moves further to the −Y direction and moves off from the effective stroke area (the area in which wafer stage WST moves at the time of exposure and wafer alignment) after starting the drive of wafer stage WST toward unloading position UP, all the X heads and Y heads that constitute encoder 70A to 70D and all the Z heads move off from the corresponding scales on wafer table WTB. Therefore, stage control based on the measurement results of encoders 70A to 70D and the Z heads is no longer possible. Just before this, main controller 20 switches the stage control to a control based on the measurement results of interferometer system 118. In this case, of three X interferometers 126, 127, and 128, X interferometer 128 is used.

Then, water stage WST releases the scrum state with measurement stage MST and then moves to unloading position UP, as shown in FIG. 9. After the movement, main controller 20 unloads wafer W on wafer table WTB. And then, main controller 20 drives wafer stage WST in the +X direction to move wafer stage WST to loading position LP, and the next wafer W is loaded on water table WTE, as shown in FIG. 10.

In parallel with these operations, main controller 20 executes Sec-BCHK (a secondary base line check) in which position adjustment within the XY plane of FD bar 46 supported by measurement stage MST and baseline measurement of four secondary alignment system $AL2_1$ to $AL2_4$ are performed. Sec-BCHK is performed on an interval basis for every wafer exchange. In this case, to measure the position (the Oz rotation) within the XY plane, Y encoders $70E_2$ and $70F_2$ described earlier are used.

Figure 11:
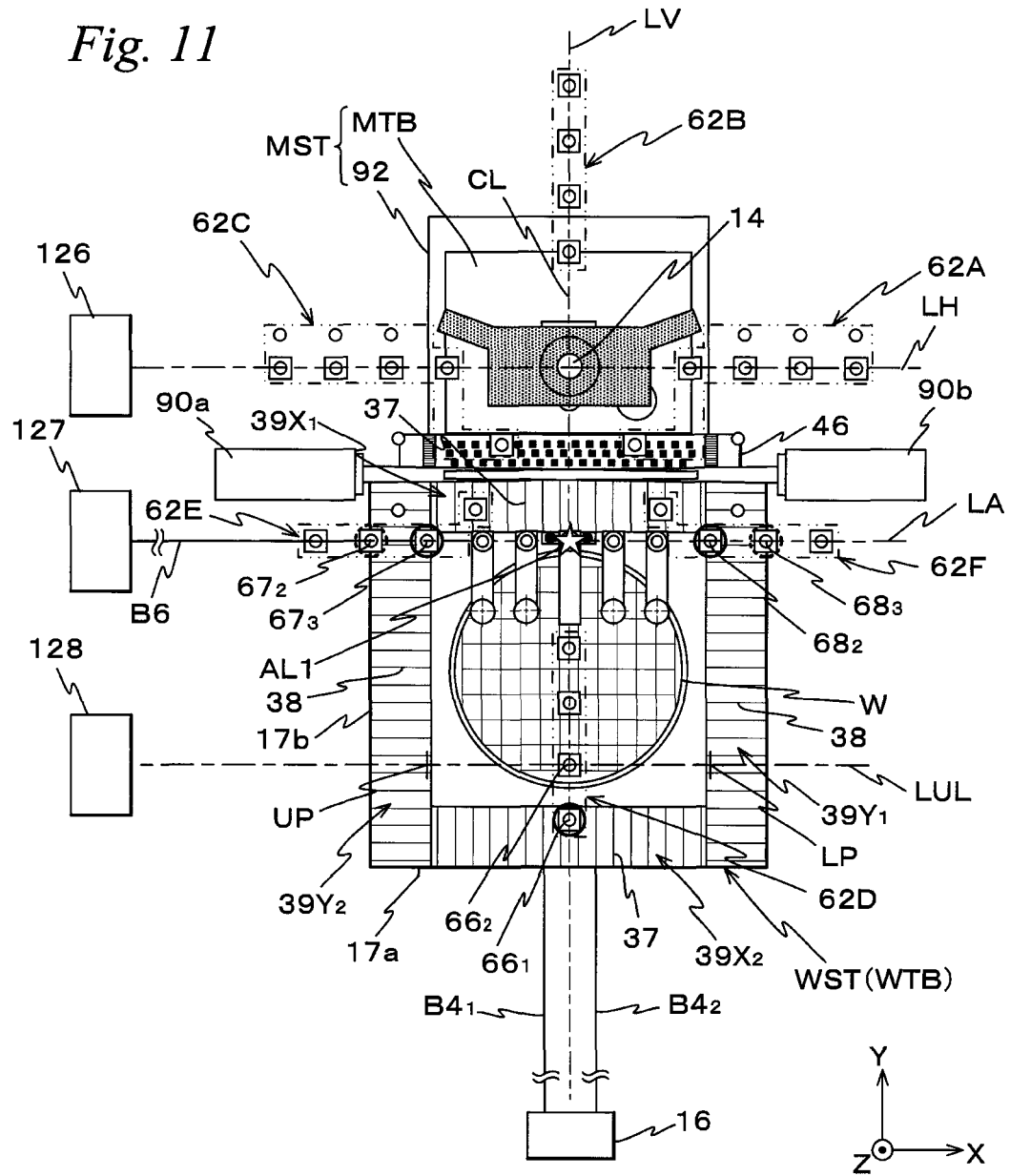
FIG. 11 is a view showing a positional relation between encoder heads and wafer stage WST when stage servocontrol by the interferometers is switched to stage servocontrol by the encoders.

Next, as shown in FIG. 11, main controller 20 drives wafer stage WST and positions fiducial mark FM on measurement plate 30 within a detection field of primary alignment system AL1, and performs the former process of Pri-BCHK (a primary baseline check) in which the reference position is decided for baseline measurement of alignment systems AL1, and $AL2_1$ to $AL2_4$.

On this process, as shown in FIG. 11, two Y heads $68_2$ and $67_3$ and one X head 66 (indicated circled in the drawing) come to face Y scales $39Y_1$ and $39Y_2$, and X scale $39X_2$, respectively. Therefore, main controller 20 switches the stage control from a control using interferometer system 118, to a control using encoder system 150 (encoders $70F_1$, $70E_1$, and 70D). Interferometer system 118 is used secondarily again. Incidentally, of three X interferometers 126, 127, and 128, X interferometer 127 is used.

Then, main controller 20 executes wafer alignment (EGA) using primary alignment system AL1 and secondary alignment systems $AL2_1$ to $AL2_4$ (refer to the star mark in FIG. 12).

Incidentally, in the embodiment, as shown in FIG. 12, wafer stage WST and measurement stage MST are to be shifted to the scrum state by the time wafer alignment is started. Main controller 20 drives both stages WST and MST in the MY direction, while maintaining the scrum state. Then, the water of liquid immersion area 14 is moved from measurement table MTB onto wafer table WTB.

In parallel with the wafer alignment (EGA), main controller 20 executes focus calibration and focus mapping using the Z heads (70a to 70d) and the multipoint AF system (90a, 90b), and furthermore executes the latter process of Pri-BCHK in which intensity distribution of a projected image with respect to the XY position of wafer table WTB is measured using aerial image measuring device 45.

When the operation described above ends, main controller 20 releases the scrum state of both stages WST and MST. And, as shown in FIG. 8, exposure by a step-and-scan method is performed, and a reticle pattern is transferred onto a new wafer W. Hereinafter, a similar operation is executed repeatedly.

In the embodiment, as previously described, main controller 20 can measure the displacement of wafer stage WST in directions of six degrees of freedom (X, Y, Z, θx, θy, θz) in the entire stroke area, by using X interferometers 126, 127 and 128, Y interferometer 16, and Z interferometers 43A and 43B of interferometer system 118.

The measurement principle of the interferometer will now be briefly described. The interferometer irradiates a measurement beam (measurement light) toward a reflection surface provided at a measurement subject, synthesizes the reflected light with a reference light and receives the light, and measures the intensity of the synthesized light, that is, the intensity of the interference light. In this case, due to optical path difference ΔL between the reflected light and the reference light, the relative phase (phase difference) between them changes by KΔL. Accordingly, the intensity of the interference light changes in proportion to 1+a·cos(KΔL) In this case, it is assumed that homodyne detection method is employed and the wave number of the measurement light and that of the reference light are the same, expressed as K. Constant a is decided by the intensity ratio of the measurement light and the reference light. In this case, the reflection surface to the reference light is arranged generally on the side surface of projection unit PU (in some cases, inside an interferometer unit). This reflection surface of the reference light serves as the reference position of the measurement. Accordingly, in optical path difference ΔL, the distance from the reference position to the reflection surface is reflected. Therefore, if the number of times (the number of fringes) of intensity change of the interference light with respect to the change of distance to the reflection surface is measured, displacement of the reflection surface provided at the measurement subject can be computed by the product of the counting value and the measurement unit. The measurement unit is half the wavelength of the measurement light, in the case of an interferometer of a single-pass method, and is one-fourth of the wavelength in the case of an interferometer of the double-pass method.

Now, in the case of employing an interferometer of the heterodyne detection method, wave number $K_1$ of the measurement light and wave number $K_2$ of the reference light are slightly different. In this case, assuming that the optical path length of the measurement light and the reference light is $L_1$ and $L_2$ respectively, the phase difference between the measurement light and the reference light is given $KΔL+ΔKL_1$, and the intensity of the interference light changes in proportion to $1+a·cos(KΔL+ΔKL_1)$. In this case, it is assumed that optical path difference $ΔL=L_1−L_2$, $ΔK=K_1−K_2$, and $K=K_2$. When optical path length $L_2$ of the reference light is sufficiently short, and approximate $ΔL≈L_1$ stands, the intensity of the interference light changes in proportion to 1+a·cos [(K+

ΔK)ΔL]. As it can be seen from above, the intensity of the interference light periodically vibrates at a wavelength 2π/K of the reference light along with the change of optical path difference ΔL, and the envelope curve of the periodic vibration vibrates (beats) at a long cycle 2π/ΔX. Accordingly, in the heterodyne detection method, the changing direction of optical path difference ΔL, that is, the displacement direction of the measurement subject can be learned from the long-period beat.

Incidentally, as a major cause of error of the interferometer, temperature fluctuation (air fluctuation) of the atmosphere on the beam optical path can be considered. For example, supposing that wavelength λ of the light changes to λ+Δλ by air fluctuation. Because the change of phase difference KΔL by minimal change Δλ of the wavelength is wave number K=2π/λ, 2πΔLΔλ/λ² can be obtained. In this case, assuming that wavelength of light λ=1 μm and minimal change Δλ=1 nm, the phase change becomes 2π×100 with respect to an optical path difference ΔL=100 mm. This phase change corresponds to displacement which is 100 times the measurement unit. In the case the optical path length is set long as is described, the interferometer is greatly affected by the air fluctuation which occurs in a short time, and is inferior in short-term stability. In such a case, it is desirable to use an encoder.

Next, a computation method of a position coordinate (X, Y) of wafer table WTB based on the measurement results of X interferometer 126 (127 or 128) and Y interferometer 16 by main controller 20 will be described.

In FIG. 13, the three X interferometers will be collectively referred to as IntX, and the Y interferometer will be referred to as IntY. For the sake of simplicity, these interferometers are to have one measurement axis. The X and Y coordinate axes are defined by a measurement axis LX of X interferometer IntX and a measurement axis LY of Y interferometer IntY, respectively. The reference position of X interferometer IntX is to be $O_x$=(px, qx), the reference position of Y interferometer IntY is to be $O_y$=(py, qy), and the origin of the XY coordinate system will be O=(py, qx). Irradiation points of measurement beams LX and LY on reflection surfaces 17a and 17b are to be $Q_X$ and $Q_Y$.

Figure 13A:
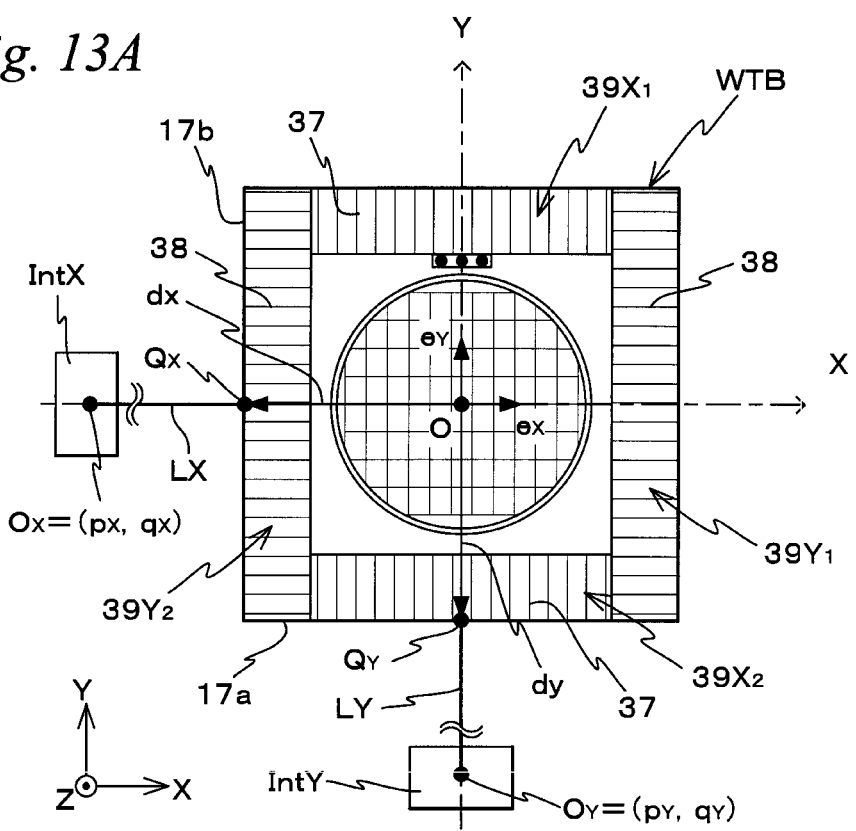
FIGS. 13A and 13B are views used to explain a method of computing the XY position coordinate of the wafer stage based on measurement results of the interferometers.

In a reference state shown in FIG. 13A, the center of wafer table WTB is located at coordinate origin O. Further, X reflection surface 17b is parallel to the Y-axis and is orthogonal to measurement axis LX (hereinafter, the measurement beam of X interferometer IntX will also be described as measurement beam LX as necessary), and X reflection surface 17a is parallel to the X-axis and is orthogonal to measurement axis LY (hereinafter, the measurement beam of Y interferometer IntY will also be described as measurement beam LY as necessary). In this reference state, nearest-neighbor vectors to reflection surfaces 17b and 17a from coordinate origin O, are assumed to be dx=−dxex and dy=−dYey, respectively. Herein, ex and ey are X and Y unit vectors, respectively.

The points on reflection surfaces 17b and 17a indicated by nearest-neighbor vectors dx and dy coincide with irradiation points $Q_X$ and $Q_Y$ of measurement beams LX and LY on reflection surfaces 17b and 17a, respectively. Incidentally, the distance of measurement beams LX and LY of XY interferometers IntX and IntY to irradiation points $Q_X$ and $Q_Y$, is |(dx−$O_x$)·ex|=|dX+px|, |(dy−$O_y$)·ey|=|dY+qy|, respectively.

Figure 13B:
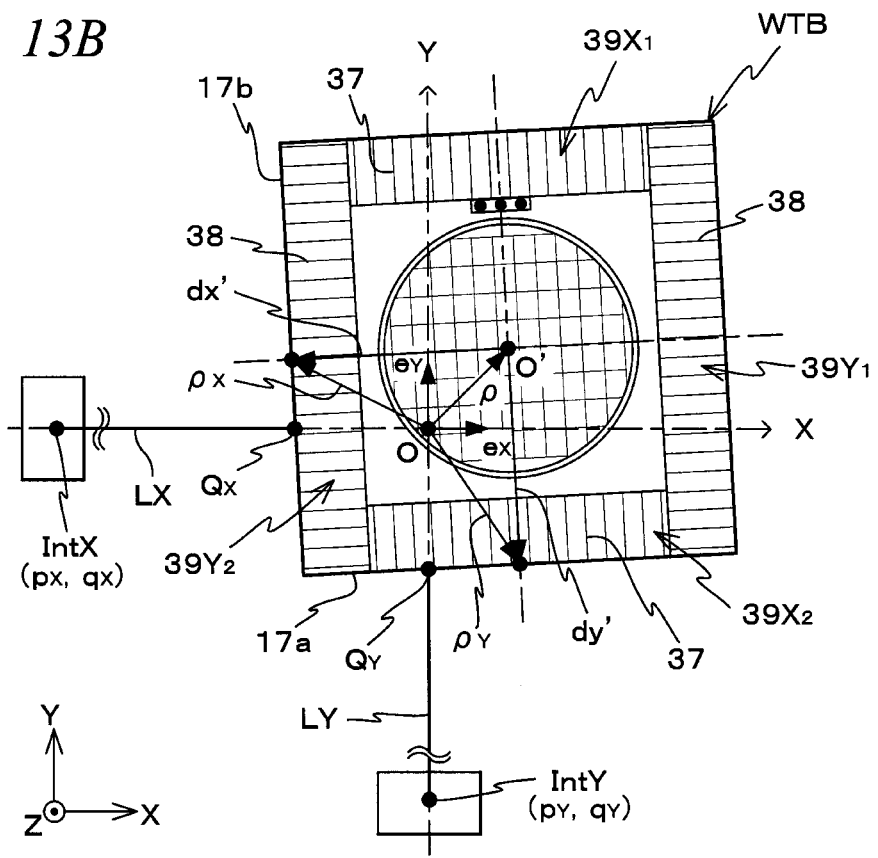

As shown in FIG. 13B, it is assumed that wafer table WTB moves to position O'=(X+py, Y+qx) from the reference state and rotates by θz. In this case, it is assumed that a displacement vector of wafer stage WST is ρ=O'−O−(X, Y)$_r$ and nearest-neighbor vectors from the stage center to reflection surfaces 17b and 17a are dx' and dy'. However, dx' and dy' are expressed as dx'=R(θz)·dx, dy'=R(θz)·dy, with R(θz) serving as a rotation matrix. In this condition, the distance of measurement beams LX and LY to irradiation points $Q_X$ and $Q_Y$, that is, measurement values Lx and Ly of X and Y interferometers IntX and IntY are given by the following formulas (7a) and (7b), respectively.

$$Lx=\rho x \cdot (ex+ey \tan \theta z)-Ox \cdot ex \quad (7a)$$

$$Ly=\rho y \cdot (ey-ex \tan \theta z)-Oy \cdot ey \quad (7b)$$

However, ρx=dx'−ρ, and ρy=dy'−ρ. The unknown variables in simultaneous equations (7a) and (7b) are two, which are X and Y, and are obtained as in the following formulas (8a) and (8b), respectively.

$$X=py+[(Lx+px)\cos \theta z+dx] \cos \theta z-[(Ly+qy)\cos \theta z+dy] \sin \theta z \quad (8a)$$

$$Y=qx+[(Lx+px)\cos \theta z+dx] \sin \theta z+[(Ly+qy)\cos \theta z+dy] \cos \theta z \quad (8b)$$

Accordingly, from measurement results Lx and Ly of X and Y interterometers IntX and IntY, and from rotation angle θz obtained, for example, from Z interferometers 43A and 43B previously described, the position coordinate (X, Y) of wafer stage WST is computed using above formulas (8a) and (8b).

The X interferometer which is used to measure the position coordinate of wafer stage WST is switched by main controller 20, according to the Y position coordinate of wafer stage WST. As shown in FIG. 8, X interferometer 126 is used at the time of exposure. As shown in FIG. 12, X interferometer 127 is used at the time of wafer alignment. Further, at the time of unloading the wafer shown in FIG. 9 and loading the wafer shown in FIG. 10, X interferometer 128 is used. At this point, the X interferometers which are not used to measure the position coordinate are stopped by main controller 20. For example, X interferometers 127 and 128 at the time of the exposure shown in FIG. 8, X interferometers 126 and 128 at the time of wafer alignment shown in FIG. 12, and X interferometers 126 and 127 at the time of loading/unloading of the wafer shown in FIGS. 10 and 9 are stopped, respectively.

At the time of restoration of an X interferometer, initial setting of measurement values is performed by main controller 20 so that the position coordinates of wafer table WTB (wafer stage WST) computed before and after the switching of the X interferometer become continuous. By using measurement value Lx of a first X interferometer, measurement value Ly of Y interferometer 16, and rotation angle θz obtained by the z interferometer before the switching, the position coordinate (X, Y) of wafer stage WST can be obtained from above formulas (8a) and (8b). Main controller 20 substitutes the position coordinate (X, Y) obtained here into formula (7a) to obtain Lx. Because the measurement values of a second X interferometer after the switching also follows formula (7a), main controller 20 initializes Lx that has been obtained as a measurement value of the second X interferometer. After the initialization ends, main controller 20 switches the X interferometer whose measurement values are to be monitored from the first X interferometer to the second X interferometer at a predetermined timing, based on the position coordinate of wafer stage WST.

Next, the measurement principle of an encoder, that is, a relation between the phase difference between two beams $LB_1$ and $LB_2$ which the encoder detects and the displacement of the scale will be explained briefly, with Y encoder 70C described above serving as an example.

As is described earlier, inside photodetection system 64c constituting Y encoder 70C, the polarization directions of two return beams $LB_1$ and $LB_2$ are arranged by the analyzer and the beams interfere with each other to be an interference light. This interference light is detected by photodetector 64c. In this case, when Y scale 39Y$_2$ (i.e. wafer stage WST) is displaced, a phase difference φ between two beams LB$_1$ and LB$_2$ changes, which causes intensity I of the interference light to change as I∝1+cos φ. In this case, the intensity of two beams LB$_1$ and LB$_2$ is to be equal to each other.

Herein, phase difference φ between two beams LB$_1$ and LB$_2$ is obtained as in the following formula (9), as the sum of the phase difference (KΔL) caused by optical path difference ΔL between beams LB$_1$ and LB$_2$ and the difference in phase shift caused by displacements ΔY and ΔZ of beams LB$_1$ and LB$_2$ in the Y-axis direction and the Z-axis direction at Y scale 39Y$_2$.

$$\phi = K\Delta L + 4\pi(n_b - n_a)\Delta Y/p + 2K\Delta Zf(\theta_{a0}, \theta_{a1}, \theta_{b0}, \theta_{b1}) + \phi_0 \quad (9)$$

Figure 14:
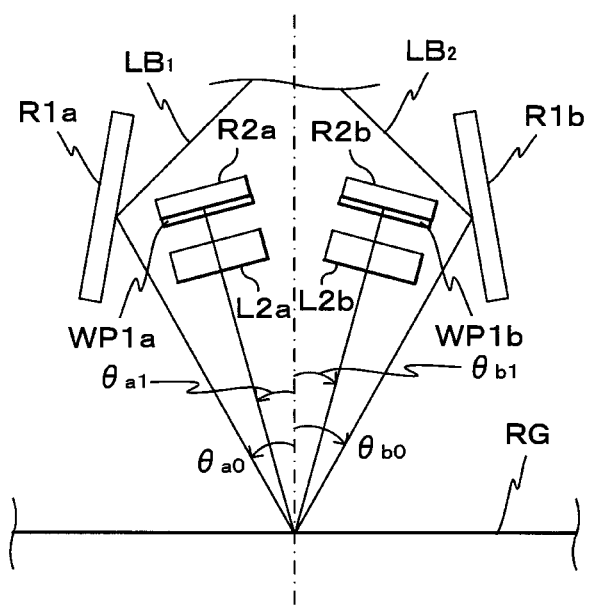
FIG. 14 is a view showing a configuration of an encoder head section and an incident angle of a detection light to a grating and a scattering angle of the detection light.

Herein, the diffraction condition of each of two beams LB$_1$ and LB$_2$ expressed in the following formulas (10) and (11), that is, a relation between an incident angle $\theta_{a0}$ with respect to reflective grating RG and a scattering angle $\theta_{a1}$ of beam LB$_1$, and a relation between an incident angle $\theta_{b0}$ with respect to reflective grating R$^G$ and a scattering angle $\theta_{b1}$ of beam LB$_2$, which are shown in FIG. 14, are applied.

$$\sin \theta_{a1} + \sin \theta_{a0} = n_a \lambda/p \quad (10)$$

$$\sin \theta_{b1} + \sin \theta_{b0} = n_b \lambda/p \quad (11)$$

However, it is assumed that the diffraction orders of beams LB$_1$ and LB$_2$ are "$n_a$" and "$n_b$", the wavelength $\lambda_1 = \lambda_2 = \lambda$, and the pitch of the diffraction grating is "p". Incidentally, the diffraction order is defined as + diffraction for a diffracted light scattered to the +Y direction and − diffraction for a diffracted light scattered to the −Y direction, with the zero order diffracted light of scattering angle $-\theta_{a0}$ or $-\theta_{b0}$ as a reference (refer to FIG. 14). Further, a geometric factor that is determined by the placement of reflection mirrors R1a, R1b, R2a and R2b and the diffraction condition (formulas (10) and (11)) in formula (9), is expressed as in the following formula (12).

$$f(\theta_{a0}, \theta_{a1}, \theta_{b0}, \theta_{b1}) = \cos \theta_{b1} + \cos \theta_{b0} - \cos \theta_{a1} - \cos \theta_{a0} \quad (12)$$

Further, a constant phase term that is determined by other factors (e.g. definition of a reference position of displacements ΔL, ΔY and ΔZ, and the like) is denoted as $\phi_0$. Incidentally, phase difference φ could depend on also the displacement in the X-axis direction in principle, but is not to be considered in this case.

In this case, it is assumed that Y encoder 70C is configured so as to satisfy optical path difference ΔL=0 and a symmetry shown in the following formula (13).

$$\theta_{a0} = \theta_{b0}, \theta_{a1} = \theta_{b1} \quad (13)$$

In such a case, the third term on the right-hand side of formula (9) becomes zero, and at the same time $n_b = -n_a$ (=n) is satisfied, therefore, the following formula (14) can be obtained.

$$\phi_{sym}(\Delta Y) = 2\pi \Delta Y/(p/4n) + \phi_0 \quad (14)$$

From formula (14) above, it can be seen that phase difference $\phi_{sym}$ is not dependent on wavelength λ of beams LB$_1$ and LB$_2$. And, it can be seen that intensity I of the interference light repeats strong and weak intensities each time displacement ΔY is increased or decreased by a measurement unit (also referred to as a measurement pitch) of p/4n. Therefore, the number of times is measured of the strong and weak intensities of the interference light according to displacement ΔY from a reference position that has been set in advance.

Then, a measurement value $C_{\Delta Y}$ of displacement ΔY is computed from a counting value (count value) $c_{\Delta Y}$ as in formula (15) below.

$$C_{\Delta Y} = (p/4n) \times c_{\Delta Y} \quad (15)$$

Furthermore, by splitting a sinusoidal intensity change of the interference light using an interpolation instrument (an interpolator), phase φ' (i.e. a remainder left when $\phi_{sym}$ is divided by 2π) can be measured. In this case, measurement value $C_{\Delta Y}$ of displacement ΔY is computed according to the following formula (16).

$$C_{\Delta Y} = (p/4n) \times \{c_{\Delta Y} + (\phi' - \phi_0)/2\pi\} \quad (16)$$

In this case, constant phase term $\phi_0$ is assumed to be a phase offset (however, $0 \leq \phi_0 < 2\pi$ is defined), and phase $\phi_{sym}(\Delta Y=0)$ at the reference position of displacement ΔY is assumed to be kept.

As is obvious from the description above, when the interpolation instrument is used together, displacement ΔY can be measured with measurement resolution that is less than or equal to a measurement unit (p/4n). In this case, the measurement resolution is decided from a discretization error (which is also called a quantization error) that is determined by a split unit of phase φ', an interpolation error caused by a deviation of the intensity change $I(\Delta Y) = I(\phi_{sym}(\Delta Y))$ of the interference light from an ideal sinusoidal wave due to displacement ΔY, and the like. Incidentally, a discretization unit of displacement ΔY is, for example, one several-hundredth of a measurement unit (p/4n), that is, around 0.1 nm which is sufficiently small, and therefore, measurement value $C_{\Delta Y}$ of the encoder is regarded as continuous quantity unless otherwise indicated.

When wafer stage WST moves in a direction different from the Y-axis direction and a relative displacement occurs between Y head 64 and Y scale 39Y$_2$ in a direction other than the measurement direction, a measurement error occurs in Y encoder 70C. In the description below, a generation mechanism of a measurement error will be considered, based on the measurement principle of the encoder described above.

Figure 15A:
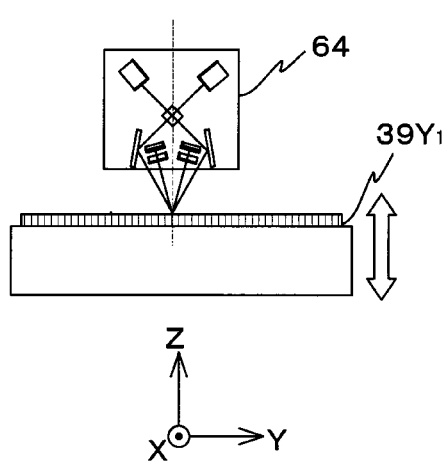
FIG. 15A is a view showing the case where a measurement value does not change even when a relative motion in a non-measurement direction occurs between the head of the encoder and the scale.
Figure 15B:
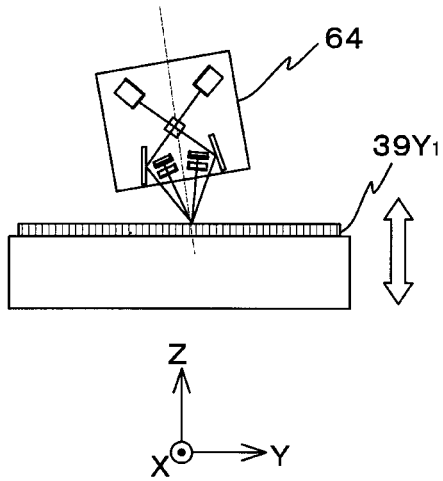
FIG. 15B is a view showing an example of the case where the measurement value changes when the relative motion in the non-measurement direction occurs between the head of the encoder and the scale.

As a simple example, the change of phase difference φ indicated by formula (9) above in the two cases shown in FIGS. 15A and 15B will be considered. In both FIGS. 15A and 15B, wafer stage WST is to maintain its attitude parallel to the XY plane. First of all, in the case of FIG. 15A, the optical axis of head 64 coincides with the Z-axis direction (head 64 is not inclined). Wafer stage WST is assumed to be displaced in the Z-axis direction (ΔZ≠0, ΔY=0). In this case, because there are no changes in optical path difference ΔL, there are no changes in the first term on the right-hand side of formula (9). The second term becomes zero, according to supposition ΔY=0. And, the third term becomes zero because it satisfies the symmetry of formula (13). Accordingly, no change occurs in phase difference φ, and further no intensity change of the interference light occurs. As a result, the count value of the encoder also does not change.

Meanwhile, in the case of FIG. 15B, the optical axis of head 64 is inclined (head 64 is inclined) with respect to the Z-axis. Wafer stage WST is assumed to be displaced in the Z-axis direction from this state (ΔZ≠0, ΔY=0). In this case as well, because there are no changes in optical path difference ΔL, there are no changes in the first term on the right-hand side of formula (9). And, the second term becomes zero, according to supposition ΔY=0. However, because the head is inclined, the symmetry of formula (13) will be lost, and the third term will not become zero and will change in proportion to Z displacement ΔZ. Accordingly, a change occurs in phase difference φ, and as a consequence, the count value changes.

Further, although omitted in the drawings, in the case wafer stage WST is displaced in a direction (the X-axis direction) perpendicular to the measurement direction (the Y-axis direction) and the optical axis direction (the Z-axis direction) ($\Delta X \neq 0$, $\Delta Y=0$, $\Delta Z=0$), the measurement values do not change as long as the direction in which the grid line of diffraction grating RG faces is orthogonal to the measurement direction, however, in the case the direction is not orthogonal, sensitivity occurs with a gain proportional to the angle.

Next, a case will be considered where wafer stage WST rotates (the inclination changes), using FIGS. 16A to 16D. First of all, in FIGS. 16A to 16D, it is assumed that the optical axis of head 64 coincides with the Z-axis direction (head 64 is not inclined).

Figure 16A:
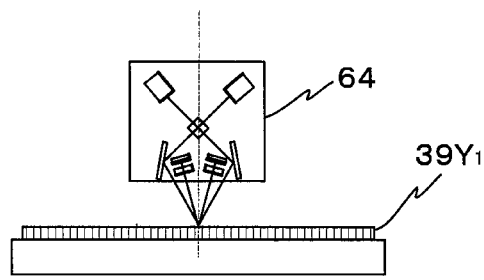
FIGS. 16A to 16D are views used to explain the case where the measurement value of the encoder changes and the case where the measurement value does not change, when the relative motion in the non-measurement direction occurs between the head and the scale.

In a state of FIG. 16A, wafer stage WST is parallel to the XY plane. Even if wafer stage WST is displaced in the +Z direction and moves into a state shown in FIG. 16B from the state of FIG. 16A, the measurement value of the encoder does not change since the case is the same as in FIG. 15A previously described.

Figure 16B:
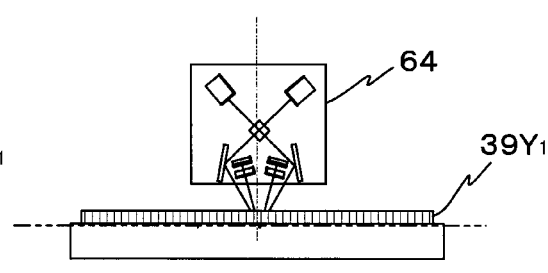
Figure 16C:
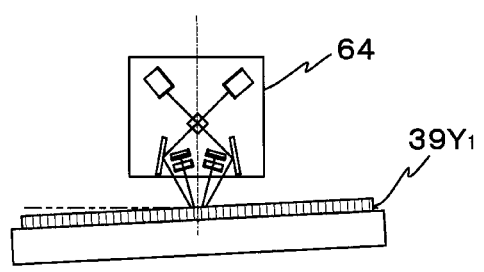

Next, it is assumed that wafer stage WST rotates around the X-axis from the state shown in FIG. 16B and moves into a state shown in FIG. 16C. In this case, although the head and the scale do not perform relative motion, that is, $\Delta Y=\Delta Z=0$, the measurement value of the encoder changes because a change occurs in optical path difference $\Delta L$ due to the rotation of wafer stage WST.

Figure 16D:
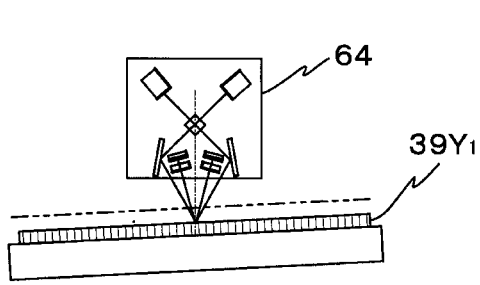

Next, it is assumed that wafer stage WST moves downward from the state shown in FIG. 16C and moves into a state shown in FIG. 16D. In this case, a change in optical path difference $\Delta L$ does not occur because wafer stage WST does not rotate. However, because the symmetry of formula (13) has been lost, phase difference $\phi$ changes by Z displacement $\Delta Z$ through the third term on the right-hand side of formula (9). And due to the change, the measurement value of the encoder changes.

As other generation factors of measurement errors, temperature fluctuation (air fluctuation) of the atmosphere on the beam optical path can be considered. Phase difference $\phi$ between the two return beams $LB_1$ and $LB_2$ depend on optical path difference $\Delta L$ of the two beams, according to the first term on the right-hand side of formula (9). In this case, wavelength $\lambda$ of the light is assumed to change to $\lambda+\Delta\lambda$ by air fluctuation. By minute change $\Delta\lambda$ of this wavelength, the phase difference changes by minute amount $\Delta\phi=2\pi\Delta L\Delta\lambda/\lambda^2$. In this case, assuming that the wavelength of light $\lambda=1$ μm and minute change $\Delta\lambda=1$ nm, then phase change $\Delta\phi=2\pi$ with respect to optical path difference $\Delta L=1$ mm. This phase change is equivalent to 1 when it is converted into a count value of the encoder. Further, when it is converted into displacement, it is equivalent to p/2 ($n_b-n_a$). Accordingly, if $n_b=-n_a=1$, in the case of p=1 μm, a measurement error of 0.25 μm will occur.

In the actual encoder, because the optical path length of the two beams which are made to interfere is extremely short, wavelength change $\Delta\lambda$ due to the air fluctuation is extremely small. Furthermore, optical path difference $\Delta L$ is designed to be approximately zero, in an ideal state where the optical axis is orthogonal to the reflection surface. Therefore, the measurement errors due to the air fluctuation can be substantially ignored. The measurement error is remarkably small when compared with the interferometer, and is superior in short-term stability.

As key factors of measurement errors of the encoder, errors which are caused by an uneven scale surface, mechanical deformation of the diffraction grating and the like can be given. In the case of the scale of the encoder, with the passage of use time and also thermal expansion or the like, the surface is deformed or the pitch of the diffraction grating is changed partially or entirely. Therefore, the encoder has a tendency in which measurement errors grow larger with the passage of use time, and lacks in long-term stability.

Therefore, after having performed pre-processing to correct these main errors beforehand, the encoder is used in position measurement of wafer stage WST which is executed during the actual processing of a lot.

Main controller 20 by all means monitors the measurement values of at least three encoders in total, which are encoders 70A and 70C, and at least one of encoders 70B and 70D (or Y encoders $70E_1$ and $70F_1$, and at least one of encoders 70B and 70D) in the effective stroke range of wafer stage WST, and computes the position coordinate of wafer stage WST. Then, by controlling each motor that configures stage drive system 124 according to the position coordinate which has been calculated, wafer stage WST can be driven with high precision.

Now, a method to compute the position coordinate of wafer stage WST from the measurement values of the three encoders which are monitored will be described, referring to FIGS. 17A and 17B. In this case, for the sake of simplicity, the degrees of freedom of the movement of wafer stage WST will be three (X, Y, and $\theta z$).

Figures 17A, 17B:
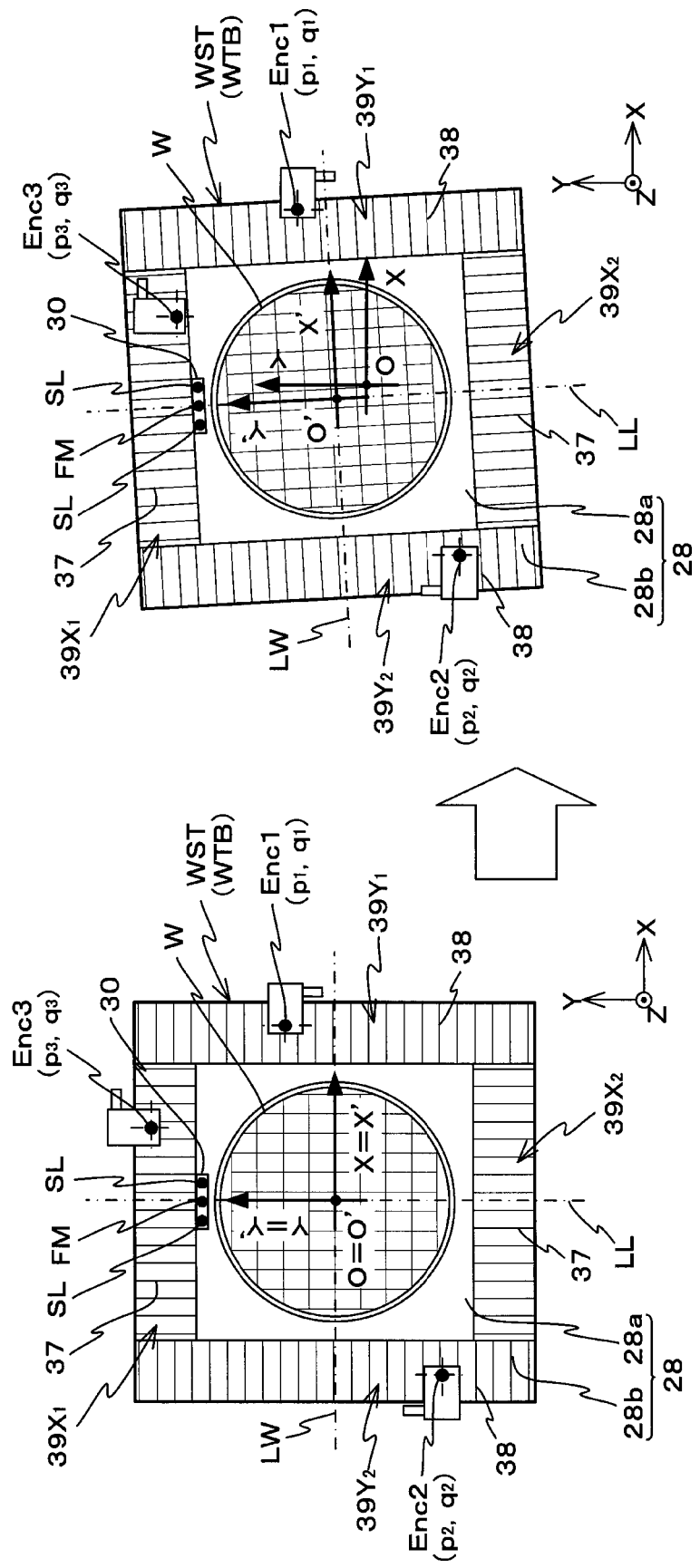
FIGS. 17A to 17B are views used to explain a specific method of converting the measurement value of the encoder to a position of wafer stage WST.

FIG. 17A shows a reference state where wafer stage WST is at the coordinate origin (X, Y, $\theta z$)=(0, 0, 0). From this reference state, wafer stage WST is driven within a range where encoders (Y heads) Enc1 and Enc2 and encoder (X head) Enc3 do not move away from the scanning areas of their opposing scales $39Y_1$ and $39Y_2$ and $39X_1$. The state where wafer stage WST is moved to the position (X, Y, $\theta z$) in the manner described above is shown in FIG. 17B. In this case, the positions (X, Y) of encoders Enc1, Enc2, and Enc3 on the XY coordinate system are to be ($p_1$, $q_1$), ($p_2$, $q_2$), and ($p_3$, $q_3$), respectively.

The X head and the Y head respectively measure the relative distance from central axes LL and LW of wafer stage WST. Accordingly, measurement values $C_X$ and $C_Y$ of the X head and the Y head can be expressed, respectively, as in the following formulas (17a) and (17b)

$$C_X = r' \cdot ex' \tag{17a}$$

$$C_Y = r' \cdot ey' \tag{17b}$$

In this case, ex' and ey' are X' and Y' unit vectors in a relative coordinate system (X', Y', $\theta z'$) set on wafer stage WST, and have a relation as in the following formula (18) with X and Y unit vectors ex and ey in the reference coordinate system (X, Y, $\theta z$).

$$\begin{pmatrix} ex' \\ ey' \end{pmatrix} = \begin{pmatrix} \cos\theta z & \sin\theta z \\ -\sin\theta z & \cos\theta z \end{pmatrix} \begin{pmatrix} ex \\ ey \end{pmatrix} \tag{18}$$

Further, r' is a position vector of the encoder in the relative coordinate system, and r' is given r'=r−(O'−O), using position vector r=(p, q) in the reference coordinate system. Accordingly, formulas (17a) and (17b) can be rewritten as in the next formulas (19a) and (19b), $$C_X = (p-X)\cos\theta z + (q-Y)\sin\theta z \tag{19a}$$

$$C_Y = -(p-X)\sin\theta z + (q-Y)\cos\theta z \tag{19b}$$

Accordingly, when wafer stage WST is located at the coordinate (X, Y, $\theta z$) as shown in FIG. 17B, the measurement values of the three encoders can be expressed theoretically as in the next formulas (20a) to (20c).

$$C_1 = -(p_1-X)\sin\theta z + (q_1-Y)\cos\theta z \quad (20a)$$

$$C_2 = -(p_2-X)\sin\theta z + (q_2-Y)\cos\theta z \quad (20b)$$

$$C_3 = (p_3-X)\cos\theta z + (q_3-Y)\sin\theta z \quad (20c)$$

Incidentally, in the reference state shown in FIG. 17A, according to simultaneous equations (20a) to (20c), then $C_1=q_1$, $C_2=q_2$, and $C_3=p_3$. Accordingly, in the reference state, if the measurement values of three encoders Enc1, Enc2, and Enc3 are initialized to $q_1$, $q_2$, and $p_3$ respectively, then the three encoders will show theoretical values given by formulas (20a) to (20c) with respect to displacement (X, Y, θz) of wafer stage WST from then onward.

In simultaneous equations (20a) to (20c), three formulas are given to the three variables (X, Y, θz). Accordingly, on the contrary, if dependent variables $C_1$, $C_2$, and $C_3$ are given in simultaneous equations (20a) to (20c), variables X, Y, and θz can be obtained. In this case, when approximation sin θz≈θz is applied, or even if an approximation of a higher order is applied, the equations can be solved easily. Accordingly, the position (X, Y, θz) of wafer stage WST can be computed from measurement values $C_1$, $C_2$, and $C_3$ of the encoder.

Figure 18A:
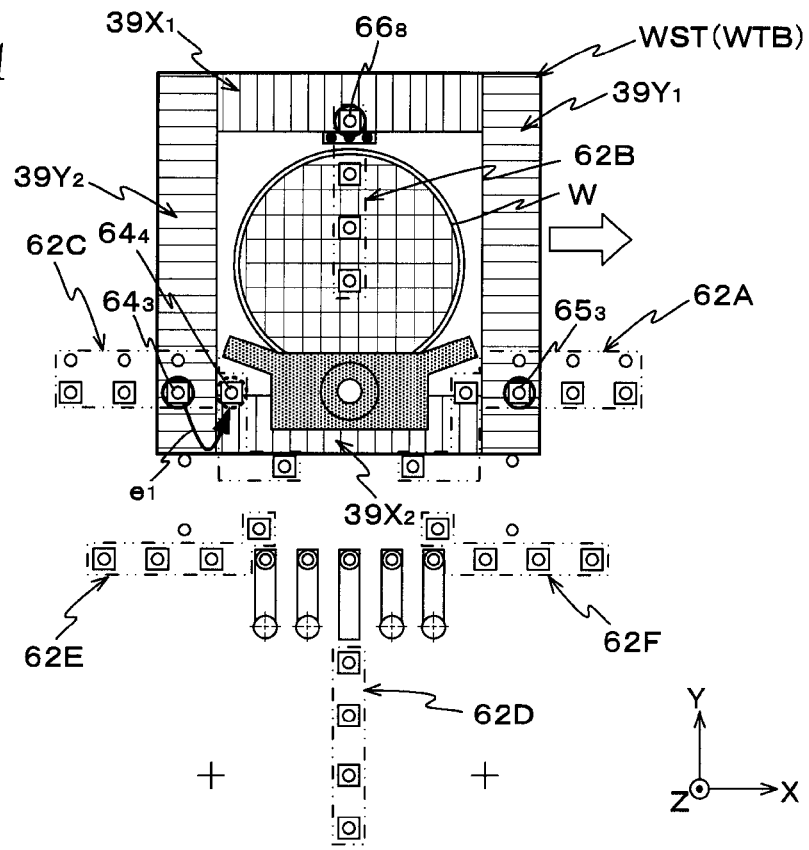
FIGS. 18A and 18B are views used to explain position measurement of a wafer table within an XY plane and switching between the heads that are performed by the encoder configured of a plurality of heads placed in the array arrangement.
Figure 18B:
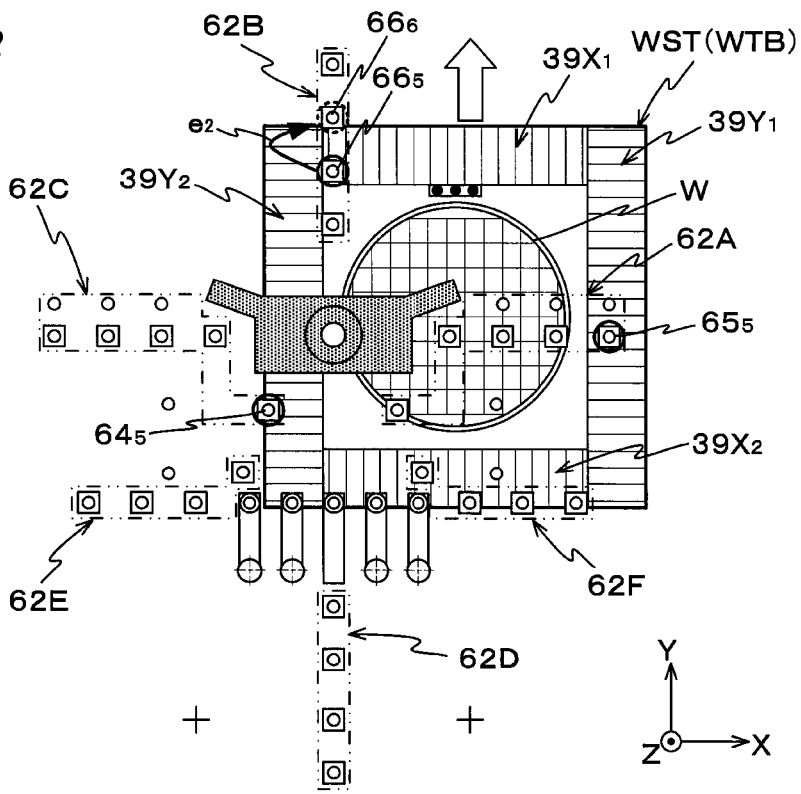

In exposure apparatus 100 of the embodiment, as exemplified in the drawings such as FIGS. 18A and 18B, in the effective stroke range (a range where the stage moves for alignment and exposure operation) of wafer stage WST, the Y scales and the Y heads are placed so that at least one Y head (65, 64, 68 or 67) faces each of Y scales $39Y_1$ and $39Y_2$ without fail. And, the X scales and the X heads are placed so that at least one X head 66 faces at least one of X scale $39X_1$ and $39X_2$. Accordingly, at least three heads are placed to simultaneously face the corresponding X scales or Y scales. Incidentally, in FIGS. 18A and 18B, the heads which face the corresponding X scales and Y scales are indicated circled.

In this case, when main controller 20 drives wafer stage WST in the +X direction as shown by an outlined arrow in FIG. 18A, main controller 20 switches Y head 64, for example, as indicated by an arrow $e_1$ in the drawing, from Y head $64_3$ circled with a solid line to head $64_4$ circled with a dotted line. As is described, Y head 64 is sequentially switched to the next head, according to the movement of wafer stage WST in the X-axis direction. Incidentally, because the encoder detects relative displacement, in order to compute absolute displacement (i.e. the position), a position serving as a reference has to be set. Therefore, on the switching of the heads, the position of a head to operate (to be active) is computed and is initialized as a reference position. The initial setting will be explained in detail later in the description.

Further, in the case main controller 20 drives wafer stage WST in the +Y direction as shown by an outlined arrow in FIG. 18B, main controller 20 switches X head 66, for example, as indicated by an arrow $e_2$ in the drawing, from head $66_5$ circled with a solid line to head $66_6$ circled with a dotted line. As is described, X head 66 is sequentially switched to the next head, according to the movement of wafer stage WST in the Y-axis direction. On this head switching, the position of a head to operate (to be active) is computed and is initialized as a reference position.

The switching procedure of the encoder heads will now be described here, based on FIG. 19A to 19E, with the switching from Y heads $64_3$ to $64_4$ indicated by arrow $e_1$ in FIG. 18A serving as an example.

Figure 19A:
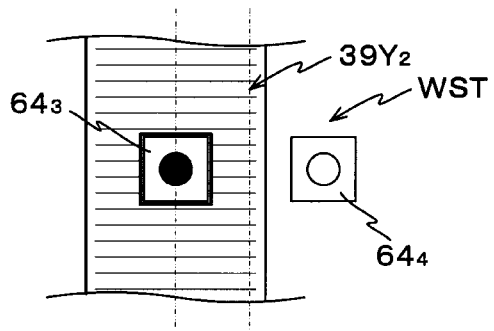
FIGS. 19A to 19E are views used to explain procedures of the encoder switching.

In FIG. 19A, a state before the switching is shown. In this state, Y head $64_3$ facing the scanning area (the area where the diffraction grating is arranged) on Y scale $39Y_2$ is operating, and Y head $64_4$ which has moved away from the scanning area is suspended. In FIGS. 19A to 19E, the operating head is indicated by a solid black circle, and the suspended head is indicated by an outlined circle. Then, main controller 20 monitors the measurement values of Y head $64_3$ which is operating. In FIGS. 19A to 19E, the head whose measurement values are monitored is indicated in a double rectangular frame.

Figure 19B:
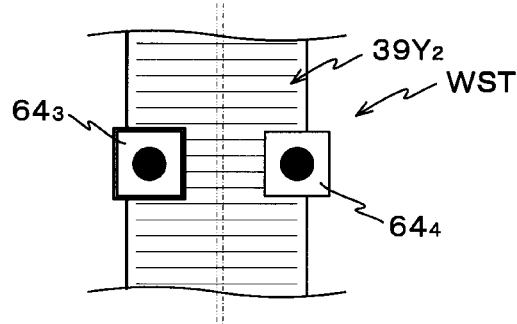

When wafer stage WST moves in the +X direction, Y scale $39Y_2$ is displaced to the right direction. In this case, in the embodiment, as previously described, the distance between the Y heads is set smaller than the effective width (width of the scanning area) of Y scale $39Y_2$ in the X-axis direction. Accordingly, as shown in FIG. 19B, a state occurs where both Y heads $64_3$ and $64_4$ face the scanning area of Y scale $39Y_2$. Therefore, main controller 20 makes sure that Y head $64_4$, which is suspended, has faced the scanning area along with Y head $64_3$ that is operating, and then activates the suspended Y head $64_4$. However, main controller 20 does not yet start monitoring the measurement values of Y head $64_4$ at this point.

Figure 19C:
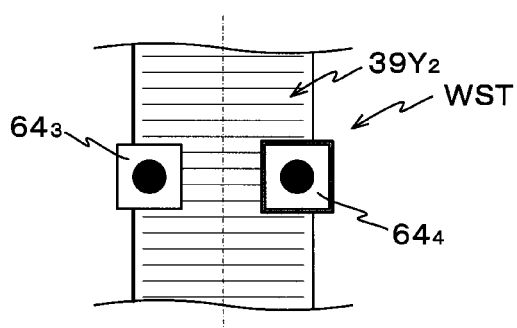

Next, as shown in FIG. 19C, while Y head $64_3$, which will be suspended later faces the scanning area, main controller 20 computes a reference position of Y head $64_4$, which has been restored, from the measurement values of the active encoder heads including Y head $64_3$. Then, main controller 20 sets up the reference position as an initial value of the measurement values of Y head $64_4$. Incidentally, details on the computation of the reference position and the setting of the initial value will be described later.

Figure 19D:
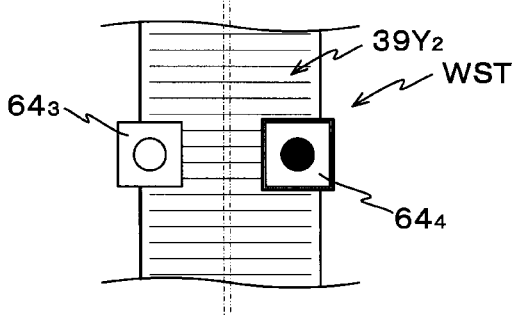
Figure 19E:
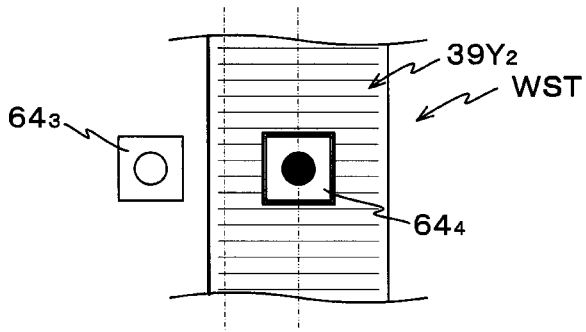

Main controller 20 switches the encoder head whose measurement values are monitored from Y head $64_3$ to Y head $64_4$ simultaneously with the setting of the initial value above. After the switching has ended, main controller 20 suspends the operation of Y head $64_3$ before it moves off from the scanning area as shown in FIG. 19D. By the operation described above, all the operations of switching the encoder heads are completed, and after that, as shown in FIG. 19E, the measurement values of Y head $64_4$ are monitored by main controller 20.

In the embodiment, the distance between adjacent Y heads 65 and the distance between adjacent Y heads 64 that are equipped in head units 62A and 62C respectively are both, for example, 70 mm (with some exceptions), and is set smaller than the effective width (e.g. 76 mm) of the scanning area of Y scales $39Y_1$ and $39Y_2$ in the X-axis direction. Further, similarly, the distance between adjacent X heads 66 that are quipped in head units 62B and 62D respectively is, for example, 70 mm (with some exceptions), and is set smaller than the effective width (e.g. 76 mm) of the scanning area of X scales $39X_1$ and $39X_2$ in the Y-axis direction. Accordingly, the switching of Y heads 65 or 64 and X heads 66 can be performed smoothly as in the description above.

Incidentally, the range in which both adjacent heads face the scale, that is, the moving distance of wafer stage WST from a state shown in FIG. 19B to a state shown in FIG. 19D is, for example, 6 mm. And at the center, that is, at the position of wafer stage WST shown in FIG. 19C, the head whose measurement values are monitored is switched. This switching operation is completed by the time the head which is to be suspended moves off from the scanning area, or more specifically, while wafer stage WST moves in an area having a distance of 3 mm from the state shown in FIG. 19C to the state shown in FIG. 19D. For example, in the case the movement speed of the stage is 1 m/sec, then, the switching operation of the head is to be completed within 3 msec.

Next, the linkage process when the encoder head is switched, that is, the initial setting of the measurement values will be described, focusing mainly on the operation of main controller 20.

In the embodiment, as previously described, in the effective stroke range of wafer stage WST, in order to detect positional information of wafer stage WST within the XY plane, three encoders (the X heads and the Y heads) constantly observe the movement of the stage. Accordingly, when the switching process of the encoder is performed, four encoders Enc1 to Enc4, to which a fourth encoder (a Y head) Enc4 is added, are to observe wafer stage WST as shown in FIG. 20.

Figure 20:
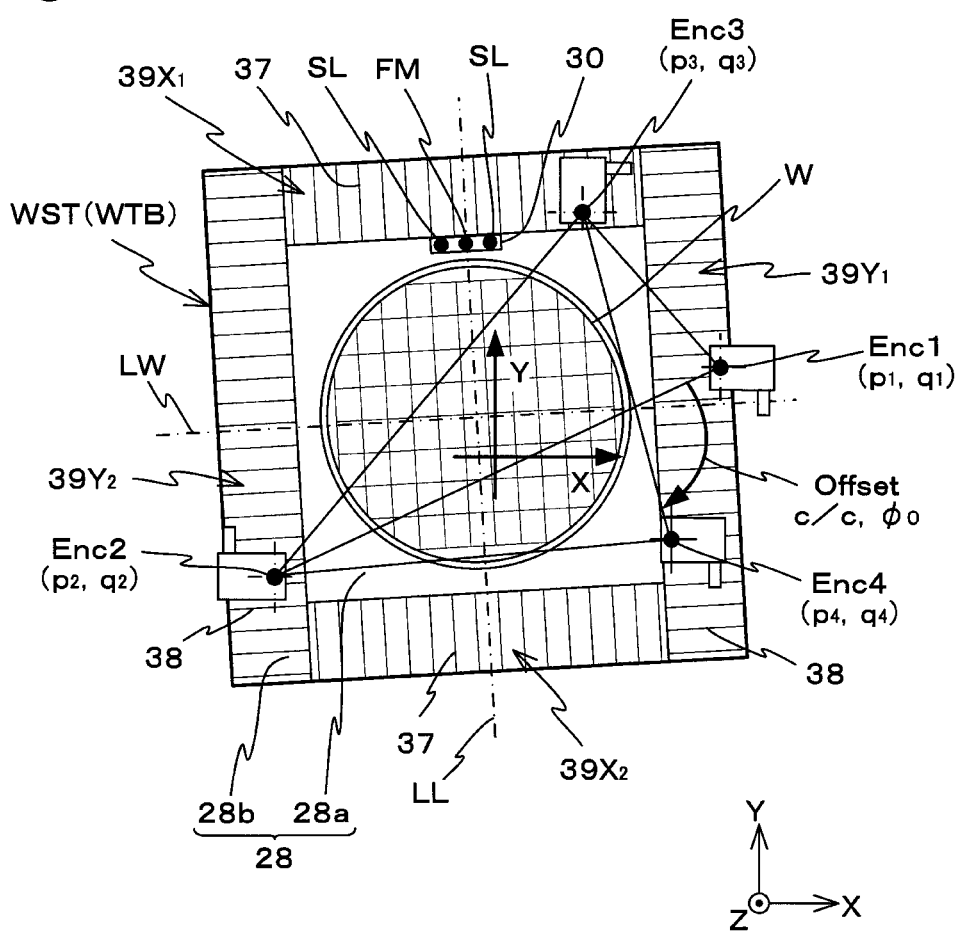
FIG. 20 is a view used to explain a switching process of the encoder that is used for position control of wafer stage WST within the XY plane.

In the switching state of the encoder shown in FIG. 20, encoders Enc1, Enc2, Enc3 and Enc4 are located above scales 39$Y_1$, 39$Y_2$, 39$X_1$, and 39$Y_1$, respectively. When having a look, it looks as though the encoder is going to be switched from encoder Enc1 to encoder Enc4. However, as is obvious from the fact that the position in the Y-axis direction, which is the measurement direction, is different in encoder Enc1 and encoder Enc4, it does not have any meaning even if the measurement values of encoder Enc1 are set without any changes as the initial value of the measurement values of encoder Enc4 at the timing when the switching is performed.

Therefore, in the embodiment, main controller 20 switches position measurement of wafer stage WST from the position measurement by three encoders Enc1, Enc2 and Enc3 to the position measurement by three encoders Enc2, Enc3 and Enc4, as shown in FIG. 20. In this switching method, one head is not switched to another head, but a combination (group) of three heads (encoders) is switched to a combination (group) of another three heads (encoders).

On the switching, first of all, main controller 20 solves simultaneous equations (20a) to (20c) using measurement values $C_1$, $C_2$, and $C_3$ of encoders Enc1, Enc2, and Enc3, and computes a position coordinate (X, Y, θz) of wafer stage WST within the XY plane. Next, by using the position coordinate calculated here, main controller 20 obtains a theoretical value $C_4$ from the following theoretical formula (20d) which the measurement value of encoder (Y head) Enc4 follows.

$$C_4 = -(p_4 - X)\sin\theta z + (q_4 - Y)\cos\theta z \quad (20d)$$

In this case, $p_4$ and $q_4$ are the X setting value and Y setting value of encoder Enc4. Then, theoretical value $C_4$ is set as an initial value of encoder Enc4.

By the linkage process described above, the switching operation of the encoder is completed while maintaining the results (X, Y, θz) of position measurement of wafer stage WST. From then onward, the following simultaneous equations (20b) to (20d) are solved, using the measurement values $C_2$, $C_3$, and $C_4$ of encoders Enc2, Enc3, and Enc4 which are used after the switching, and a position coordinate (X, Y, θz) of wafer stage WST is computed.

$$C_2 = -(p_2 - X)\sin\theta z + (q_2 - Y)\cos\theta z \quad (20b)$$

$$C_3 = (p_3 - X)\cos\theta z + (q_3 - Y)\sin\theta z \quad (20c)$$

$$C_4 = -(p_4 - X)\sin\theta z + (q_4 - Y)\cos\theta z \quad (20d)$$

Incidentally, in the case the fourth encoder is an X head, simultaneous equations (20b), (20c) and (20e), which use the following theoretical formula (20e) instead of theoretical formula (20d), can be used.

$$C_4 = -(p_4 - X)\cos\theta z + (q_4 - Y)\sin\theta z \quad (20e)$$

However, various measurement errors are included in the actual measurement values (raw measurement values) of the encoders. Therefore, main controller 20 shows the value whose error has been corrected as measurement value $C_4$. Accordingly, in the linkage process described above, by using stage position induced error correction information and/or correction information on the grating pitch of the scale (and correction information on the grating deformation) and the like, main controller 20 performs an inverse correction of theoretical value $C_4$ obtained from formula (20d) or formula (20e) and computes raw value C4' before correction, and then sets raw value C4' as the initial value of the measurement value of encoder Enc4.

Now, in the embodiment, the position coordinate of wafer stage WST is controlled by main controller 20 at a time interval of, for example, 96μ sec. At each control sampling interval, a position servocontrol system (a part of main controller 20) updates the current position of wafer stage WST, computes thrust command values and the like for positioning the stage to a target position, and outputs the values. As previously described, the current position of wafer stage WST is computed from the measurement values of the interferometers or the encoders.

Now, as previously described, the interferometer and the encoder measure intensity of the interference light. The measurement values are forwarded to main controller 20. Main controller 20 counts the number of times of intensity change of the interference light (i.e. the number of fringes of the interference light). And from the counting value (count value), the position of wafer stage WST is computed. Accordingly, main controller 20 monitors the measurement values of the interferometer and the encoder at a time interval (measurement sampling interval) much shorter than the control sampling interval so as not to lose track of the fringes.

Therefore, in the embodiment, main controller 20 constantly continues to receive the measurement values by a discharge from all the encoders (not always three) that face the scanning area of the scales, while wafer stage WST is within the effective stroke range. And, main controller 20 performs the switching operation of the encoders (the linkage operation between a plurality of encoders) described above in synchronization with position control of wafer stage WST which is performed at each control sampling interval. In such an arrangement, an electrically high-speed switching operation of the encoders will not be required, which also means that costly hardware to realize such a high-speed switching operation does not necessarily have to be arranged.

Figure 21:
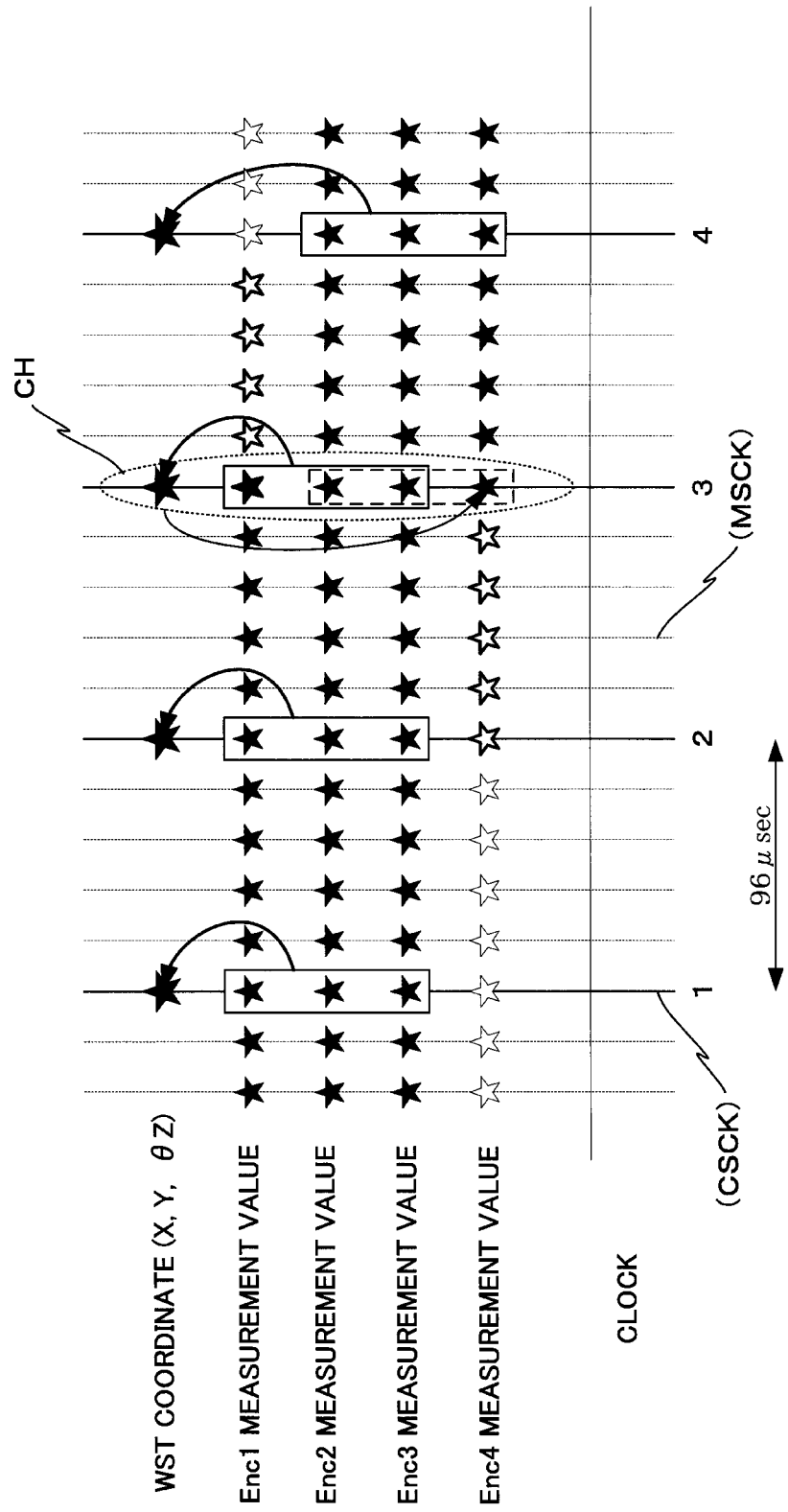
FIG. 21 is a view conceptually showing position control of wafer stage WST, loading of the measurement values of the encoders, and timing of the encoder switching.

FIG. 21 conceptually shows the timing of position control of wafer stage WST, the loading of the measurement values of the encoder, and the switching of the encoder in the embodiment. Reference code CSCK in the drawing indicates the generation timing of a sampling clock (a control clock) of the position control of wafer stage WST, and reference code MSCK indicates a generation timing of a sampling clock (a measurement clock) of the measurement of the encoder (and interferometer). Further, reference code CH typically shows the switching (linkage) process of the encoder described in detail in FIGS. 19A to 19E.

Main controller 20 executes the switching of the encoder (head) by dividing the operation into two stages; the restoration of the encoder and the linkage process. When describing the switching according to an example shown in FIG. 21, first of all, the encoders which are operating at the time of the first control clock are to be the three encoders of the first combination, Enc1, Enc2 and Enc3. Main controller 20 monitors the measurement values of these encoders, and computes the position coordinate (X, Y, θz) of wafer stage WST. Next, according to the position coordinate of wafer stage WST, main controller 20 confirms all the encoders which are above the scanning area of the X scales and the Y scales. And, main controller 20 specifies encoder Enc4 which needs restoration from among the encoders, and restores the encoder at the time of the second control clock. At this point in the process, the number of operating encoders becomes 4. And, from among the operating encoders, main controller 20 specifies the encoder whose measurement values are to be monitored to compute the position coordinate of wafer stage WST at the time of the next control clock, according to the position coordinate of wafer stage WST. Tt is assumed that the second combination Enc2, Enc3 and Enc4 are specified here. Main controller 20 confirms whether this specified combination matches the combination that was used to compute the position coordinate of wafer stage WST at the time of the previous control clock. In this example, encoder Enc1 in the first combination and encoder Enc4 in the second combination are different. Therefore, a linkage process CH to the second combination is performed at the time of the third control clock. Hereinafter, main controller 20 monitors the measurement values of the second combination Enc2, Enc3 and Enc4, and computes the position coordinate (X, Y, θz) of wafer stage WST. As a matter of course, linkage process CH is not executed if there is no change in the combination. Encoder Enc1, which is removed from the monitoring subject, is suspended at the time of the fourth control clock when encoder Enc1 moves off from the scanning area on the scale.

Main controller 20 performs scheduling of the encoder switching process for each shot map (exposure map), and stores the results in a memory 34. Accordingly, if there is no retry (redoing) then the contents of the schedule in every shot map becomes constant. However, in actuality practice, because a retry must be considered, it is preferable for main controller 20 to constantly update the schedule slightly ahead while performing the exposure operation.

Incidentally, so far, in order to describe the principle of the switching method of the encoder to be used in position control of wafer stage WST in the embodiment, four encoders (heads) Enc1, Enc2, Enc3 and Enc4 were taken up, however, encoders Enc1 and Enc2 representatively show any of the following Y heads 65 and 64 of head units 62A and 62C and Y beads 67 and 68 of head units 62E and 62F, encoder Enc3 representatively shows X head 66 of head units 62B and 62D, and encoder Enc4 representatively show any of the following Y heads 65, 64, 67, and 68 or X head 66.

By the measurement beam being at least partially blocked by a foreign material adhering on the scale surface (which makes it possible to detect the foreign material, and therefore, it can also be expressed as "by detecting a foreign material") and the like, abnormality may occur in the measurement results of the encoder. In this case, the measurement beam of the encoder has, for example, a spread of 2 mm in the measurement direction and 50 μm in the grid line direction on the scale surface (the grating surface of reflective grating). Accordingly, even a small foreign material can be detected. Furthermore, in a practical point of view, it is extremely difficult to completely prevent foreign materials from entering the device and from adhering on the scale surface for over a long period. A situation where a head of an encoder malfunctions and the output from the encoder cannot be obtained in a certain section can be considered. Therefore, when abnormality is detected in the measurement result of the encoder, a backup operation such as to switch the measurement to a measurement by interferometer system 118, or to correct the measurement result of the encoder using the measurement result of interferometer system 118 becomes necessary.

In the case of the liquid immersion type exposure apparatus employed in the embodiment, water droplets may remain on the scale surface. For example, the liquid immersion area frequently passes over scale 39$X_1$ which is adjacent to measurement stage MST at the time of the scrum state. Further, as for the other scales as well, at the time of edge shot exposure, the liquid immersion area enters a part of an area on the scale. Accordingly, the water droplets that cannot be recovered and are left on the scale may be a source which generates abnormality in the measurement results of the encoder. In this case, when the measurement beam of the encoder scans water droplets on the scale, the measurement beam is blocked by the water droplets, which reduces the beam intensity, and furthermore, the output signals are cut off in the worst case. Further, because the measurement beam scans materials of a different refractive index, linearity of the measurement results with respect to the displacement may deteriorate. On the basis of such various influences, main controller 20 has to determine the occurrence of abnormality in the measurement results.

The abnormality of the measurement results of the encoder can be determined from sudden temporal change of the measurement results, or from deviation or the like of the measurement results of the encoder from the measurement results of interferometer system 118. First of all, in the former case, when the position coordinates of wafer stage WST obtained at every measurement sampling interval using the encoders change so much from the position coordinates obtained at the time of the previous sampling that it cannot be possible when taking into consideration the actual drive speed of the stage, main controller 20 judges that abnormality has occurred. As for the latter case, in the embodiment, position measurement using interferometer system 118 is performed in the whole stroke areas independently from the position measurement of wafer stage WST using the encoder. Therefore, if the deviation of the position coordinates of wafer stage WST obtained using the encoder from the position coordinates obtained using interferometer system 118 exceeds a permissible range set in advance, main controller 20 judges that abnormality has occurred.

When abnormality is detected in the measuring instrument system, such as the output signal of encoders 70A to 70F (refer to FIG. 6) being cut off, in order to prevent the servocontrol of drive (hereinafter, shortly referred to as "servocontrol") of wafer stage WST from stopping, main controller 20 immediately executes a backup process for switching the servocontrol of wafer stage WST to the servocontrol by interferometer system 118 (refer to FIG. 6). More specifically, main controller 20 switches the measuring instrument system used to compute the position coordinates of wafer stage WST (wafer table WTB) from encoder system 150 (encoders 70A to 70F) to interferometer system 118. On this operation, the linkage process is executed so that the position coordinates of wafer stage WST that have been computed are successive.

Figure 22:
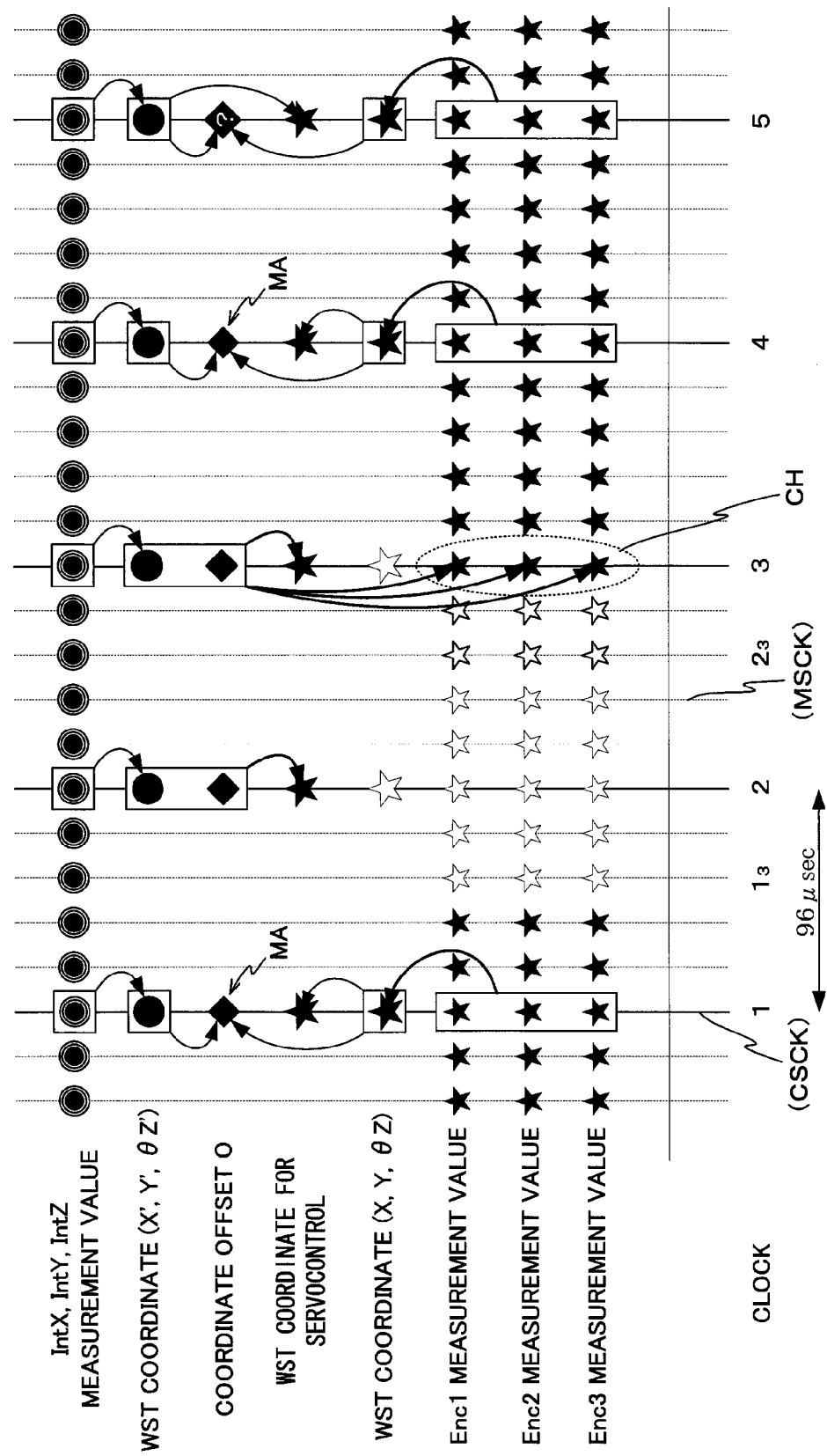
FIG. 22 is a view showing an outline of a linkage process in a switching from servocontrol of the wafer stage by the encoder system to the servocontrol by the interferometer system (and a reversed switching)

FIG. 22 shows an outline of the linkage process in the switching from servocontrol of wafer stage WST by encoder system 150 to servocontrol of wafer stage WST by interferometer system 118 (and switching from servocontrol of wafer stage WST by interferometer system 118 to servocontrol of wafer stage WST by encoder system 150). As shown in this FIG. 22, first of all, main controller 20 performs pre-processing for linkage process with respect to each control clock (CSCK). In this case, at the time of measurement clock (MSCK), as shown by a black figure, the output signals of both encoder system 150 and interferometer system 118 are constantly monitored. Incidentally, in actuality practice, the measurement clock of interferometer system 118 occurs more frequently than the measurement clock of encoder system 150, however, in this case, in order to avoid complication, only the measurement clock which occurs simultaneously is shown. And, at the time of the control clock, main controller 20 computes the position coordinate (X, Y, Oz) of wafer stage WST from the measurement results of encoder system 150 (Enc1, Enc2, Enc3) as in the first control clock in FIG. 22, and also computes the position coordinate (X', Y', θz') of wafer stage WST from the measurement results of interferometer system 118 (IntX, IntY, IntZ). At the same time, the difference between the position coordinate (X, Y, Oz) and the position coordinate (X', Y', θz') is obtained. Furthermore, moving average $MA_K \{(X, Y, \theta z)-(X', Y', \theta z')\}$ of this difference is taken for a predetermined number of the clocks, and is kept as a coordinate offset O. However, in FIG. 22, the computation of the moving average of the difference is briefly shown as reference code MA.

As is previously described, this coordinate offset O can also be used as an index to judge abnormality occurrence in the measurement results of encoder system 150. An absolute value of coordinate offset O is equal to or under a permissible value determined beforehand, main controller 20 judges that no abnormality has occurred, and it the absolute value exceeds the permissible value, then main controller 20 judges that abnormality has occurred. At the time of the first control clock in FIG. 22, main controller 20 judges that no abnormality has occurred, therefore, uses the position coordinate (X, Y, θz) of wafer stage WST computed from the measurement results of encoder system 150 as the position coordinate used for the servocontrol of wafer stage WST.

When detecting the abnormality of the output signals of encoder system 150, main controller 20 promptly executes the linkage process to interferometer system 118. For example, at the time of the $1_3$ clock in FIG. 22, as shown by an outlined figure in FIG. 22, it is assumed that the output signals of Enc1, Enc2, and Enc3 are cut off. In this case, main controller 20 adds coordinate offset O kept at the time of the first control clock just before to the position coordinate (X', Y', θz') of wafer stage WST computed from the measurement results of interferometer system 118 at the time of the second control clock, so that the position coordinate coincides with the position coordinate (X, Y, θz) of wafer stage WST computed from the measurement results of encoder system 150 at the time of the control clock just before (in this case, at the time of the first control clock). Then, until the recovery of the output signal is detected, main controller 20 performs servocontrol of wafer stage WST using the position coordinate $\{(X', Y', \theta z')+O\}$ to which this offset correction has been performed.

Incidentally, FIG. 22 shows the case where all the output signals of three encoders Enc1, Enc2, and Enc3 are cut off at the time of the $1_3$ clock. However, as well as the three output signals, in the case any one or two output signals are cut off, main controller 20 performs a similar switching of servocontrol of wafer stage WST, because the position coordinate of wafer stage WST cannot be computed using simultaneous equations (20a) to (20c) previously described when the output signals supplied becomes two or less.

And, on detecting the recovery of the output signals of encoder system 150, main controller 20 promptly executes the reverse linkage process from interferometer system 118 to encoder system 150. In this case, it is assumed that the output signals of encoders Enc1, Enc2, and Enc3 are restored at the time of the $2_3$ clock in FIG. 22. At the time of the third control clock after having detected the restoration, main controller 20 substitutes the position coordinate [(X', Y', θz')+O] supplied from interferometer system 118 to which the offset correction has been performed into simultaneous equations (20a) to (20c) and computes the measurement values that each encoders Enc1, Enc2, and Enc3 is to show, and performs initial setting. In FIG. 22, this reverse linkage process is shown by reference code CH. Incidentally, in this case, phase linkage method can be applied. From the next fourth control clock onward, similar to the time of the first control clock, main controller 20 executes the usual servocontrol by encoder system 150. At the same time, main controller 20 begins to update the coordinate offset again.

Not only in the case when the output signals from the encoder is cut off as is described above, main controller 20 executes a similar switching of servocontrol of wafer stage WST also in the case when the reliability of the output signals is low. In this case, the reliability of the output signals is verified by using the coordinate offset previously described as an index. The fifth control clock in FIG. 22 shows a state when the reliability was judged to be less than a permissible level and the position coordinate (X', Y', θz') of wafer stage WST computed from the measurement results of interferometer system 118 is used as the position coordinate used in servocontrol. Incidentally, because the coordinate offset at this point in time cannot be relied on, this coordinate offset cannot be used for offset correction, Therefore, the coordinate offsets of a predetermined number of the recent clocks are stored out of the coordinate offsets that have been obtained previously, and the correction may be performed using the latest coordinate offset whose reliability is fully ensured. And, in the case the reliability is sufficiently restored, the position coordinate (X, Y, θz) of wafer stage WST computed from the measurement results of encoder system 150 is used as the position coordinate used in servocontrol, similar to the time of the first and fourth clock.

When abnormality occurs in encoder system 150, main controller 20 selects a suitable processing method according to the occurrence timing. As a processing method that can be performed frequently, the following three methods are prepared. First of all, (a) an alert of abnormality occurrence is issued to a user, and by automatic operation, the control of wafer stage WST is switched to servocontrol of wafer stage WST by interferometer system 118. (b) An alert is issued to a user, and requests the user to judge whether to continue the process believing that the backup operation has functioned normally; switch the control of wafer stage WST from servocontrol of wafer stage WST by interferometer system 118 to servocontrol of wafer stage ST by encoder system 150 and also perform the alignment measurement all over again; or to cancel the process. (c) The automatic switching of servocontrol of wafer stage WST is executed without issuing an alert. Method (a) is desirably applied at the time of exposure, whereas method (b) is desirably applied at the time of alignment.

Next, hybrid stage control by encoder system 150 and interferometer system 118, which is employed in exposure apparatus 100 of the embodiment, will be described.

Because the influence of air fluctuation on the encoder is extremely small compared with the interferometer, drive control of wafer stage WST can be performed with high precision by using encoder system 150 (encoders 70A to 70F, refer to FIG. 6). As is described above, however, when a foreign material such as water droplets, dust, flaw or the like adheres on the scale surface and the measurement beam scans the foreign material, the inconvenience occurs that the output signal from the encoder (head) is cut off, or the abnormal signal is output. Accordingly, when abnormality occurs in the output signals from encoders 70A to 70F, means for avoiding abnormal operation of the stage control becomes necessary.

As one of the means, in the embodiment, a method of switching the stage control to the control using another sensor system like the backup control by interferometer system 118 (refer to FIG. 6) described previously is employed. However, in order to verify the reliability of the output signals of encoder system 150 (encoders 70A to 70C), the output signals have to be monitored over a certain amount of time. For the sake of the stage control, the output signals at the time of generation of the control sampling clocks (control clocks) of a predetermined number of times need to be monitored. Therefore, the time delay occurs from when abnormality actually occurs in the output signals of encoders 70A to 70F until when main controller 20 detects the abnormality.

Now, as a simple example of abnormality occurrence, the time interval in which the output signal is cut off in the case a measurement beam of the encoder scans a foreign material adhering on the surface of the scale will be considered. It is assumed that the measurement beam of the encoder (head) scans a foreign material (e.g. water) while wafer stage WST is moving at the speed of 1 m/sec. Spread of the water is assumed to be sufficiently larger than spread (in this case, which is to be 1 mm as an example) of the measurement beam of the head. In this case, the time required until the measurement beam is completely blocked by the water will be 1 msec. That is, the output signal of the encoder will completely disappear in the time interval of 1 msec.

Meanwhile, the time (delay time) required from when abnormality of the output signal occurs until when main controller 20 actually detects the abnormality will be 0.5 msec, since the generation interval of the control clocks is around 100 μsec in the embodiment, in the case the number of the control clocks at which the output signals are monitored is, for example, 5. This delay time 0.5 msec is not short enough to be ignored compared with the disappearance time 1 msec obtained above of the output signal at the time of abnormality occurrence. Accordingly, when the abnormality of the output signal of encoder system 150 (encoders 70A to 70F) is detected, it is difficult to switch the stage control to the control using another sensor system without deteriorating the accuracy, especially in the case wafer stage WST is driven at a high speed.

From the consideration so far, as substitute means for encoder system 150, a stable sensor system is preferably used, whose output signals have moderate temporal change at the time of abnormality occurrence or which does not generate abnormal operation along with considerable temporal change of the output signals. In this viewpoint, it is encouraging to use interferometer system 118, but as is described previously, the interferometer is much affected by air fluctuation, and is inferior to encoders 70A to 70F of encoder system 150 in terms of accuracy of the stage Control. Therefore, servocontrol of wafer stage WST by a hybrid method is promising, in which interferometer system 118 is used as a main sensor system for performing stable servocontrol of water stage WST and encoder system 150 is also used together as a sub sensor system for covering the accuracy of servocontrol of wafer stage WST. For such a reason, two substitute methods below are employed in the embodiment.

[First Substitute Method]

In the first substitute method, main controller 20 uses the position coordinate of wafer stage WST that is computed from the sum of the position coordinate (X', Y', θz') of wafer stage WST computed from the output signals of interferometer system 118 and coordinate offset O=MA$_K${(X, Y, θz)−(X', Y', θz')} described previously, for drive control of wafer stage WST. In this case, (X, Y, θz) means the position coordinate of wafer stage WST computed by the output signals of encoder system 150 (i.e. encoders 70A to 70F), and MA$_K$ means the moving average of a predetermined number of clocks K.

In the first substitute method, main controller 20 verifies the reliability of the output signals of encoder system 150 using coordinate offset O, similarly to the backup process by interferometer system 118 described earlier. In the case of confirming that the output signals are normal, main controller 20 takes the sum of coordinate offset O after the verification and the position coordinate (X', Y', θz') of wafer stage WST computed from the output signals of interferometer system 118, and uses the sum for drive control of wafer stage WST. Incidentally, in the case the moving average of coordinate offset O is not performed, if (X', Y', θz') and "O" that have been obtained at the same time t are used, the position coordinate (X, Y, θz) of wafer stage WST computed from the output signals of encoder system 70A to 70F at the time t will simply be used.

Meanwhile, in the case of detecting abnormality of the output signals, main controller 20 does not use coordinate offset O in which the abnormality has been detected, but uses the sum of coordinate offset O which has been determined to be normal at the time of previous verification and the position coordinate (X', Y', θz') of wafer stage WST computed from the output signals of interferometer system 118, or the position coordinate (X', Y', θz') of wafer stage WST computed from the output signals of interferometer system 118, for servocontrol of wafer stage WST.

Figure 23:
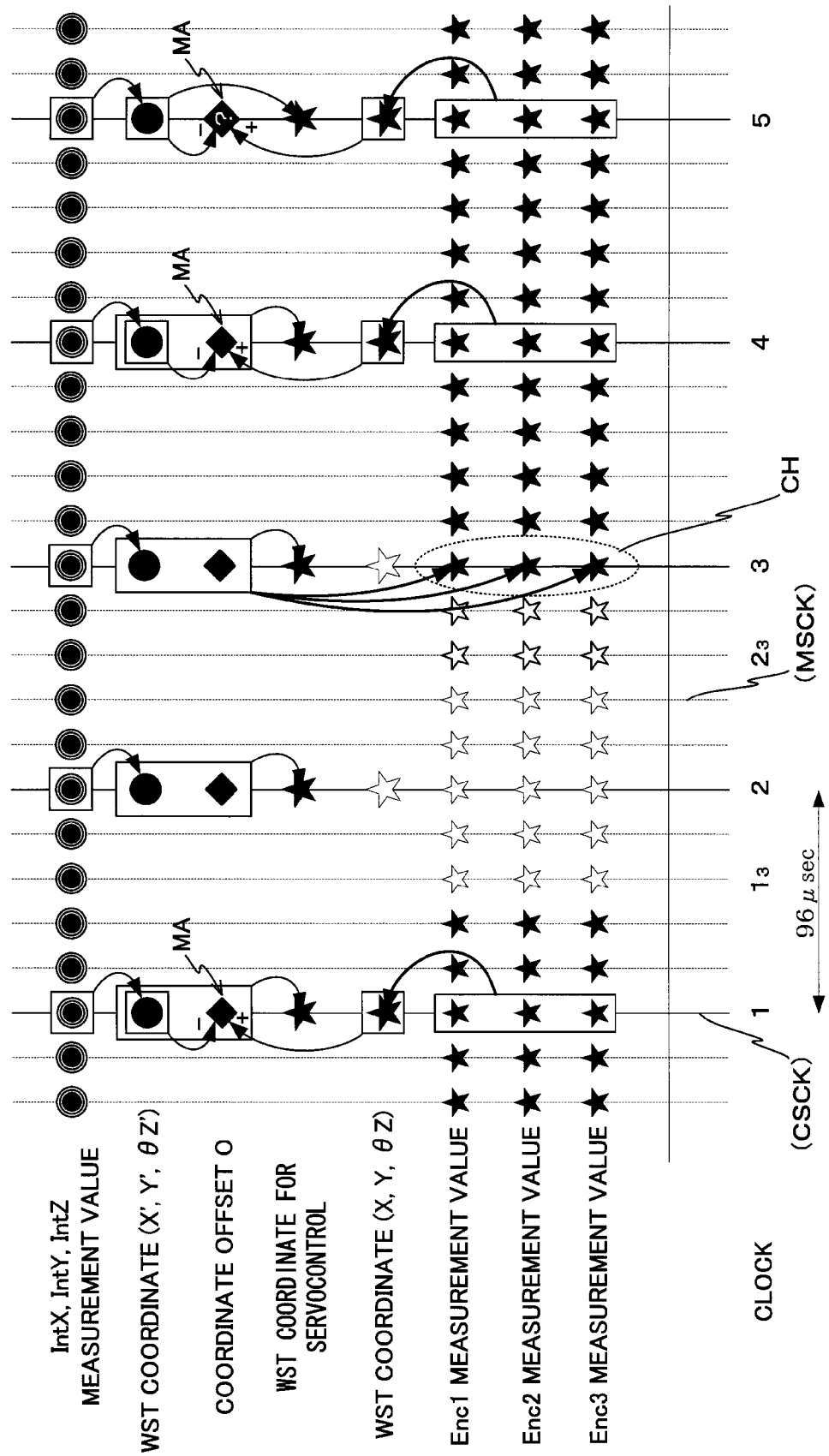
FIG. 23 is a view showing an outline of a linkage process in servocontrol by a hybrid method of the water stage that uses the interferometer system as a main sensor system and the encoder system as a sub-sensor system.

FIG. 23 shows an outline of servocontrol by a hybrid method of wafer stage WST using interferometer system 118 and encoder system 150 in the first substitute method. Incidentally, the notation of FIG. 23 is the same as FIG. 22 described previously. As can be seen when comparing FIGS. 22 and 23, the procedure of the linkage process and the like at the time of abnormality occurrence is completely the same as the backup process by interferometer system 118 described previously, except that as the position coordinate for servocontrol of wafer stage WST that is used at the normal time, the position coordinate (X, Y, θz) obtained from the measurement results of encoder system 150 (Enc1, Enc2, Enc3) is replaced with the sum of the position coordinate (X', Y', θz') obtained from the measurement results of interferometer system 118 (IntX, IntY, IntZ) and coordinate offset O. Accordingly, the detailed explanation about FIG. 23 is omitted here.

In the first substitute method, at the time of stable operation without sudden change of the output signals, the sum of the position coordinate (X', Y', θz') of wafer stage WST computed from the output signals of interferometer system 118 and coordinate offset C is substantially equal to the position coordinate (X, Y, θz) of water stage WST computed from the output signals of encoder system 150. Accordingly, at the time of stable operation, high-precision stage control, which has nearly the same level as the stage control based on the output signals of encoder system 150, can be performed.

Incidentally, in the first substitute method, update of coordinate offset O is delayed in some cases, in order to verity the output signals of encoder system 150. Further, due to performing the moving average of coordinate offset O, the influence of an air fluctuation component of interferometer system 118 that occurs in a time scale shorter than the average time (the product of the average number of times and the control clock time interval) cannot be sufficiently corrected, which could causes occurrence of control error.

[Second Substitute Method]

In the second substitute method, main controller 20 uses the position coordinate (X', Y', θz') of wafer stage WST computed from the output signals of interferometer system 118, for drive control of wafer stage WST. In this case, the influence of air fluctuation of interferometer system 118 gives the limit to the control accuracy of wafer stage WST. Therefore, in order to further increase the control accuracy of wafer stage WST by using encoder system 150 (encoders 70A to 70F) together, the process described below is executed.

(a) Process at the time of static alignment measurement (FIA measurement); in the alignment measurement (FIA measurement) using alignment systems AL1 and $AL2_1$ to $AL2_4$, by adding an actual positional deviation (to be more precise, an averaged value thereof) from a target position of wafer stage WST to the measurement result, the measurement error is prevented from occurring even in the case the control accuracy of wafer stage WST is insufficient. Therefore, if the positional deviation of wafer stage WST is measured using encoder system 150, the FIA measurement that is not affected by the measurement error of interferometer system 118 can be performed. In this case, because wafer stage WST is static at the time of the FIA measurement, a measurement beam from the head of the encoder does not scan a foreign material, and thus abnormality does not occur in the output signals of encoder system 150. Accordingly, high precision drive control of wafer stage WST, which has the same level as the servocontrol of wafer stage WST by encoder system 150 at the time of stable operation, can be performed.

(b) Process at the time of scanning alignment measurement (AIS measurement); in the AIS measurement in which an aerial image of a subject mark is picked up during constant speed scan of wafer table WTB, using an aerial image measuring device 45, in order to correct the speed deviation of wafer stage WST from a predetermined speed during the measurement, the position coordinate of wafer stage WST at the time of control sampling clock generation of a predetermined number of times is used. Accordingly, also in this case, similarly to the case of the FIA measurement, the speed deviation may be obtained and corrected, using positional information of wafer stage WST obtained from the output signals of encoder system 150. In this case, a measurement beam of the encoder (head) could scan a foreign material because wafer stage WST is moving. However, encoder system 150 is not used for servocontrol of wafer stage WST, and therefore delay in servocontrol of wafer stage WST due to verification of the output signals does not occur. However, verification of the output signals for error correction of the AIS measurement is necessary.

(c) Process at the time of exposure; in exposure apparatus 100 of the embodiment, synchronous drive control in which reticle stage RST is driven and controlled so as to follow up wafer stage WST allows the sufficient accuracy of overlay and image-forming of transferred patterns to be secured. In such a synchronous drive method, even when control error of wafer stage WST occurs, as long as the follow-up function of reticle stage RST is good enough, the accuracy of overlay and image-forming of transferred patterns is not affected by the control error. Therefore, as a target value of a position used in follow-up control of reticle stage RST, the position coordinate of wafer stage WST obtained from the output signals of encoder system 150 is used.

Figure 24:
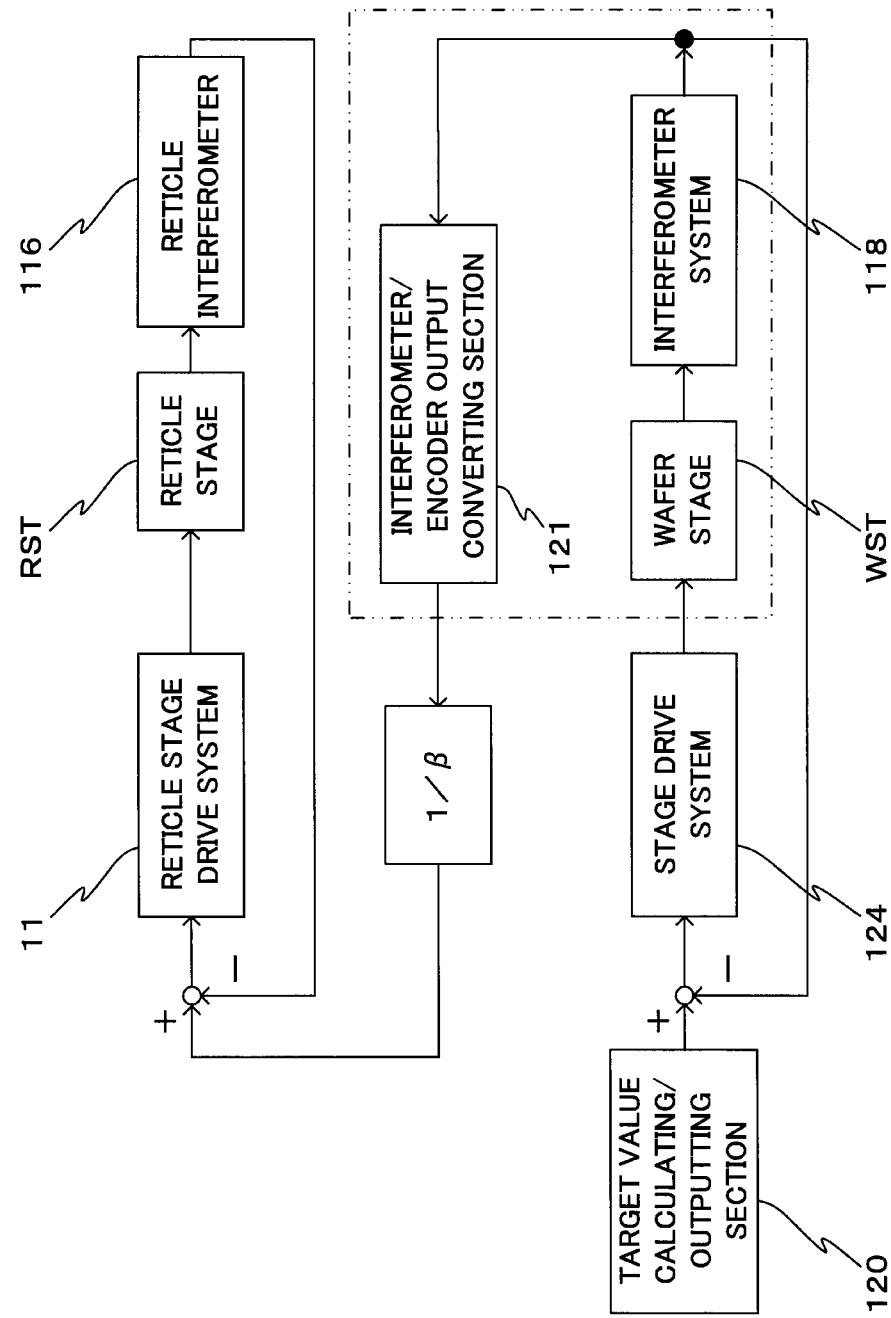
FIG. 24 is a block diagram showing an outline of synchronous drive control of a reticle stage and the wafer stage by a hybrid method that uses both the interferometer system and the encoder system in combination.

FIG. 24 shows a block diagram typically showing a configuration of a synchronous drive control system of reticle stage RST and wafer stage WST using interferometer system 118 and encoder system 150 in combination. In FIG. 24, a target value calculating/outputting section 120 outputs a target value of the position of wafer stage WST to stage drive system 124. According to the difference between the target value of the position and an actual measurement value from interferometer system 118, stage drive system 124 drives wafer stage WST. The actual measurement value from interferometer system 118 is converted by an interferometer/encoder output converting section 121 into an actual measurement value of encoder system 150 (encoders 70A to 70F), and furthermore is multiplied by projection magnification $1/\beta$ and is output to reticle stage drive system 11 as a target value of the position of reticle stage RST. According to the difference between the target value of the position and an actual measurement value from reticle interferometer 116, reticle stage drive system 11 drives reticle stage RST. Incidentally, in the control system of the stages, the stages themselves do not constitute the elements of the control system and any signals do not supplied from the stages to the interferometer systems, but in FIG. 24, the configuration as shown is employed in order to make the explanation easily understandable. In FIG. 24, a section enclosed by virtual lines (two-dot chain lines), when wafer stage WT moves, positional information of wafer stage WST is measured by interferometer system 118, and at the same time, positional information of wafer stage WST is measured also by encoder system 150, and the position of wafer stage WST that is obtained based on the outputs of encoder system 150 is multiplied by $1/\beta$ and is input to the reticle stage control system as a target value. In FIG. 24, such physical phenomenon is expressed as the conversion by interferometer/encoder output converting section 121 from the output of interferometer system 118 that measures the position of wafer stage WST into the output of encoder system 150.

In the control system shown in FIG. 24, even when error occurs in servocontrol of wafer stage WST by interferometer system 118, the high precision actual measurement value from encoder system 150 is input to reticle stage drive system 11 as a position target value, and therefore, the synchronous drive control with the sufficient accuracy can be executed. Incidentally, in the second substitute method, similarly to the first substitute method, control error caused by an air fluctuation component of interferometer system 118 that occurs in a short time scale could occur.

Because servocontrol of wafer stage WST is performed using interferometer system 118 in the second substitute method described above, such a method is promising in terms of stability. On the other hand, the second substitute method is inferior to servocontrol of wafer stage WST using encoder system 150 in terms of control accuracy, but this cause no problems in particular as long as an air fluctuation component in a short time scale is not generated.

Incidentally, main controller 20 may also perform drive control of wafer stage WST in a method (which is referred to as a third substitute method for the sake of convenience) in which the first substitute method and the second substitute method described above are used in combination. In the third substitute method, the accuracy of stage control in the first substitute method is constantly secured, and therefore the positional deviation at the time of FIA measurement or the speed deviation at the time of AIS measurement can be suppressed. In addition, since the correction process of control error by the second substituted method is also added, the control error at the time of FIA and AIS measurements can also be effectively reduced.

Incidentally, in the description so far, in order to simplify the explanation, main controller 20 is to perform control of each constituent of the exposure apparatus including control of the stages using interferometer system 118 and encoder system 150, the linkage of the heads of encoder system 150, and the like, but the present invention is not limited thereto, and as a matter of course, at least a part of the above-described control performed by main controller 20 can be shared and performed by a plurality of controllers. For example, a stage controller which performs the control of the stages, the linkage of the encoder system, and the like can be arranged to operate under control of main controller 20. Further, the control which main controller 20 performs does not necessarily have to be realized by hardware, and the control may also be realized software-wise according to a computer program that sets each operation of main controller 20 or some controllers that share and perform the control as is previously described.

As discussed in detail above, according to exposure apparatus 100 of the embodiment, main controller 20 measures first positional information of wafer stage WST using interferometer system 118. At the same time, main controller 20 measures second positional information of wafer stage WST using encoder system 150 (encoders 70A to 70F). Further, main controller 20 averages the difference between the first positional information and the second positional information for over a predetermined measurement time to set a coordinate offset, and verifies the reliability of the output signals of encoders 70A to 70F using the coordinate offset. When normality is confirmed, servocontrol of drive of wafer stage WST is performed referring to the sum of the first positional information and the coordinate offset. With the servocontrol by a hybrid method using interferometer system 118 and encoder system 150 (encoders 70A to 70F) in combination, drive control of wafer stage WST having both the stability of interferometers and the preciseness of encoders can be performed.

Further, according to exposure apparatus 100 of the embodiment, main controller 20 drives wafer stage WST based on the measurement result of interferometer system 118 whose measurement is superior in long-term stability to encoder system 150, and performs a predetermined calibration process for improving the control accuracy of wafer stage WST, for example, the above-described (a) process at the time of static alignment measurement (FIA measurement) and (b) process at the time of scanning alignment measurement (AIS measurement), and the like, using the measurement result of encoder system 150 which can perform higher-precision measurement compared with interferometer system 118. Accordingly, alignment accuracy can be improved, which allows the overlay accuracy on exposure to be improved.

Therefore, in exposure apparatus 100 of the embodiment, patterns can be formed on wafer W held on wafer stage WST with high precision for over a long period of time.

Furthermore, according to exposure apparatus 100 of the embodiment, in the case of employing the control method of (c) described earlier, main controller 20 can transfer a pattern of reticle R in each shot area on wafer W with high accuracy in scanning exposure, even when error occurs in servocontrol of wafer stage WST. Moreover, in the embodiment, since exposure with high resolution can be realized by liquid immersion exposure, it is possible to transfer fine patterns on wafer W with high accuracy also in this regard.

Incidentally, in the embodiment above, the case has been described where the movable body drive method and the movable body drive system related to the present invention are used in drive of wafer stage WST except for the case of the above (c), but the present invention is not limited thereto, and the movable body drive method and the movable body drive system related to the present invention may also be used in drive of another movable body, for example, reticle stage RST and/or a measurement stage, in addition to or instead of wafer stage WST. In particular, in the case of using the movable body drive method and the movable body drive system related to the present invention in drive of reticle stage RST in addition to wafer stage WST, patterns of reticle R can be transferred onto wafer W with high accuracy.

Incidentally, the configuration of each measurement device such as the encoder system described in the embodiment above is merely an example, and the present invention is not limited thereto as a matter of course. For example, in the embodiment above, the case has been exemplified where the encoder system is employed that has a configuration in which the grating sections (Y scales, X scales) are arranged on the wafer table (wafer stage), and the X heads and the Y heads are placed outside of the wafer stage so as to face the grating sections, but the present invention is not limited thereto, and as is disclosed in, for example, U.S. Patent Application Publication No. 2006/0227309 and the like, an encoder system having a configuration in which encoder heads are arranged on the wafer stage and the grating sections (e.g. two-dimensional gratings or one-dimensional grating sections placed two dimensionally) are placed outside of the wafer stage so as to face the encoder heads may also be employed. In this case, the Z heads are also arranged on the wafer stage and the surface of the grating section thereof may be made to be a reflection surface to which measurement beams of the Z heads are irradiated. Further, in the embodiment above, the case has been described where an optical encoder is used as the encoder, but the present invention is not limited thereto, and a magnetic encoder may also be used.

Further, in the embodiment above, while the lower surface of nozzle unit 32 and the lower end surface of the tip optical element of projection optical system PL are to be substantially flush, but the present invention is not limited thereto, and for example, the lower surface of nozzle unit 32 can be placed nearer to the image plane of projection optical system PL (i.e. to the wafer) than the outgoing surface of the tip optical element. That is, the configuration of local liquid immersion device 8 is not limited to the configuration described above, and the configurations can be used, which are described in, for example, European Patent Application Publication No. 1 420 298, the pamphlet of International Publication No. 2004/055803, the pamphlet of International Publication No. 2004/057590, the pamphlet of International Publication No. 2005/029559 (the corresponding U.S. Patent Application Publication No. 2006/0231206), the pamphlet of International Publication No. 2004/086468 (the corresponding U.S. Patent Application Publication No. 2005/0280791), U.S. Pat. No. 6,952,253, and the like. Further, as is disclosed in, for example, the pamphlet of International Publication No. 2004/019128 (the corresponding U.S. Patent Application Publication No. 2005/0248856), the optical path on the object plane side of the tip optical element may also be filled with liquid, in addition to the optical path on the image plane side of the tip optical element. Furthermore, a thin film that is lyophilic and/or has dissolution preventing function may also be formed on the partial surface (including at least a contact surface with liquid) or the entire surface of the tip optical element. Incidentally, quartz has a high affinity for liquid, and also needs no dissolution preventing film, whereas in the case of fluorite, at least a dissolution preventing film is preferably formed.

Incidentally, in the embodiment above, pure water (water) is to be used as the liquid, however, it is a matter of course that the present invention is not limited thereto. As the liquid, liquid that is chemically stable, having high transmittance to illumination light IL and safe to use, such as a fluorine-containing inert liquid may be used. As the fluorine-containing inert liquid, for example, Fluorinert (the brand name of 3M United States) can be used. The fluorine-containing inert liquid is also excellent from the point of cooling effect. Further, as the liquid, liquid having a higher refractive index to illumination light IL than that of pure water (a refractive index is around 1.44), for example, liquid having a refractive index equal to or higher than 1.5 may be used. As this type of liquid, for example, a predetermined liquid having C—H binding or O—H binding such as isopropanol having a refractive index of about 1.50, glycerol (glycerin) having a refractive index of about 1.61, a predetermined liquid (organic solvent) such as hexane, heptane or decane, or decalin (decahydronaphthalene) having a refractive index of about 1.60, or the like can be cited. Alternatively, a liquid obtained by mixing arbitrary two or more of these liquids may be used, or a liquid obtained by adding (mixing) at least one of these liquids to (with) pure water may be used. Alternatively, as the liquid, a liquid obtained by adding (mixing) base or acid such as H+, Cs+, K+, Cl—, SO42-, or PO42- to (with) pure water may be used. Moreover, a liquid obtained by adding (mixing) particles of Al oxide or the like to (with) pure water may be used. These liquids can transmit ArF excimer laser light. Further, as the liquid, liquid, which has a small absorption coefficient of light, is less temperature-dependent, and is stable to a projection optical system (tip optical member) and/or a photosensitive agent (or a protective film (topcoat film), an antireflection film, or the like) coated on the surface of a wafer, is preferable. Further, in the case an F2 laser is used as the light source, fomblin oil may be selected. Further, as the liquid, a liquid having a higher refractive index to illumination light IL than that of pure water, for example, a refractive index of around 1.6 to 1.8 may be used. As the liquid, supercritical fluid can also be used. Further, the tip optical element of projection optical system PL may be formed by quartz (silica), or single-crystal materials of fluoride compound such as calcium fluoride (fluorite), barium fluoride, strontium fluoride, lithium fluoride, and sodium fluoride, or may be formed by materials having a higher refractive index than that of quartz or fluorite (e.g. equal to or higher than 1.6). As the materials having a refractive index equal to or higher than 1.6, for example, sapphire, germanium dioxide, or the like disclosed in the pamphlet of International Publication No. 2005/059617, or kalium chloride (having a refractive index of about 1.75) or the like disclosed in the pamphlet of International Publication No. 2005/059618 can be used.

Further, in the embodiment above, the recovered liquid may be reused, and in this case, a filter that removes impurities from the recovered liquid is preferably arranged in a liquid recovery device, a recovery pipe or the like.

Incidentally, in the embodiment above, the case has been described where the exposure apparatus is a liquid immersion type exposure apparatus, but the present invention is not limited to this, and can also be employed in a dry type exposure apparatus that performs exposure of wafer W without liquid (water).

Further, in the embodiment described above, the case has been described where the present invention is applied to a scanning exposure apparatus by a step-and-scan method or the like, but the present invention is not limited thereto, and may also be applied to a static exposure apparatus such as a stepper. Even with the stepper or the like, by measuring the position of a stage on which an object subject to exposure is mounted using encoders, occurrence of position measurement error caused by air fluctuation can substantially be nulled likewise. In this case, it becomes possible to set the position of the stage with high precision based on correction information used to correct the short-term fluctuation of the measurement values of the encoders using the measurement values of the interferometers and on the measurement values of the encoders, and as a consequence, highly accurate transfer of a reticle pattern onto the object can be performed. Further, the present invention can also be applied to a reduced projection exposure apparatus by a step-and-stitch method that synthesizes a shot area and a shot area, an exposure apparatus by a proximity method, a mirror projection aligner, or the like. Moreover, the present invention can also be applied to a multi-stage type exposure apparatus equipped with a plurality of wafer stages WST, as is disclosed in, for example, U.S. Pat. No. 6,590,634, No. 5,969,441, No. 6,208,407, and the like.

Further, the magnification of the projection optical system in the exposure apparatus of the embodiment above is not only a reduction system, but also may be either an equal magnifying system or a magnifying system, and projection optical system PL is not only a dioptric system, but also may be either a catoptric system or a catadioptric system, and in addition, the projected image may be either an inverted image or an upright image. Moreover, exposure area IA to which illumination light IL is irradiated via projection optical system PL is an on-axis area that includes optical axis AX within the field of projection optical system PL. However, for example, as is disclosed in the pamphlet of International Publication No. 2004/107011, exposure area IA may also be an off-axis area that does not include optical axis AX, similar to a so-called inline type catadioptric system, in a part of which an optical system (catoptric system or catadioptric system) that has plural reflection surfaces and forms an intermediate image at least once is arranged, and which has a single optical axis. Further, the illumination area and exposure area described earlier are to have a rectangular shape, but the shape is not limited to rectangular, and may also be circular arc, trapezoidal, parallelogram or the like.

Incidentally, a light source of the exposure apparatus in the embodiment above is not limited to the ArF excimer laser, but a pulse laser light source such as a KrF excimer laser (output wavelength; 248 nm), an F2 laser (output wavelength; 157 nm), an Ar2 laser (output wavelength: 126 nm) or a $Kr_2$ laser (output wavelength: 146 nm), or an extra-high pressure mercury lamp that generates an emission line such as a g-line (wavelength: 436 nm) or an i-line (wavelength: 365 nm) can also be used. Further, a harmonic wave generating device of a YAG laser or the like can also be used. Besides the sources above, as is disclosed in, for example, the pamphlet of International Publication No. 1999/46835 (the corresponding U.S. Pat. No. 7,023,610), a harmonic wave, which is obtained by amplifying a single-wavelength laser beam in the infrared or visible range emitted by a DFB semiconductor laser or fiber laser as vacuum ultraviolet light, with a fiber amplifier doped with, for example, erbium (or both erbium and ytterbium), and by converting the wavelength into ultraviolet light using a nonlinear optical crystal, can also be used.

Further, in the embodiment above, illumination light IL of the exposure apparatus is not limited to the light having a wavelength equal to or more than 100 nm, and it is needless to say that the light having a wavelength less than 100 nm can be used. For example, in recent years, in order to expose a pattern equal to or less than 70 nm r, an EUV exposure apparatus that makes an SOR or a plasma laser as a light source generate an EUV (Extreme Ultraviolet) light in a soft X-ray range (e.g. a wavelength range from 5 to 15 nm), and uses a total reflection reduction optical system designed under the exposure wavelength (e.g. 13.5 nm) and the reflective mask has been developed. In the EUV exposure apparatus, the arrangement in which scanning exposure is performed by synchronously scanning a mask and a wafer using a circular arc illumination can be considered, and therefore, the present invention can also be suitably applied to such an exposure apparatus. Besides such an apparatus, the present invention can also be applied to an exposure apparatus that uses charged particle beams such as an electron beam or an ion beam.

Further, in the embodiment above, a transmissive type mask (reticle), which is a transmissive substrate on which a predetermined light shielding pattern (or a phase pattern or a light attenuation pattern) is formed, is used. Instead of this reticle, however, as is disclosed in, for example, U.S. Pat. No. 6,778,257, an electron mask (which is also called a variable shaped mask, an active mask or an image generator, and includes, for example, a DMD (Digital Micromirror Device) that is a type of a non-emission type image display device (spatial light modulator) or the like) on which a light-transmitting pattern, a reflection pattern, or an emission pattern is formed according to electronic data of the pattern that is to be exposed may also be used.

Further, as is disclosed in, for example, the pamphlet of International Publication No. 2001/035168, the present invention can also be applied to an exposure apparatus (lithography system) that forms line-and-space patterns on a wafer by forming interference fringes on the wafer.

Moreover, the present invention can also be applied to an exposure apparatus that synthesizes two reticle patterns via a projection optical system and almost simultaneously performs double exposure of one shot area by one scanning exposure, as is disclosed in, for example, U.S. Pat. No. 6,611,316.

Further, an apparatus that forms a pattern on an object is not limited to the exposure apparatus (lithography system) described previously, and for example, the present invention can also be applied to an apparatus that forms a pattern on an object by an ink-jet method.

Incidentally, an object on which a pattern is to be formed (an object subject to exposure to which an energy beam is irradiated) in the embodiment above is not limited to a wafer, but may be other objects such as a glass plate, a ceramic substrate, a film member, or a mask blank.

The use of the exposure apparatus is not limited only to the exposure apparatus for manufacturing semiconductor devices, but the present invention can also be widely applied, for example, to an exposure apparatus for liquid crystal display devices that transfers a liquid crystal display device pattern onto a rectangular glass plate, and an exposure apparatus for producing organic ELs, thin-film magnetic heads, imaging devices (such as CCDs), micromachines, DNA chips, and the like. Further, the present invention can be applied not only to an exposure apparatus for producing microdevices such as semiconductor devices, but can also be applied to an exposure apparatus that transfers a circuit pattern onto a glass plate or silicon wafer to produce a reticle or a mask used in a light exposure apparatus, an EUV exposure apparatus, an X-ray exposure apparatus, an electron-beam exposure apparatus, and the like.

Incidentally, the movable body drive method and the movable body drive system of the present invention can be applied not only to the exposure apparatus, but can also be applied widely to other substrate processing apparatuses (such as a laser repair apparatus, a substrate inspection apparatus and the like), or to apparatuses equipped with a movable body such as a stage that moves within a plane such as a position setting apparatus of a sample or a wire bonding apparatus in other precision machines.

Incidentally, the above disclosures of all the publications (description), the pamphlets of the International Publications, and the U.S. patent application Publications, and the U.S. patents that are cited in the embodiment described above and related to exposure apparatuses and the like are each incorporated herein by reference.

Semiconductor devices are manufactured through the following steps: a step where the function/performance design of the wafer is performed, a step where a wafer is manufactured using silicon materials, a lithography step where the pattern formed on the reticle (mask) is transferred onto the wafer by the exposure apparatus (pattern formation apparatus) in the embodiment described earlier, a development step where the exposed wafer is developed; an etching step where an exposed member of an area other than the area where resist remains is removed by etching; a resist removing step where the resist that is no longer necessary when the etching is completed is removed; a device assembly step (including a dicing process, a bonding process, and a packaging process); an inspection step; and the like.

When the above-described device manufacturing method of the embodiment is used, the exposure apparatus (pattern formation apparatus) in the embodiment above and the exposure method (pattern formation method) thereof are used in an exposure process, and therefore exposure with high throughput can be performed while maintaining the overlay accuracy at a high level. Accordingly, the productivity of microdevices with high integration where fine patterns are formed can be improved.

While the above-described embodiment of the present invention is the presently preferred embodiment thereof, those skilled in the art of lithography systems will readily recognize that numerous additions, modifications, and substitutions may be made to the above-described embodiment without departing from the spirit and scope thereof. It is intended that all such modifications, additions, and substitutions fall within the scope of the present invention, which is best defined by the claims appended below.

What is claimed is:

1. A movable body drive method of driving a movable body along a predetermined plane, the method comprising:

a drive process in which positional information of the movable body is measured using an interferometer system and an encoder system, and the movable body is driven based on measurement information of the interferometer system and also the movable body is driven using measurement information of the encoder system so that a measurement error of the interferometer system is compensated, the encoder system having a plurality of encoders and measuring the positional information of the movable body using at least one of the encoders; and a switching process in which at least one of the encoders used in measurement of the positional information of the movable body is switched to a different one of the encoders according to a change of a position of the movable body in a plane parallel to the predetermined plane, wherein in the switching process, a measurement value of the different one of the encoders is determined so that the position of the movable body in the plane parallel to the predetermined plane is maintained before and after the switching.

2. The movable body drive method according to claim 1 wherein the compensation of the measurement error of the interferometer system includes correcting the measurement information of the interferometer system using the measurement information of the encoder system.

3. The movable body drive method according to claim 1 wherein in the drive process, the measurement error is compensated by driving the movable body based on a sum of a first position coordinate of the movable body computed from the measurement information of the interferometer system and coordinate offset information related to a difference between a second position coordinate of the movable body computed from the measurement information of the encoder system and the first position coordinate.

4. The movable body drive method according to claim 3 wherein
the coordinate offset information is a moving average of the difference regarding a predetermined measurement time.

5. The movable body drive method according to claim 3, further comprising:
a verification process in which reliability of the measurement information of the encoder system is verified using the coordinate offset information, wherein
in the drive process, in the case the measurement information of the encoder system is determined to be normal as a result of the verification, the movable body is driven based on a sum of the coordinate offset information after the verification and the first position coordinate, and in the case abnormality of the measurement information of the encoder system is detected as a result of the verification, the movable body is driven based on a sum of the coordinate offset information that has been determined to be normal in previous verification and the first position coordinate.

6. The movable body drive method according to claim 1 wherein
the movable body is driven in directions parallel to a first axis and a second axis that are orthogonal within the predetermined plane, and the encoder system measures positional information of the movable body by a head unit that has a plurality of heads whose positions are different in a direction intersecting a grating section that is arranged on the movable body and has a longitudinal direction in an arrangement direction of a diffraction grating.

7. A pattern formation method of forming a pattern on an object, the method comprising:
driving at least one movable body of a plurality of movable bodies that include a movable body on which the object is mounted, using the movable body drive method according to claim 1, for pattern formation to the object.

8. The pattern formation method according to claim 7 wherein
the at least one movable body that is driven includes at least one of the movable body on which the object is mounted and a movable body on which at least a part of a patterning device that generates a pattern on the object is mounted.

9. The pattern formation method according to claim 7 wherein
the object has a sensitive layer and a pattern is formed on the object by exposure of the sensitive layer by irradiation of an energy beam.

10. A device manufacturing method including a pattern formation process wherein
in the pattern formation process, a pattern is formed on a substrate using the pattern formation method according to claim 7.

11. A pattern formation method of forming a predetermined pattern on an object held by a movable body, the method comprising:
a drive process in which when the movable body is driven along a predetermined plane while measuring positional information of the movable body using an interferometer system and an encoder system, measurement information of the interferometer system is used as the positional information of the movable body; and
a calibration process in which predetermined calibration processing to improve alignment accuracy of the pattern and the object is performed using measurement information of the encoder system, wherein
the calibration processing includes obtaining and correcting a speed deviation of the movable body, using positional information of the movable body obtained from the measurement information of the encoder system, the speed deviation occurring when performing scanning alignment measurement in which an aerial image of a predetermined mark is measured during constant speed scan of the movable body.

12. The pattern formation method according to claim 11 wherein
the object has a sensitive layer, and a pattern is formed on the object by exposure of the sensitive layer by irradiation of an energy beam.

13. A device manufacturing method including a pattern formation process wherein
in the pattern formation process, a pattern is formed on a substrate using the pattern formation method according to claim 11.

14. A movable body drive system that drives a movable body along a predetermined plane, the system comprising:
an interferometer system that measures positional information of the movable body;
an encoder system that has a plurality of encoders and measures positional information of the movable body using at least one of the encoders;
a drive device that drives the movable body based on measurement information of the interferometer system, and also drives the movable body using measurement information of the encoder system so as to compensate a measurement error of the interferometer system; and
a switching device that switches at least one of the encoders used in measurement of the positional information of the movable body to a different one of the encoders according to a change of a position of the movable body in a plane parallel to the predetermined plane, wherein
the switching device determines a measurement value of the different one of the encoders so that the position of the movable body in the plane parallel to the predetermined plane is maintained before and after the switching.

15. The movable body drive system according to claim 14 wherein
the compensation of the measurement error of the interferometer system includes correcting the measurement information of the interferometer system using the measurement information of the encoder system.

16. The movable body drive system according to claim 14 wherein
the drive device drives the movable body based on a sum of a first position coordinate of the movable body computed from the measurement information of the interferometer system and coordinate offset information related to a difference between a second position coordinate of the movable body computed from the measurement information of the encoder system and the first position coordinate.

17. The movable body drive system according to claim 16 wherein
the coordinate offset information is a moving average of the difference regarding a predetermined measurement time.

18. The movable body drive system according to claim 16 wherein
the drive device verifies reliability of the measurement information of the encoder system using the coordinate offset information, and in the case the measurement information of the encoder system is determined to be normal as a result of the verification, drives the movable body based on a sum of the coordinate offset information after the verification and the first position coordinate, and in the case abnormality of the measurement information of the encoder system is detected as a result of the verification, drives the movable body based on a sum of the coordinate offset information that has been determined to be normal in previous verification and the first position coordinate.

19. The movable body drive system according to claim 14 wherein
the movable body is driven in directions parallel to a first axis and a second axis that are orthogonal within the predetermined plane, and a grating section having a longitudinal direction in an arrangement direction of a diffraction grating is arranged on the movable body, and
the encoder system measures positional information of the movable body by a head unit that has a plurality of heads whose positions are different in a direction intersecting the grating section.

20. A pattern formation apparatus that forms a pattern on an object wherein
for pattern formation to the object, at least one movable body of a plurality of movable bodies that include a movable body on which the object is mounted is driven, using the movable body drive system according to claim 14.

21. The pattern formation apparatus according to claim 20 wherein
the at least one movable body that is driven includes at least one of the movable body on which the object is mounted and a movable body on which at least a part of a patterning device that generates a pattern on the object is mounted.

22. The pattern formation apparatus according to claim 20 wherein
the object has a sensitive layer and a pattern is formed on the object by exposure of the sensitive layer by irradiation of an energy beam.

23. A pattern formation apparatus that forms a predetermined pattern on an object held by a movable body, the apparatus comprising:
an interferometer system that measures positional information of the movable body;
an encoder system that measures positional information of the movable body; and
a processing device that, when the movable body is driven along a predetermined plane while measuring positional information of the movable body using the interferometer system and the encoder system, uses measurement information of the interferometer system as the positional information of the movable body, and also performs predetermined calibration processing to improve alignment accuracy of the pattern and the object using measurement information of the encoder system,
wherein at least a part of an aerial image measuring device including a pattern plate is arranged on the movable body, the aerial image measuring device being used to measure an aerial image of a predetermined mark during constant speed scan of the movable body, and
wherein as the calibration processing, the processing device obtains and corrects a speed deviation of the movable body using positional information of the movable body obtained from the measurement information of the encoder system, when performing scanning alignment measurement in which an aerial image of a predetermined mark is measured during constant speed scan of the movable body using the aerial image measuring device.

24. The pattern formation apparatus according to claim 23 wherein
the object has a sensitive layer, and a pattern is formed on the object by exposure of the sensitive layer by irradiation of an energy beam.

* * * * *

UNITED STATES PATENT AND TRADEMARK OFFICE
CERTIFICATE OF CORRECTION

PATENT NO. : 8,547,527 B2  
APPLICATION NO. : 12/175783  
DATED : October 1, 2013  
INVENTOR(S) : Yuho Kanaya et al.

Page 1 of 1

It is certified that error appears in the above-identified patent and that said Letters Patent is hereby corrected as shown below:

Title Page, col. 2, it is requested that the cited references be added as follows:

(56) References cited
US 2002/0171833 A1   11/21/2002   NISHI, Kenji
US 2007/0146722 A1   06/28/2007   TRUTNA, JR. et al.

Signed and Sealed this
Fourth Day of March, 2014

Michelle K. Lee
*Deputy Director of the United States Patent and Trademark Office*